US012520539B2

(12) United States Patent
Kim et al.

(10) Patent No.: US 12,520,539 B2
(45) Date of Patent: Jan. 6, 2026

(54) TRANSISTOR, METHOD FOR MANUFACTURING SAME, AND TERNARY INVERTER COMPRISING SAME

(71) Applicant: UNIST(ULSAN NATIONAL INSTITUTE OF SCIENCE AND TECHNOLOGY), Ulsan (KR)

(72) Inventors: Kyung Rok Kim, Ulsan (KR); Ji Won Chang, Ulsan (KR); Jae Won Jeong, Ulsan (KR); Youngeun Choi, Ulsan (KR); Wooseok Kim, Ulsan (KR)

(73) Assignee: UNIST(ULSAN NATIONAL INSTITUTE OF SCIENCE AND TECHNOLOGY) (KR)

( * ) Notice: Subject to any disclaimer, the term of this patent is extended or adjusted under 35 U.S.C. 154(b) by 616 days.

(21) Appl. No.: 17/636,328

(22) PCT Filed: Nov. 19, 2020

(86) PCT No.: PCT/KR2020/016414
§ 371 (c)(1),
(2) Date: Feb. 17, 2022

(87) PCT Pub. No.: WO2021/101288
PCT Pub. Date: May 27, 2021

(65) Prior Publication Data
US 2022/0285484 A1 Sep. 8, 2022

(30) Foreign Application Priority Data

Nov. 19, 2019 (KR) .................. 10-2019-0149122
May 12, 2020 (KR) .................. 10-2020-0056670
Jul. 14, 2020 (KR) .................. 10-2020-0087155

(51) Int. Cl.
*H10D 62/10* (2025.01)
*H01L 21/265* (2006.01)
(Continued)

(52) U.S. Cl.
CPC ....... *H10D 62/102* (2025.01); *H01L 21/2652* (2013.01); *H10D 30/6735* (2025.01);
(Continued)

(58) Field of Classification Search
CPC ........... H01L 29/0607; H01L 29/42392; H01L 29/66545; H01L 29/78696
(Continued)

(56) References Cited

U.S. PATENT DOCUMENTS 7,202,131 B2    4/2007  Bang
9,660,028 B1*   5/2017  Cheng ................. H01L 27/0886
(Continued)

FOREIGN PATENT DOCUMENTS

KR    20050070932 A    7/2005
KR    20060110702 A    10/2006
(Continued)

OTHER PUBLICATIONS

Ernst, T. et al., "Novel 3D integration process for highly scalable Nano-Beam stacked-channels GAA (NBG) FinFETs with HfO₂/TiN gate stack," *2006 International Electron Devices Meeting*, 2006, pp. 1-4 (Dec. 2006).
(Continued)

*Primary Examiner* — Dzung Tran
(74) *Attorney, Agent, or Firm* — Klarquist Sparkman, LLP

(57) ABSTRACT

A transistor includes: a substrate; a constant current formation layer provided on the substrate; a pair of source/drain patterns provided on the constant current formation layer; a gate electrode provided between the pair of source/drain patterns; a channel pattern extending in a direction between the pair of source/drain patterns; and a gate insulating layer surrounding the channel pattern, wherein the channel pattern penetrates the gate insulating layer and the gate electrode
(Continued)

and is electrically connected to the source pattern and the drain pattern, the gate insulating layer separates the channel pattern and the gate electrode from each other, the constant current formation layer generates a constant current between the drain pattern and the substrate, and the constant current is independent from a gate voltage applied to the gate electrode.

7 Claims, 54 Drawing Sheets

(51) Int. Cl.
 *H10D 30/67* (2025.01)
 *H10D 64/01* (2025.01)
 *H10D 84/85* (2025.01)
(52) U.S. Cl.
 CPC ....... *H10D 30/6757* (2025.01); *H10D 64/017* (2025.01); *H10D 84/85* (2025.01)
(58) Field of Classification Search
 USPC ......................................................... 257/369
 See application file for complete search history.

(56) References Cited

U.S. PATENT DOCUMENTS

| | | | |
|---|---|---|---|
| 10,008,583 B1* | 6/2018 | Rodder | H01L 29/41733 |
| 10,133,550 B2 | 11/2018 | Kim et al. | |
| 10,243,040 B1 | 3/2019 | Park et al. | |
| 2006/0240622 A1 | 10/2006 | Lee et al. | |
| 2010/0295022 A1* | 11/2010 | Chang | H01L 29/0665 |
| | | | 257/E21.294 |
| 2014/0198551 A1* | 7/2014 | Louie | G11C 15/046 |
| | | | 365/49.1 |
| 2015/0295084 A1* | 10/2015 | Obradovic | H01L 29/775 |
| | | | 257/347 |
| 2018/0074788 A1 | 3/2018 | Kim et al. | |
| 2019/0115424 A1* | 4/2019 | Park | H01L 29/66545 |
| 2019/0122937 A1* | 4/2019 | Cheng | H01L 29/4908 |

FOREIGN PATENT DOCUMENTS

| | | |
|---|---|---|
| KR | 101689159 B1 | 12/2016 |
| KR | 20190043359 A | 4/2019 |

OTHER PUBLICATIONS

International Search Report and Written Opinion for PCT/KR2020/016414, mailed Feb. 24, 2021.
Jeong, J. et al., "Tunnelling-based ternary metal-oxide-semiconductor technology," *Natural Electronics*, 2:307-312 (Jul. 2019).
Kim, K. et al., "Multi-Valued Logic Device Technology; Overview, Status, and Its Future for Peta-Scale Information Density," *Journal of Semiconductor Engineering*, 1(1):57-63 (Jun. 2020).
Notice of Allowance for Korean Patent Application No. 10-2020-0056670, mailed Sep. 17, 2021 (w/English translation).
Notice of Allowance for Korean Patent Application No. 10-2020-0087155, mailed Nov. 23, 2021 (w/English translation).
Office Action for Korean Patent Application No. 10-2020-0056670, mailed Apr. 25, 2021 (w/English translation).
Office Action for Korean Patent Application No. 10-2020-0087155, mailed Aug. 3, 2021 (w/English translation).

* cited by examiner

TRANSISTOR, METHOD FOR MANUFACTURING SAME, AND TERNARY INVERTER COMPRISING SAME

CROSS REFERENCE TO RELATED APPLICATIONS

This is the U.S. National Stage of International Application No. PCT/KR2020/016414, filed Nov. 19, 2020, which in turn claims priority to Korean Patent Application No. 10-2019-0149122, filed Nov. 19, 2019, Korean Patent Application No. 10-2020-0056670, filed May 12, 2020, and Korean Patent Application No. 10-2020-0087155, filed Jul. 14, 2020, which applications are incorporated herein in their entireties.

TECHNICAL FIELD

The disclosure is supported by the fund of the ministry of science and ICT for a task number of 1711070269 of the task title "research into a graphene barristor-based ternary logic architecture" and the fund of the ministry of science and ICT for a task number of 1711092396 of the task title "multi-level material designing and application research."

The disclosure is supported by the fund of the ministry of science and ICT for a task number of 1711103840 of the task title "research into a graphene barristor-based ternary logic architecture" and the fund of the ministry of science and ICT for a task number of 1711104361 of the task title "multi-level material designing and application research."

The disclosure relates to a transistor, a method of manufacturing the transistor, and a ternary inverter including the transistor.

BACKGROUND ART

A binary logic-based digital system according to the related art has focused on increasing a bit density of information through miniaturization of a complementary metal-oxide semiconductor (CMOS) device in order to quickly process a large amount of data. However, recently, with the CMOS device integrated to a size that is less than or equal to about 30 nm, there has been a limit in increasing the bit density, due to an increase of leakage currents and power consumption based on quantum tunneling effects. To overcome this limit with respect to the bit density, interest in a ternary logic device and circuit, as one of multi-valued logics, has been significantly increased, and in particular, development of a standard ternary inverter (STI), which is a basic unit for realizing the ternary logic, has been actively made. However, unlike a previous binary inverter using two CMOS devices for one voltage source, the related art technology with respect to the STI requires relatively more voltage sources or more complex circuit structures.

DESCRIPTION OF EMBODIMENTS

Technical Problem

An objective of the disclosure is to provide a transistor having a constant current that is independent from a gate voltage.

An objective of the disclosure is to provide a ternary inverter having a constant current that is independent from an input voltage.

An objective of the disclosure is to provide a method of manufacturing a transistor having a constant current that is independent from a gate voltage.

An objective of the disclosure is to provide a transistor having a constant current.

An objective of the disclosure is to provide a method of manufacturing a transistor having a constant current.

An objective of the disclosure is to provide a ternary inverter having a constant current.

However, objectives of the disclosure are not limited thereto.

Solution to Problem

According to an aspect, there is provided a transistor including: a substrate; a constant current formation layer provided on the substrate; a pair of source/drain patterns provided on the constant current formation layer; a gate electrode provided between the pair of source/drain patterns; a channel pattern extending in a direction between the pair of source/drain patterns; and a gate insulating layer surrounding the channel pattern, wherein the channel pattern penetrates the gate insulating layer and the gate electrode and is electrically connected to the source pattern and the drain pattern, the gate insulating layer separates the channel pattern and the gate electrode from each other, the constant current formation layer generates a constant current between the drain pattern and the substrate, and the constant current is independent from a gate voltage applied to the gate electrode.

The constant current formation layer may have a first conductive type, the pair of source/drain patterns may have a second conductive type that is different from the first conductive type, and a doping concentration of the constant current formation layer may be greater than or equal to about $3 \times 10^{18}$ cm$^{-3}$.

The constant current formation layer may directly contact the pair of source/drain patterns.

An electric field may be formed between the constant current formation layer and the pair of source/drain patterns, and an intensity of the electric field may be greater than or equal to about $10^6$ V/cm.

The gate insulating layer may extend between the gate electrode and the pair of source/drain patterns and separate the gate electrode from the pair of source/drain patterns.

The transistor may further include a pair of gate spacers provided on both side surfaces of the gate electrode. The pair of gate spacers may be provided between the pair of source/drain patterns and the gate electrode and may electrically disconnect the pair of source/drain patterns from the gate electrode.

May extend between the gate electrode and the pair of gate spacers and separating the gate electrode from the pair of gate spacers.

The channel pattern may be provided in a multiple number, and the plurality of channel patterns may be apart from each other in a direction perpendicular to an upper surface of the constant current formation layer.

The gate insulating layer may be provided between the plurality of channel patterns and the gate electrode and may separate the plurality of channel patterns from the gate electrode.

According to an aspect, there is provided a method of manufacturing a transistor, the method including: forming a constant current formation layer on a substrate; forming a gate structure on the constant current formation layer; and forming a pair of source/drain patterns on both side surfaces of the gate structure, respectively, wherein the gate structure includes a gate electrode, a pair of gate spacers provided on both side surfaces of the gate electrode, channel patterns penetrating the gate electrode and the pair of gate spacers, and a gate insulating layer formed between the channel patterns and the gate electrode, the channel patterns are electrically connected to the pair of source/drain patterns, the constant current formation layer generates a constant current between the drain pattern and the substrate, and the constant current is independent from a gate voltage applied to the gate electrode.

The forming of the gate structure may include: forming a stack pattern including sacrificial patterns and the channel patterns alternately stacked on the constant current formation layer; forming a dummy gate pattern on the stack pattern to intersect with the stack pattern; forming a pair of gate spacers on both side surfaces of the dummy gate pattern, respectively; removing the dummy gate pattern; removing the sacrificial patterns; forming a gate insulating layer on surfaces of the channel patterns; and forming a gate electrode between the pair of source/drain areas and the pair of gate spacers.

The method may further include forming the gate insulating layer on surfaces of the pair of source/drain patterns, the surfaces being exposed by the removing of the sacrificial patterns.

The method may further include forming the gate insulating layer on an upper surface of the constant current formation layer, the upper surface being exposed by the removing of the dummy gate pattern.

The constant current formation layer may be formed by an epitaxial growth process.

The pair of source/drain patterns may be formed by an epitaxial growth process.

According to an aspect, there is provided a ternary inverter including: an NMOS transistor; and a PMOS transistor, wherein each of the NMOS transistor and the PMOS transistor includes a substrate, a constant current formation layer provided on the substrate, a pair of source/drain patterns provided on the constant current formation layer, a gate electrode provided between the pair of source/drain patterns, a channel pattern extending in a direction between the pair of source/drain patterns, and a gate insulating layer surrounding the channel pattern, the channel pattern penetrates the gate insulating layer and the gate electrode and is electrically connected to the source pattern and the drain pattern, the gate insulating layer separates the channel pattern from the gate electrode, the constant current formation layer generates a constant current between the drain pattern and the substrate, the constant current is independent from a gate voltage applied to the gate electrode, and one of the pair of source/drain patterns, which is a drain of the NMOS transistor, is electrically connected to one of the pair of source/drain patterns, which is a drain of the PMOS transistor.

The drain pattern of the NMOS transistor and the drains of the PMOS transistor may have: a first voltage, when the NMOS transistor has a channel current superior to the constant current, and the PMOS transistor has the constant current superior to the channel current; a second voltage, when the NMOS transistor has the constant current superior to the channel current, and the PMOS transistor has the channel current superior to the constant current; and a third voltage, when each of the NMOS transistor and the PMOS transistor has the constant current superior to the channel current, wherein the second voltage is greater than the first voltage, and the third voltage has a value between the first voltage and the second voltage.

In each of the NMOS transistor and the PMOS transistor, the substrate and the constant current formation layer may have same conductive types, and a doping concentration of the constant current formation layer may be greater than a doping concentration of the substrate.

In each of the NMOS transistor and the PMOS transistor, the doping concentration of the constant current formation layer may be greater than or equal to about $3 \times 10^{18}$ cm$^{-3}$.

In each of the NMOS transistor and the PMOS transistor, an electric field may be formed between the constant current formation layer and the pair of source/drain patterns, and an intensity of the electric field may be greater than or equal to about $10^6$ V/cm.

According to an aspect, there is provided a transistor including: a gate electrode extending in a first direction; a channel pattern penetrating the gate electrode in a second direction intersecting with the first direction; a gate insulating layer provided between the channel pattern and the gate electrode; a pair of source/drain patterns provided on both side surfaces of the gate electrode; and a constant current formation pattern overlapping, between the pair of source/drain patterns, the channel pattern in a third direction intersecting with the first direction and the second direction, wherein the channel pattern and the constant current formation pattern are electrically connected to the pair of source/drain patterns.

The constant current formation pattern may generate a constant current between a drain of the pair of source/drain patterns and the constant current formation pattern, and the constant current may be independent from a gate voltage applied to the gate electrode.

The constant current formation pattern may have a first conductive type, the pair of source/drain patterns may have a second conductive type that is different from the first conductive type, and a doping concentration of the constant current formation pattern may be greater than or equal to about $3 \times 10^{18}$ cm$^{-3}$.

The constant current formation pattern may directly contact the pair of source/drain patterns.

An electric field may be formed between the constant current formation pattern and the pair of source/drain patterns, and an intensity of the electric field may be greater than or equal to about $10^6$ V/cm.

The gate insulating layer may extend between the gate electrode and the pair of source/drain patterns.

The transistor may further include a device isolation pattern provided on a side surface of the constant current formation pattern, wherein the constant current formation pattern and the device isolation pattern are arranged in the first direction.

The constant current formation pattern may protrude from an upper surface of the device isolation pattern.

The transistor may further include a pair of gate spacers provided on both side surfaces of the gate electrode, wherein the pair of gate spacers are provided between the pair of source/drain patterns and the gate electrode.

The constant current formation pattern may extend in the second direction and may be provided on bottom surfaces of the pair of source/drain patterns.

The channel pattern may be provided in a multiple number, and the plurality of channel patterns may be apart from each other in the third direction intersecting with the first direction and the second direction.

According to an aspect, there is provided a method of manufacturing a transistor, the method including: forming a constant current formation pattern and a pair of device isolation patterns on a substrate; forming a gate structure on the constant current formation pattern and the pair of device isolation patterns; and forming a pair of source/drain patterns on both side surfaces of the gate structure, respectively, wherein the gate structure includes a gate electrode, a pair of gate spacers provided on both side surfaces of the gate electrode, channel patterns penetrating the gate electrode and the pair of gate spacers, and a gate insulating layer formed between the channel patterns and the gate electrode, the constant current formation pattern is formed between the pair of device isolation patterns, and the channel patterns are electrically connected to the pair of source/drain patterns.

The forming of the gate structure may include: forming a stack pattern including sacrificial patterns and the channel patterns alternately stacked on the constant current formation pattern; forming a dummy gate pattern on the stack pattern to intersect with the stack pattern; forming the pair of gate spacers on both side surfaces of the dummy gate pattern, respectively; removing the dummy gate pattern; removing the sacrificial patterns; forming the gate insulating layer on surfaces of the channel patterns; and forming the gate electrode between the pair of gate spacers.

The gate insulating layer may cover surfaces of the constant current formation pattern, the pair of source/drain patterns, the pair of gate spacers, and the pair of source/drain patterns, the surfaces being exposed by the removing of the dummy gate pattern and the removing of the sacrificial patterns.

The constant current formation pattern may be formed by an epitaxial growth process.

According to an aspect, there is provided a ternary inverter including: an NMOS transistor; and a PMOS transistor, wherein each of the NMOS transistor and the PMOS transistor includes a gate electrode extending in a first direction, a channel pattern penetrating the gate electrode in a second direction intersecting with the first direction, a gate insulating layer provided between the channel pattern and the gate electrode, a pair of source/drain patterns provided on both side surfaces of the gate electrode, and a constant current formation pattern overlapping, between the pair of source/drain patterns, the channel pattern in a third direction intersecting with the first direction and the second direction, the channel pattern and the constant current formation pattern are electrically connected to the pair of source/drain patterns, and one of the pair of source/drain patterns, which is a drain of the NMOS transistor, is electrically connected to one of the pair of source/drain patterns, which is a drain of the PMOS transistor.

The constant current formation pattern of the NMOS transistor may generate a constant current between the one of the pair of source/drain patterns, which is the drain of the NMOS transistor, and the constant current formation pattern of the NMOS transistor. The constant current formation pattern of the PMOS transistor may generate a constant current between the one of the pair of source/drain patterns, which is the drain of the PMOS transistor, and the constant current formation pattern of the PMOS transistor. Also, the constant current may be independent from a gate voltage applied to the gate electrodes of the NMOS transistor and the PMOS transistor.

In each of the NMOS transistor and the PMOS transistor, a doping concentration of the constant current formation pattern may be higher than a doping concentration of the channel pattern, and the doping concentration of the constant current formation pattern may be greater than or equal to about $3\times10^{18}$ cm$^{-3}$.

In each of the NMOS transistor and the PMOS transistor, an electric field having an intensity that is greater than or equal to about $10^6$ V/cm may be formed between the constant current formation layer and the pair of source/drain patterns.

Each of the NMOS transistor and the PMOS transistor may further include a pair of device isolation patterns provided on a side surface of the constant current formation pattern, and the constant current formation pattern may protrude from upper surfaces of the pair of device isolation patterns.

Advantageous Effects of Disclosure

The disclosure provides a transistor having a constant current that is independent from a gate voltage.

The disclosure provides a ternary inverter having a constant current that is independent from an input voltage.

The disclosure provides a method of manufacturing a transistor having a constant current that is independent from a gate voltage.

The disclosure provides a transistor having a constant current.

The disclosure provides a method of manufacturing a transistor having a constant current.

The disclosure provides a ternary inverter having a constant current.

However, effects of the disclosure are not limited thereto.

BEST MODE

Figure 1:
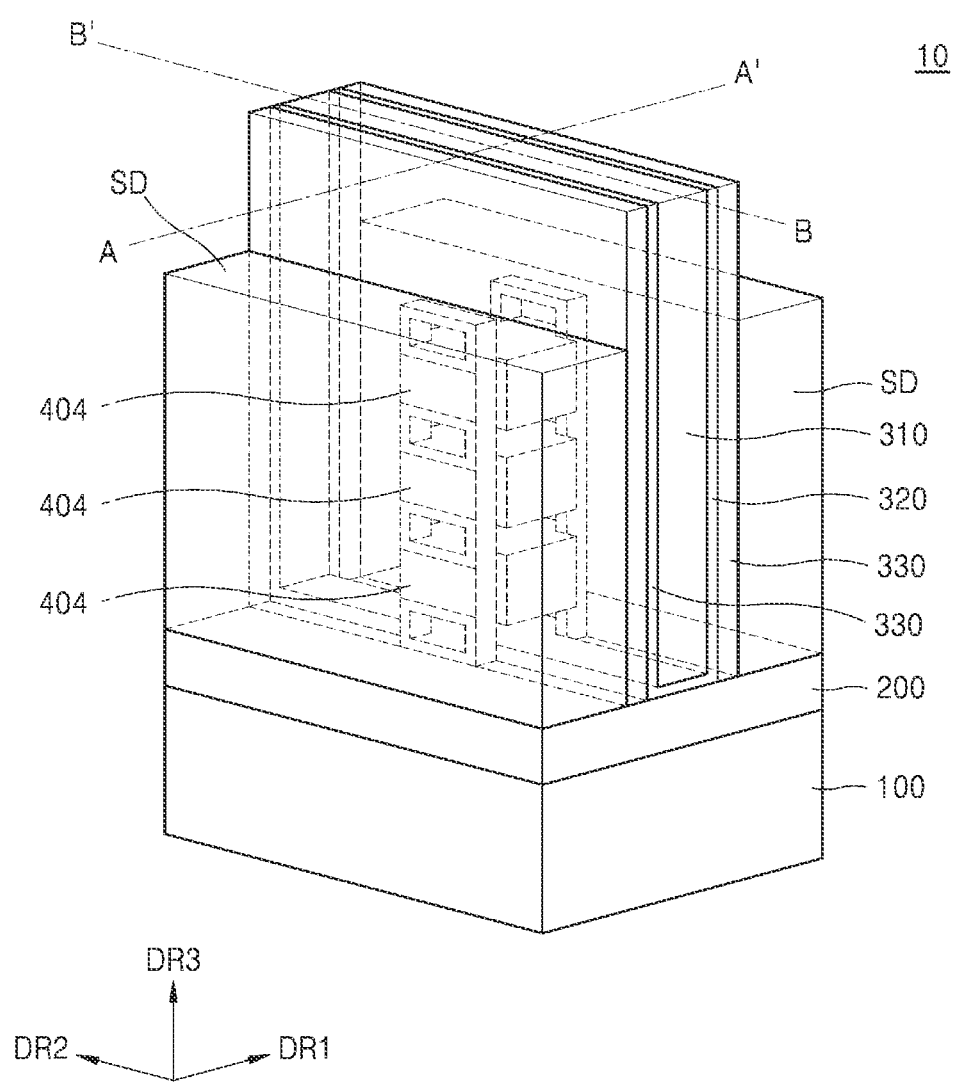
FIG. 1 is a perspective view of a transistor according to example embodiments.

According to an aspect, there is provided a transistor including: a substrate; a constant current formation layer provided on the substrate; a pair of source/drain patterns provided on the constant current formation layer; a gate electrode provided between the pair of source/drain patterns; a channel pattern extending in a direction between the pair of source/drain patterns; and a gate insulating layer surrounding the channel pattern, wherein the channel pattern penetrates the gate insulating layer and the gate electrode and is electrically connected to the source pattern and the drain pattern, the gate insulating layer separates the channel pattern and the gate electrode from each other, the constant current formation layer generates a constant current between the drain pattern and the substrate, and the constant current is independent from a gate voltage applied to the gate electrode.

According to an aspect, there is provided a method of manufacturing a transistor, the method including: forming a constant current formation layer on a substrate; forming a gate structure on the constant current formation layer; and forming a pair of source/drain patterns on both side surfaces of the gate structure, respectively, wherein the gate structure includes a gate electrode, a pair of gate spacers provided on both side surfaces of the gate electrode, channel patterns penetrating the gate electrode and the pair of gate spacers, and a gate insulating layer formed between the channel patterns and the gate electrode, the channel patterns are electrically connected to the pair of source/drain patterns, the constant current formation layer generates a constant current between the drain pattern and the substrate, and the constant current is independent from a gate voltage applied to the gate electrode.

According to an aspect, there is provided a ternary inverter including: an NMOS transistor; and a PMOS transistor, wherein each of the NMOS transistor and the PMOS transistor includes a substrate, a constant current formation layer provided on the substrate, a pair of source/drain patterns provided on the constant current formation layer, a gate electrode provided between the pair of source/drain patterns, a channel pattern extending in a direction between the pair of source/drain patterns, and a gate insulating layer surrounding the channel pattern, the channel pattern penetrates the gate insulating layer and the gate electrode and is electrically connected to the source pattern and the drain pattern, the gate insulating layer separates the channel pattern from the gate electrode, the constant current formation layer generates a constant current between the drain pattern and the substrate, the constant current is independent from a gate voltage applied to the gate electrode, and one of the pair of source/drain patterns, which is a drain of the NMOS transistor, is electrically connected to one of the pair of source/drain patterns, which is a drain of the PMOS transistor.

According to an aspect, there is provided a transistor including: a gate electrode extending in a first direction; a channel pattern penetrating the gate electrode in a second direction intersecting with the first direction; a gate insulating layer provided between the channel pattern and the gate electrode; a pair of source/drain patterns provided on both side surfaces of the gate electrode; and a constant current formation pattern overlapping, between the pair of source/drain patterns, the channel pattern in a third direction intersecting with the first direction and the second direction, wherein the channel pattern and the constant current formation pattern are electrically connected to the pair of source/drain patterns.

According to an aspect, there is provided a method of manufacturing a transistor, the method including: forming a constant current formation pattern and a pair of device isolation patterns on a substrate; forming a gate structure on the constant current formation pattern and the pair of device isolation patterns; and forming a pair of source/drain patterns on both side surfaces of the gate structure, respectively, wherein the gate structure includes a gate electrode, a pair of gate spacers provided on both side surfaces of the gate electrode, channel patterns penetrating the gate electrode and the pair of gate spacers, and a gate insulating layer formed between the channel patterns and the gate electrode, the constant current formation pattern is formed between the pair of device isolation patterns, and the channel patterns are electrically connected to the pair of source/drain patterns.

According to an aspect, there is provided a ternary inverter including: an NMOS transistor, and a PMOS transistor, wherein each of the NMOS transistor and the PMOS transistor includes a gate electrode extending in a first direction, a channel pattern penetrating the gate electrode in a second direction intersecting with the first direction, a gate insulating layer provided between the channel pattern and the gate electrode, a pair of source/drain patterns provided on both side surfaces of the gate electrode, and a constant current formation pattern overlapping, between the pair of source/drain patterns, the channel pattern in a third direction intersecting with the first direction and the second direction, the channel pattern and the constant current formation pattern are electrically connected to the pair of source/drain patterns, and one of the pair of source/drain patterns, which is a drain of the NMOS transistor, is electrically connected to one of the pair of source/drain patterns, which is a drain of the PMOS transistor.

MODE OF DISCLOSURE

Hereinafter, embodiments will be described in detail by referring to the accompanying drawings. Hereinafter, a vertical nonvolatile memory device including a memory cell string will be described in detail with reference to the accompanying drawings. Also, the embodiments described hereinafter are only examples, and various modifications may be made based on the embodiments.

Hereinafter, it will be understood that when an element is referred to as being "on" or "above" another element, the element can be directly over or under the other element and directly on the left or on the right of the other element, or intervening elements may also be present therebetween. As used herein, the singular terms "a" and "an" are intended to include the plural forms as well, unless the context clearly indicates otherwise.

Also, the terms such as " . . . unit" or the like used in the specification indicate a unit, which processes at least one function or motion, and the unit may be implemented by hardware or software, or by a combination of hardware and software.

Figure 2:
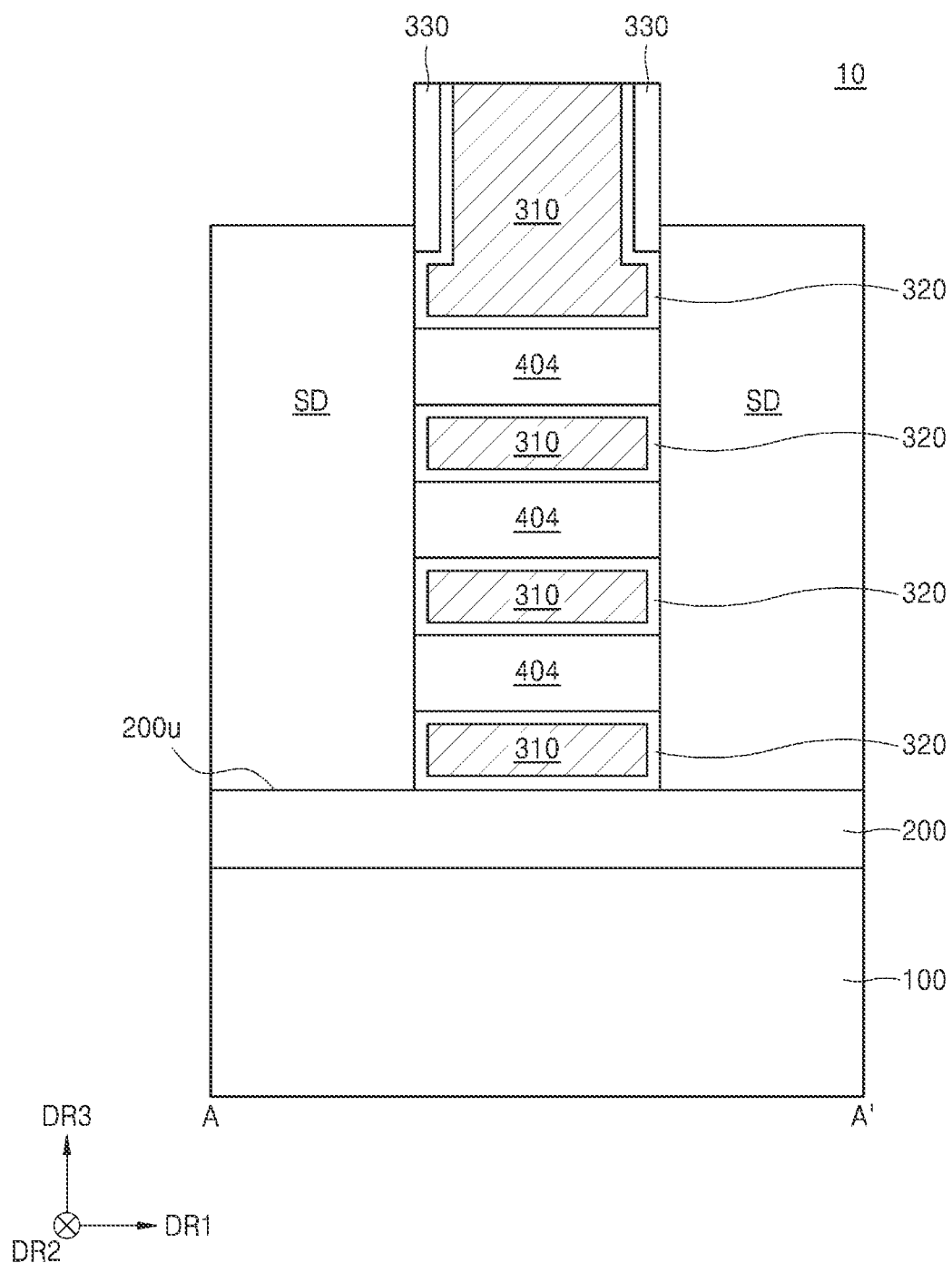
FIG. 2 is a cross-sectional view of the transistor of FIG. 1, taken along a line A-A'.
Figure 3:
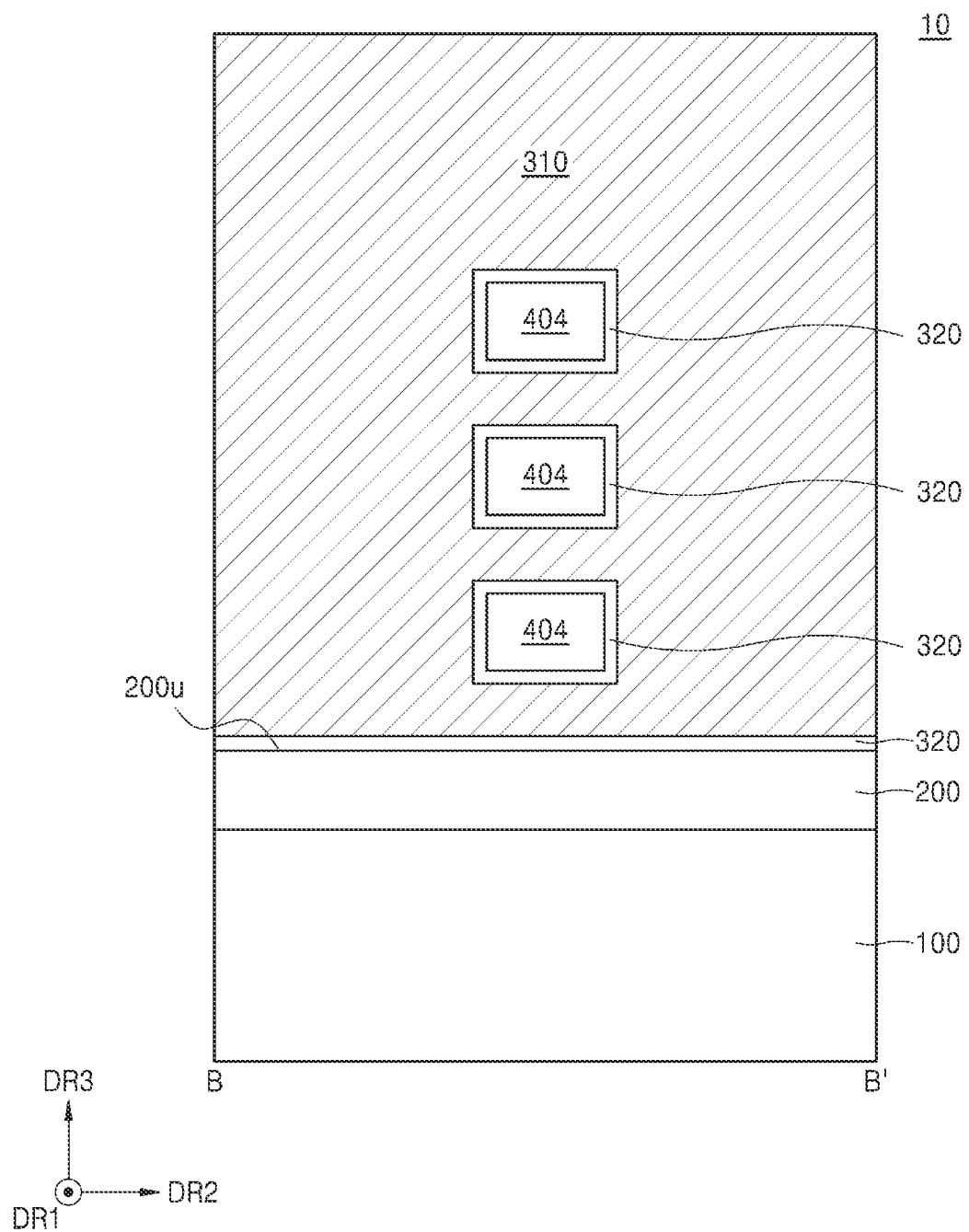
FIG. 3 is a cross-sectional view of the transistor of FIG. 1, taken along a line B-B'.

FIG. 1 is a perspective view of a transistor according to example embodiments. FIG. 2 is a cross-sectional view of the transistor of FIG. 1, taken along a line A-A'. FIG. 3 is a cross-sectional view of the transistor of FIG. 1, taken along a line B-B'.

Referring to FIGS. 1 through 3, a transistor 10 may be provided. The transistor 10 may include a substrate 100, a constant current formation layer 200, a pair of source/drain patterns SD, a gate electrode 310, a gate insulating layer 320, a pair of gate spacers 330, and a channel pattern 404.

The substrate 100 may include a semiconductor substrate. For example, the substrate 100 may include Si. The substrate 100 may have a first conductive type. For example, the first conductive type may be an n-type or a p-type. When a conductive type of the substrate 100 is an n-type, the substrate 100 may include Group V elements (for example, P and As) as impurities. When a conductive type of the substrate 100 is a p-type, the substrate 100 may include Group III elements (for example, B and In) as impurities.

The constant current formation layer 200 may be provided on the substrate 100. The constant current formation layer 200 may include an epitaxial layer formed by an epitaxial growth process. For example, the constant current formation layer 200 may include Si. The constant current formation layer 200 may have the first conductive type. When a conductive type of the constant current formation layer 200 is an n-type, the constant current formation layer 200 may include Group V elements (for example, P and As) as impurities. When a conductive type of the constant current formation layer 200 is a p-type, the constant current formation layer 200 may include Group III elements (for example, B and In) as impurities.

A doping concentration of the constant current formation layer 200 may be higher than a doping concentration of the substrate 100. For example, the doping concentration of the constant current formation layer 200 may be greater than or equal to about $3\times10^{18}$ cm$^{-3}$.

The pair of source/drain patterns SD may be provided on the constant current formation layer 200. The pair of source/drain patterns SD may be apart from each other in a first direction DR1 that is parallel to an upper surface of the substrate 100. The pair of source/drain patterns SD may include a doped semiconductor material. For example, the pair of source/drain patterns SD may include doped-poly Si. The pair of source/drain patterns SD may include epitaxial layers. The pair of source/drain patterns SD may have a second conductive type that is different from the first conductive type. When the first conductive type is an n-type, the second conductive type may be a p-type. When a conductive type of the pair of source/drain patterns SD is a p-type, the pair of source/drain patterns SD may include Group III elements (for example, B and In) as impurities. When the first conductive type is a p-type, the second conductive type may be an n-type. When a conductive type of the pair of source/drain patterns SD is an n-type, the pair of source/drain patterns SD may include Group V elements (for example, P and As) as impurities. One of the pair of source/drain patterns SD may be a source of the transistor 10, and the other may be a drain of the transistor 10.

The constant current formation layer 200 and the pair of source/drain patterns SD may be electrically connected to each other. For example, the constant current formation layer 200 and the pair of source/drain patterns SD may directly contact each other. An electric field may be formed between the constant current formation layer 200 and the pair of source/drain patterns SD. For example, an intensity of the electric field may be greater than or equal to about $10^6$ V/cm.

The constant current formation layer 200 may generate a constant current between any one of the pair of source/drain patterns SD, which is a drain, and the substrate 100. The constant current may include a band-to-band tunneling (BTBT) current between the one of the pair of source/drain patterns SD, which is the drain, and the constant current formation layer 200. The constant current may be independent from a gate voltage applied to the gate electrode 310. That is, the constant current may flow regardless of the gate voltage. When the transistor 10 is an NMOS transistor, the constant current may flow from the one of the pair of source/drain patterns SD, which is the drain, to the substrate 100 through the constant current formation layer 200. When the transistor 10 is a PMOS transistor, the constant current may flow from the substrate 100 to the one of the pair of source/drain patterns SD, which is the drain, through the constant current formation layer 200.

The gate electrode 310 may be provided on the constant current formation layer 200. The gate electrode 310 may extend in a second direction DR2 that is parallel to an upper surface 200u of the constant current formation layer 200. The gate electrode 310 may extend in a third direction DR3 that is perpendicular to the upper surface 200u of the constant current formation layer 200. The gate electrode 310 may be provided between the pair of source/drain patterns SD. The gate electrode 310 may be apart from the pair of source/drain patterns SD in the first direction DR1. The gate electrode 310 may include an electrically conductive material. For example, the gate electrode may include a doped semiconductor material, a metal, an alloy, or a combination thereof. For example, the gate electrode may include doped-poly Si, W, TiN, or a combination thereof.

The pair of gate spacers 330 may be provided between the gate electrode 310 and the pair of source/drain patterns SD, respectively. The pair of gate spacers 330 may be provided on both side surfaces of the gate electrode 310, respectively, the both side surfaces being opposite to each other in the first direction DR1. For example, the pair of gate spacers 330 may directly contact the pair of source/drain patterns SD, respectively. The pair of gate spacers 330 may extend in the third direction DR3. For example, the pair of gate spacers 330 may extend from a height that is the same as the upper surface 200u of the constant current formation layer 200 to an upper surface of the gate electrode 310. The pair of gate spacers 330 may electrically disconnect the gate electrode 310 from the pair of source/drain patterns SD. The gate spacers 330 may include an electrically insulating material. For example, the pair of gate spacers 330 may include silicon oxide (that is, $SiO_2$), silicon nitride (that is, SiN), or silicon oxynitride (that is, SiON).

The channel patterns 404 may be provided between the pair of source/drain patterns SD. The channel patterns 404 may extend in the first direction DR1. The channel patterns 404 may penetrate the gate electrode 310. The channel patterns 404 may directly contact the pair of source/drain patterns SD. The channel patterns 404 may include a semiconductor material. For example, the channel patterns 404 may include Si. The channel patterns 404 may have a first conductive type. For example, when a conductive type of the channel patterns 404 is an n-type, the channel patterns 404 may include Group V elements (for example, P and As) as impurities. When a conductive type of the channel patterns 404 is a p-type, the channel patterns 404 may include Group III elements (for example, B and In) as impurities. Three channel patterns 404 are illustrated. However, it is an example. As another example, the channel patterns 404 may include more or less than three channel patterns. A channel of the transistor 10 may be formed in the channel patterns 404.

The gate insulating layer 320 may be provided on a surface of the gate electrode 310. The gate insulating layer 320 may be provided between the gate electrode 310 and the channel patterns 404, between the gate electrode 310 and the pair of gate spacers 330, between the gate electrode 310 and the pair of source/drain patterns SD, and between the gate electrode 310 and the constant current formation layer 200. For example, the gate insulating layer 320 may surround the channel patterns 404. The gate insulating layer 320 may separate the gate electrode 310 from the channel patterns 404, the pair of gate spacers 330, the pair of source/drain patterns SD, and the constant current formation layer 200. The gate insulating layer 320 may electrically disconnect the gate electrode 310 from the channel patterns 404, the pair of source/drain patterns SD, and the constant current formation layer 200. The gate insulating layer 320 may include an electrically insulating material. For example, the gate insulating layer 320 may include at least one material selected from silicon oxide, silicon nitride, silicon oxynitride, oxide/nitride/oxide (ONO), or a high-k dielectric material. For example, the gate insulating layer 320 may include a material having a dielectric constant of about 10 to about 25. For example, the gate insulating layer 320 may include at least one material selected from HfO, HfSiO, HfON, HfSiON, LaO, LaAlO, ZrO, ZrSiO, ZrON, ZrSiON, TaO, TiO, BaSrTiO, BaTiO, SrTiO, YO, AlO, and PbScTaO.

For example, a threshold voltage of the transistor 10 may be adjusted by a doping concentration of the channel patterns 404 and a work function of the gate electrode 310. For example, the work function of the gate electrode 310 may be adjusted by using a material of the gate electrode 310 or by using an additional work function adjustment layer (not shown). For example, the additional work function adjustment layer may be arranged between the gate insulating layer 320 and the channel patterns 404.

The disclosure may provide the gate-all-around-type transistor 10 in which a constant current may flow between any one of the pair of source/drain patterns SD, which is a drain, and the substrate 100, through the constant current formation layer 200.

Figure 4:
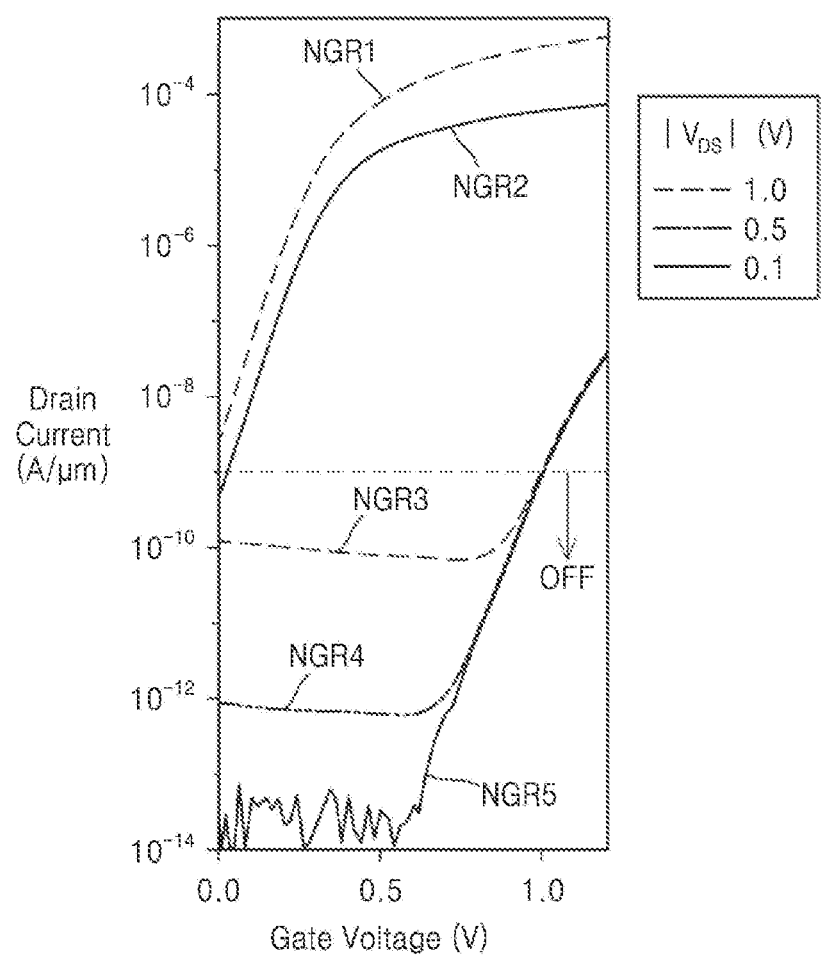
FIG. 4 shows gate voltage-drain current graphs of NMOS transistors according to an embodiment and NMOS transistors according to the related art.

FIG. 4 shows gate voltage-drain current graphs of NMOS transistors according to an embodiment and NMOS transistors according to the related art.

Referring to FIG. 4, gate voltage-drain current graphs NGR1 and NGR2 of the NMOS transistor according to the related art and gate voltage-drain current graphs NGR3, NGR4, and NGR5 of the NMOS transistor according to an embodiment are illustrated.

Drain currents of the NMOS transistors according to the related art may not have a constant current component flowing regardless of a gate voltage.

Drain currents of the NMOS transistors according to an embodiment may have a constant current component flowing regardless of a gate voltage. For example, even when the NMOS transistors according to an embodiment are in an off state, a constant current may flow in the NMOS transistors according to an embodiment.

Figure 5:
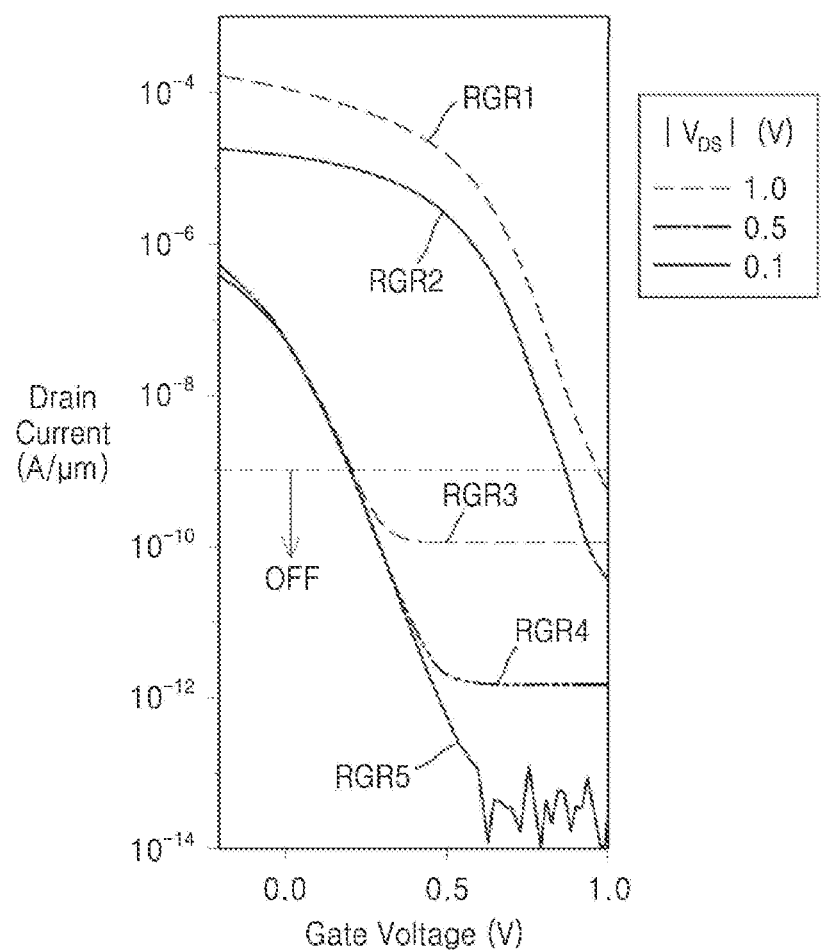
FIG. 5 shows gate voltage-drain current graphs of PMOS transistors according to an embodiment and PMOS transistors according to the related art.

FIG. 5 shows gate voltage-drain current graphs of PMOS transistors according to an embodiment and PMOS transistors according to the related art.

Referring to FIG. 5, gate voltage-drain current graphs RGR1 and RGR2 of the PMOS transistor according to the related art and gate voltage-drain current graphs RGR3, RGR4, and RGR5 of the PMOS transistor according to an embodiment are illustrated.

Drain currents of the PMOS transistors according to the related art may not have a constant current component flowing regardless of a gate voltage.

Drain currents of the PMOS transistors according to an embodiment may have a constant current component flowing regardless of a gate voltage. For example, even when the PMOS transistors according to an embodiment are in an off state, a constant current may flow in the PMOS transistors according to an embodiment.

FIGS. 6 through 10, 13, 16, and 19 are perspective views for describing a method of manufacturing the transistor of FIGS. 1 through 3. FIGS. 11, 14, 17, and 20 are cross-sectional views of the transistor of FIGS. 10, 13, 16, and 19, respectively, taken along a line A-A'. FIGS. 12, 15, 18, and 21 are cross-sectional views of the transistor of FIG. 19, taken along a line B-B'.

Figure 6:
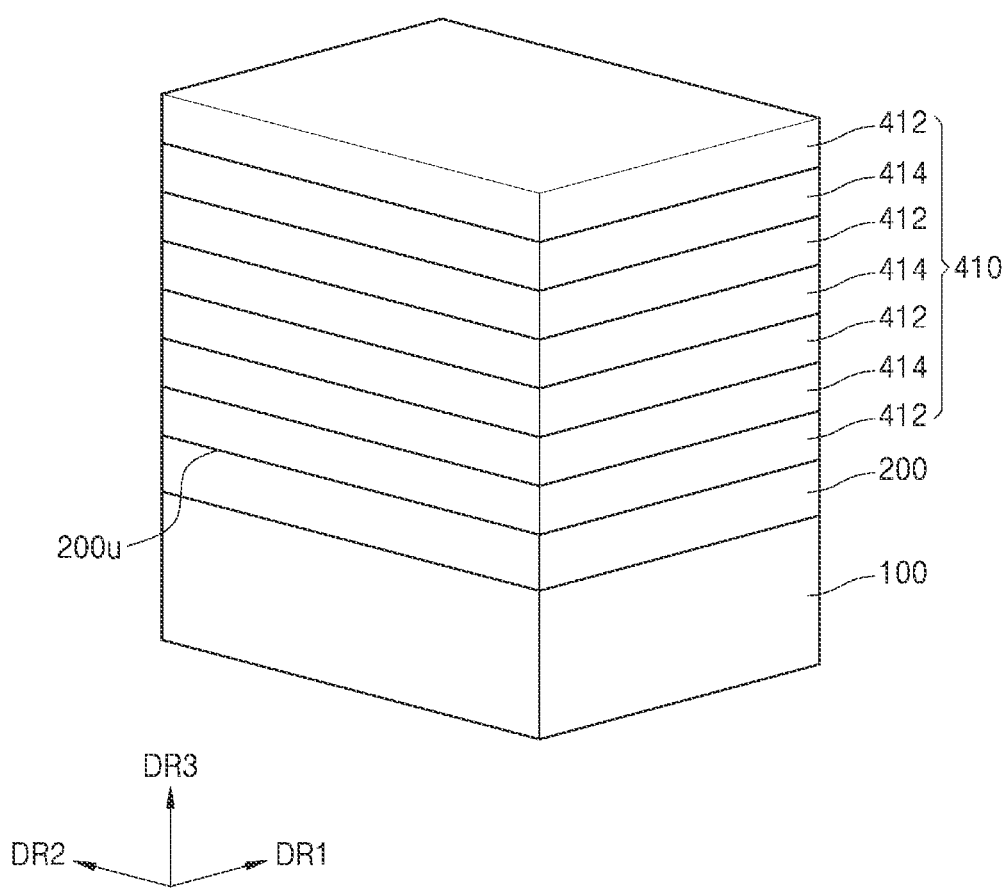
FIGS. 6 through 10, 13, 16, and 19 are perspective views for describing a method of manufacturing the transistor of FIGS. 1 through 3.

Referring to FIG. 6, the constant current formation layer 200 may be formed on the substrate 100. For example, the constant current formation layer 200 may be formed by an epitaxial growth process. That is, the constant current formation layer 200 may include an epitaxial layer. The constant current formation layer 200 may include a semiconductor layer having a first conductive type. For example, when a conductive type of the constant current formation layer 200 is an n-type, the constant current formation layer 200 may include a silicon layer including Group V elements (for example, P and As) as impurities. When a conductive type of the constant current formation layer 200 is a p-type, the constant current formation layer 200 may include a silicon layer including Group III elements (for example, B and In) as impurities. A doping concentration of the constant current formation layer 200 may be higher than a doping concentration of the substrate 100. For example, the doping concentration of the constant current formation layer 200 may be greater than or equal to about $3 \times 10^{18}$ $cm^{-3}$.

A stack layer 410 may be formed on the constant current formation layer 200. The stack layer 410 may be formed by alternately stacking sacrificial layers 412 and channel layers 414. The sacrificial layers 412 and the channel layers 414 may include materials having different etch selectivities from each other. For example, the sacrificial layers 412 may include SiGe, and the channel layers 414 may include Si. For example, the sacrificial layers 412 may include Si, and the channel layers 414 may include SiGe. However, in this specification, an embodiment in which the sacrificial layers 412 may include SiGe, and the channel layers 414 may include Si is described. The forming of the stack layer 410 may include performing a chemical vapor deposition (hereinafter, CVD) process, a physical vapor deposition (hereinafter, PVD) process, or an atomic layer deposition (hereinafter, ALD) process.

Figure 7:
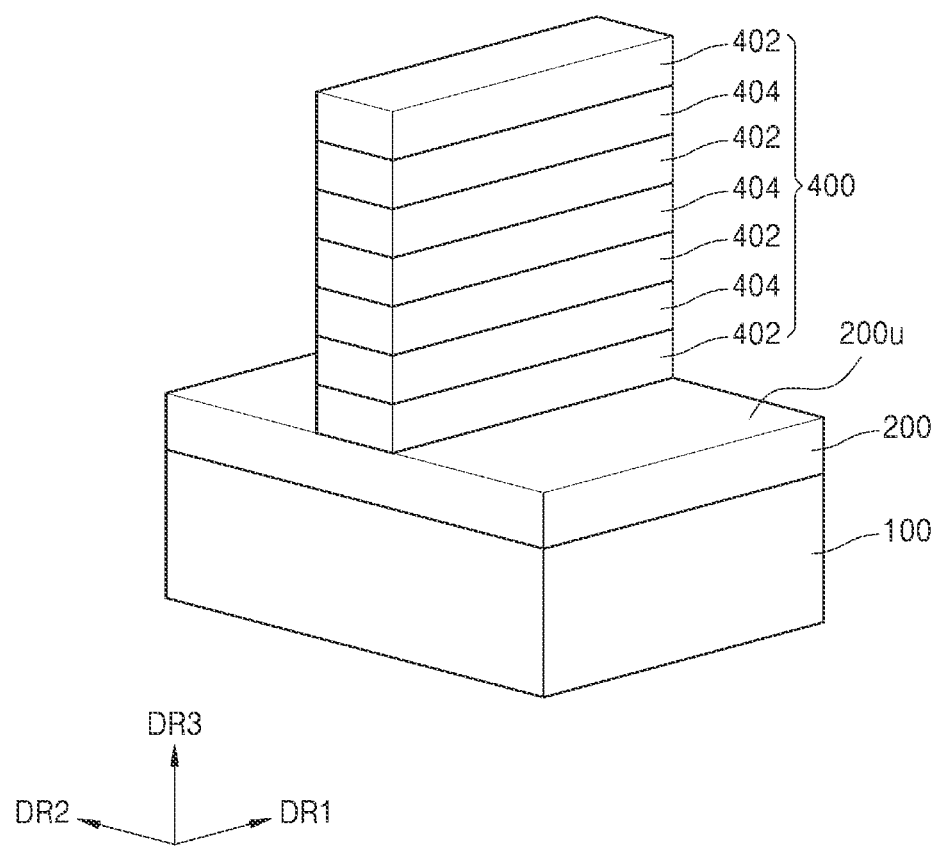

Referring to FIG. 7, a stack pattern 400 may be formed. The forming of the stack pattern 400 may include patterning the stack layer 410. For example, the stack layer 410 may be etched by an anisotropic etching process using an etch mask (not shown) provided on the stack layer 410. The patterning of the stack layer 410 may be performed until the upper surface 200u of the constant current formation layer 200 is exposed. The etch mask may be removed during or after the etching process. The stack pattern 400 may extend in the first direction DR1. The stack pattern 400 may include sacrificial patterns 402 and channel patterns 404 alternately stacked. The sacrificial patterns 402 may be formed by etching the sacrificial layers 412. The channel patterns 404 may be formed by etching the channel layers 414.

Figure 8:
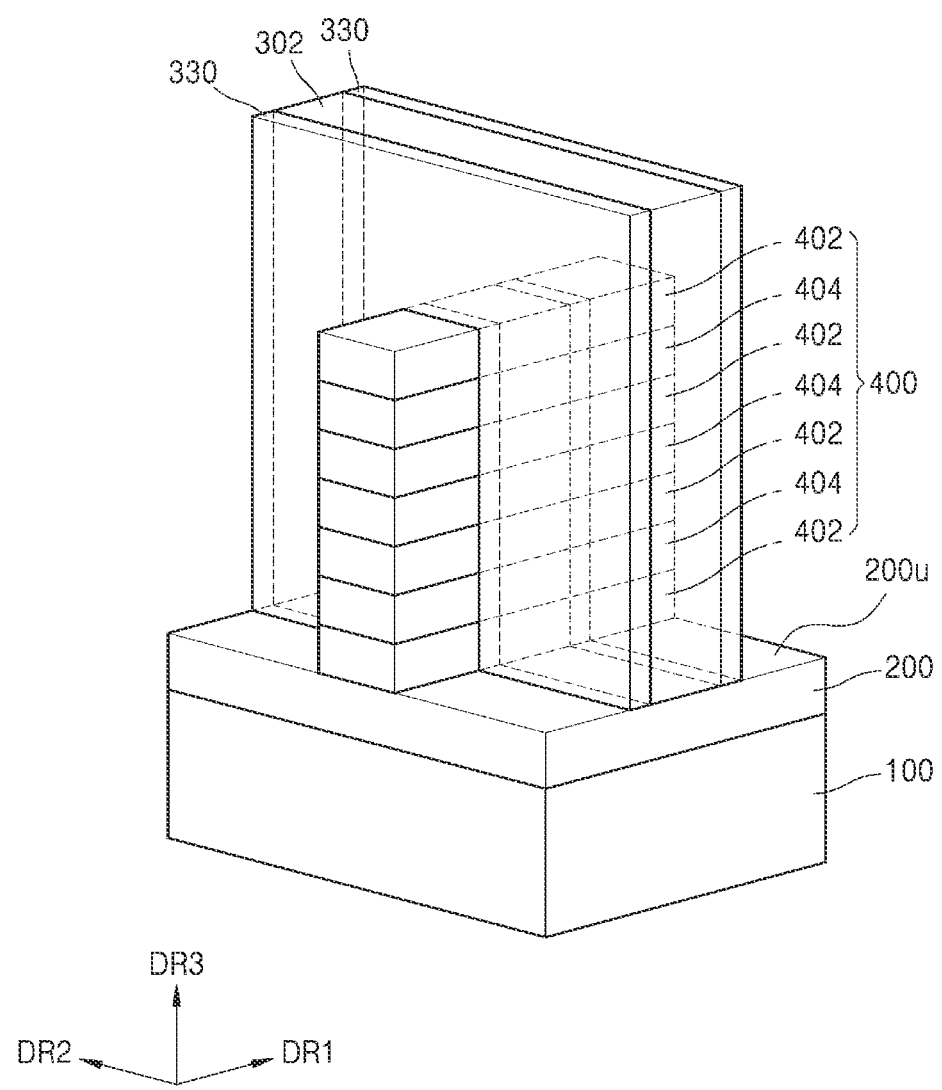

Referring to FIG. 8, a dummy gate pattern 302 and the pair of gate spacers 330 may be formed on the constant current formation layer 200. The dummy gate pattern 302 may extend in the second direction DR2. The dummy gate pattern 302 may intersect with the constant current formation layer 200. The dummy gate pattern 302 may cover the constant current formation layer 200. The constant current formation layer 200 may be arranged between the dummy gate pattern 302 and the substrate 100. The stack pattern 400 may be exposed to both side surfaces of the dummy gate pattern 302. The both side surfaces of the dummy gate pattern 302 may be arranged on the opposite sides in the first direction DR1. The dummy gate pattern 302 may have a higher etch selectivity than the pair of gate spacers 330. For example, the dummy gate pattern 302 may include silicon nitride (that is, SiN). For example, the forming of the dummy gate pattern 302 may include forming a dummy gate layer (not shown) covering the stack pattern 400 and patterning the dummy gate layer. The patterning of the dummy gate layer may be performed until the upper surface of the constant current formation layer 200 is exposed.

The pair of gate spacers 330 may be provided on the both side surfaces of the dummy gate pattern 302. The pair of gate spacers 330 may cover the both side surfaces of the dummy gate pattern 302. The pair of gate spacers 330 may cover a portion of the stack pattern 400, the portion being exposed to the both side surfaces of the dummy gate pattern 302, and may expose the other portion of the stack pattern 400. The pair of gate spacers 330 may have a lower etch selectivity than the dummy gate pattern 302. For example, the pair of gate spacers 330 may include silicon oxide (that is, $SiO_2$). The forming of the pair of gate spacers 330 may include forming a preliminary gate spacer layer (not shown) on the dummy gate pattern 302, the stack pattern 400, and the constant current formation layer 200 and etching the preliminary gate spacer layer. For example, the etching of the preliminary gate spacer layer may include an anisotropic dry etching process. The etching of the preliminary gate spacer layer may be performed until the constant current formation layer 200 and the stack pattern 400 are exposed.

Figure 9:
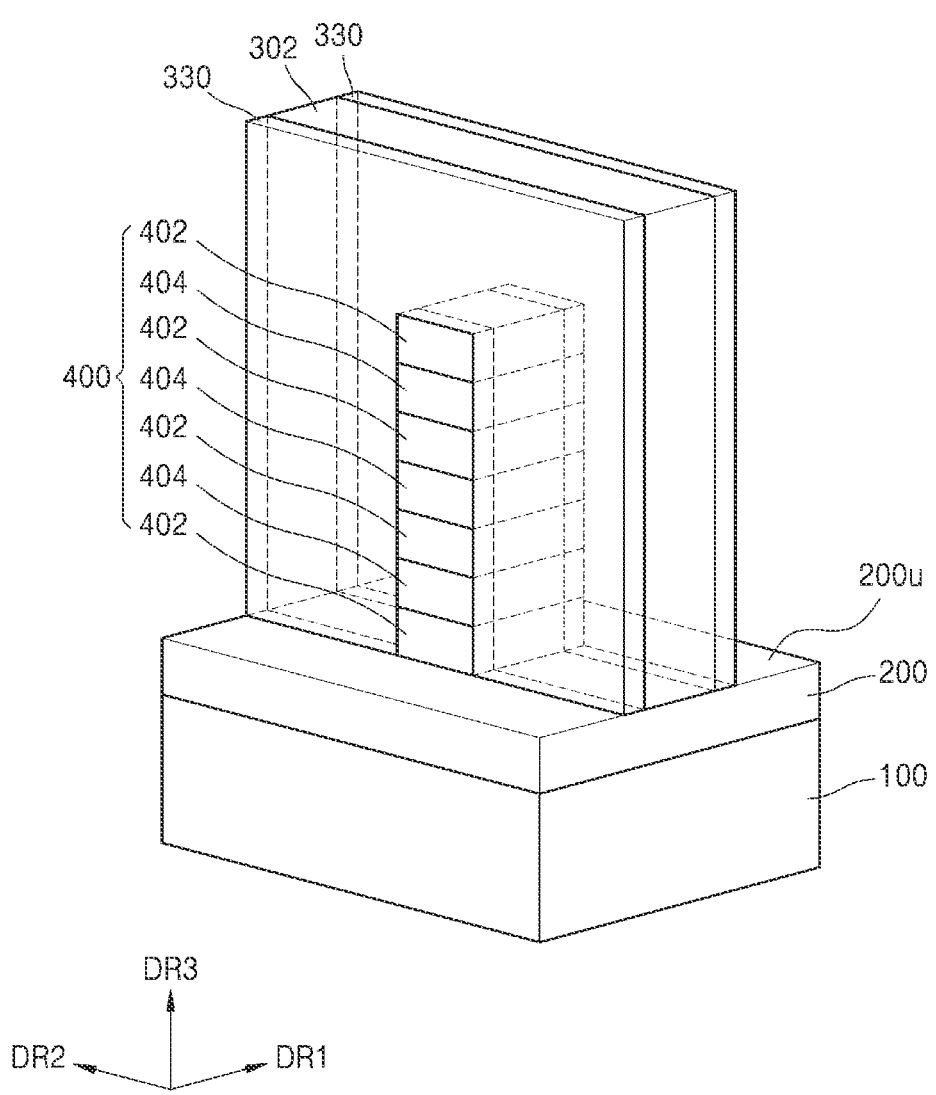

Referring to FIG. 9, the stack pattern 400 exposed to the pair of gate spacers 330 and the dummy gate pattern 302 may be removed. The removing of the stack pattern 400 may include performing an anisotropic etching process using an etch mask (not shown). The anisotropic etching process may be performed until the constant current formation layer 200 is exposed. The etch mask may be removed during or after the etching process.

Figure 10:
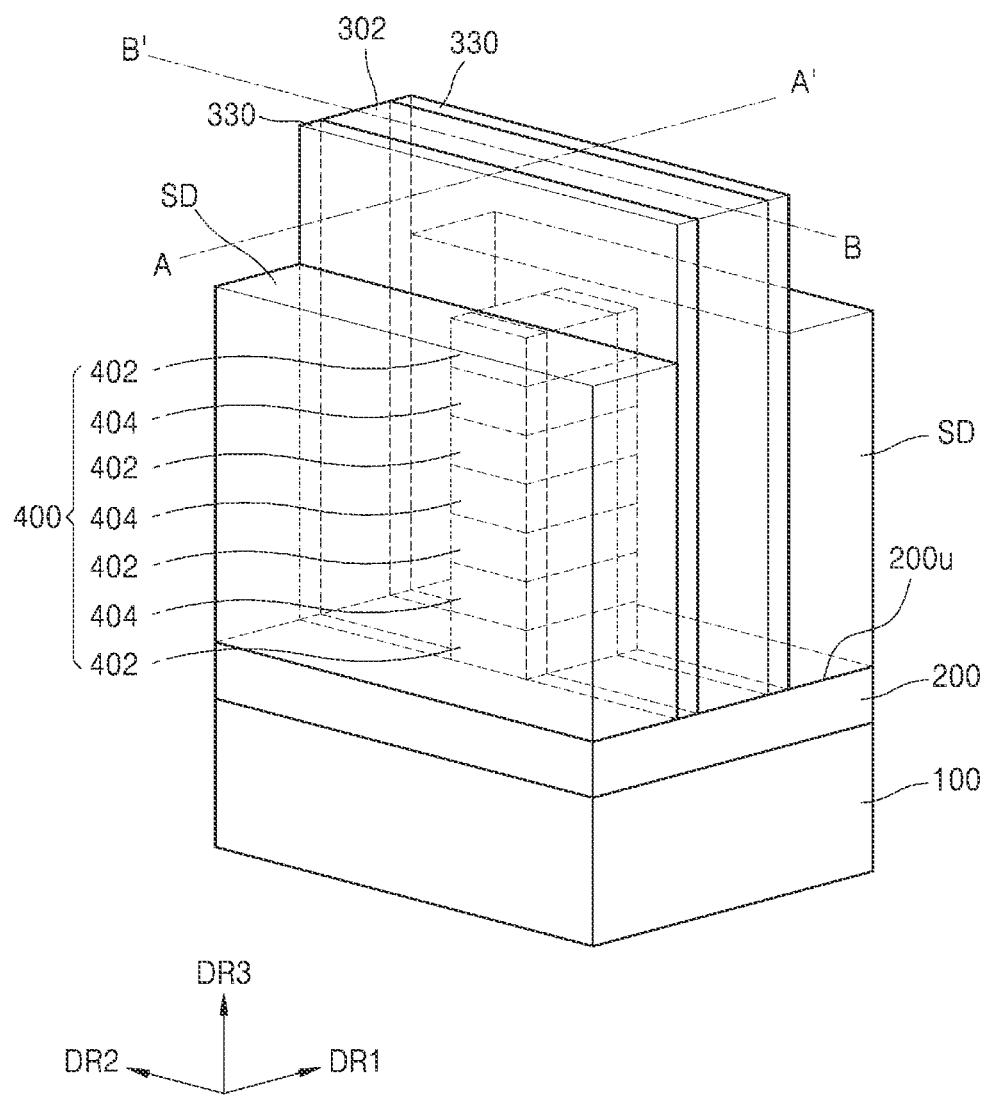
Figure 11:
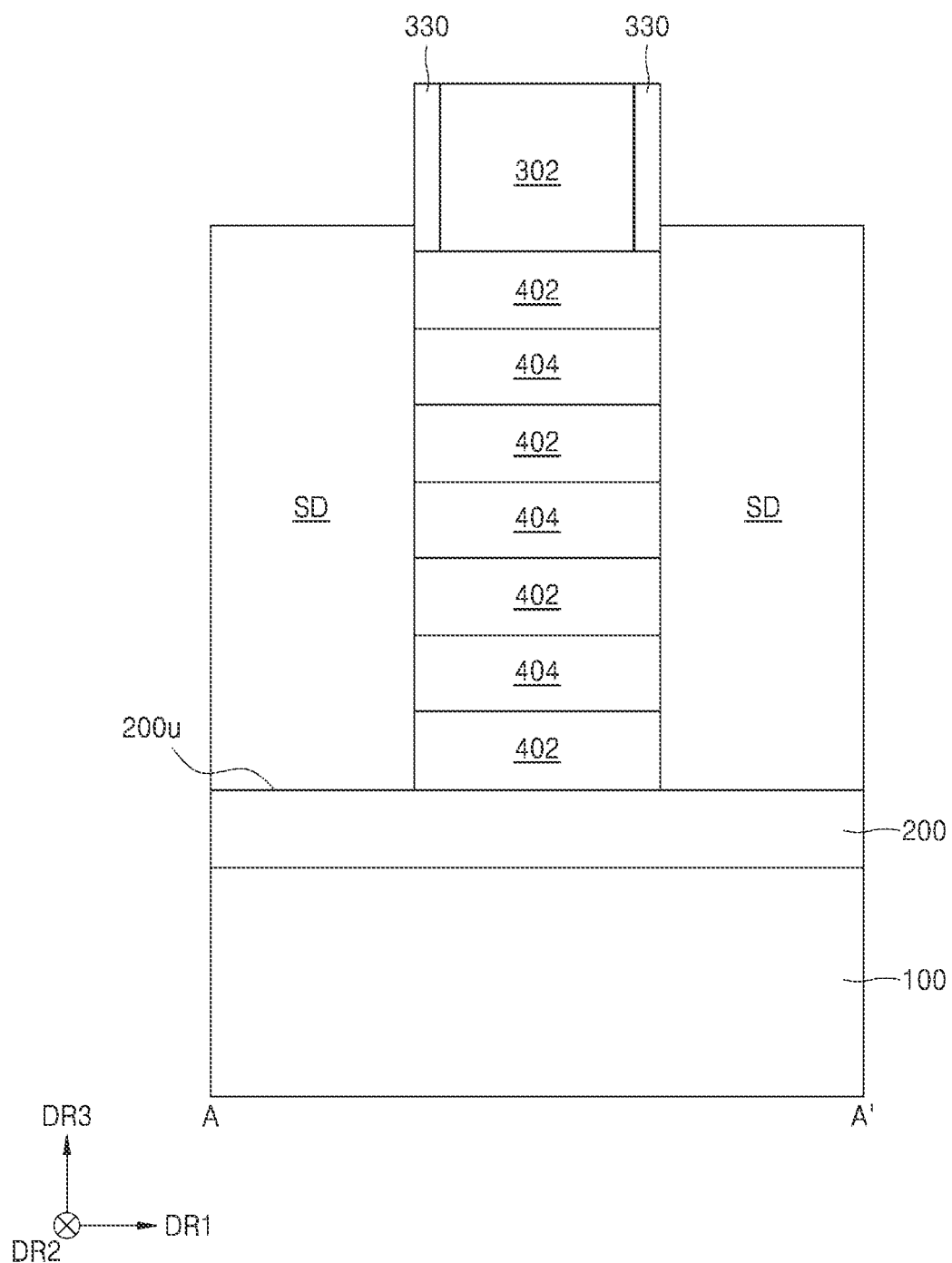
FIGS. 11, 14, 17, and 20 are cross-sectional views of the transistor of FIGS. 10, 13, 16, and 19, respectively, taken along a line A-A'.
Figure 12:
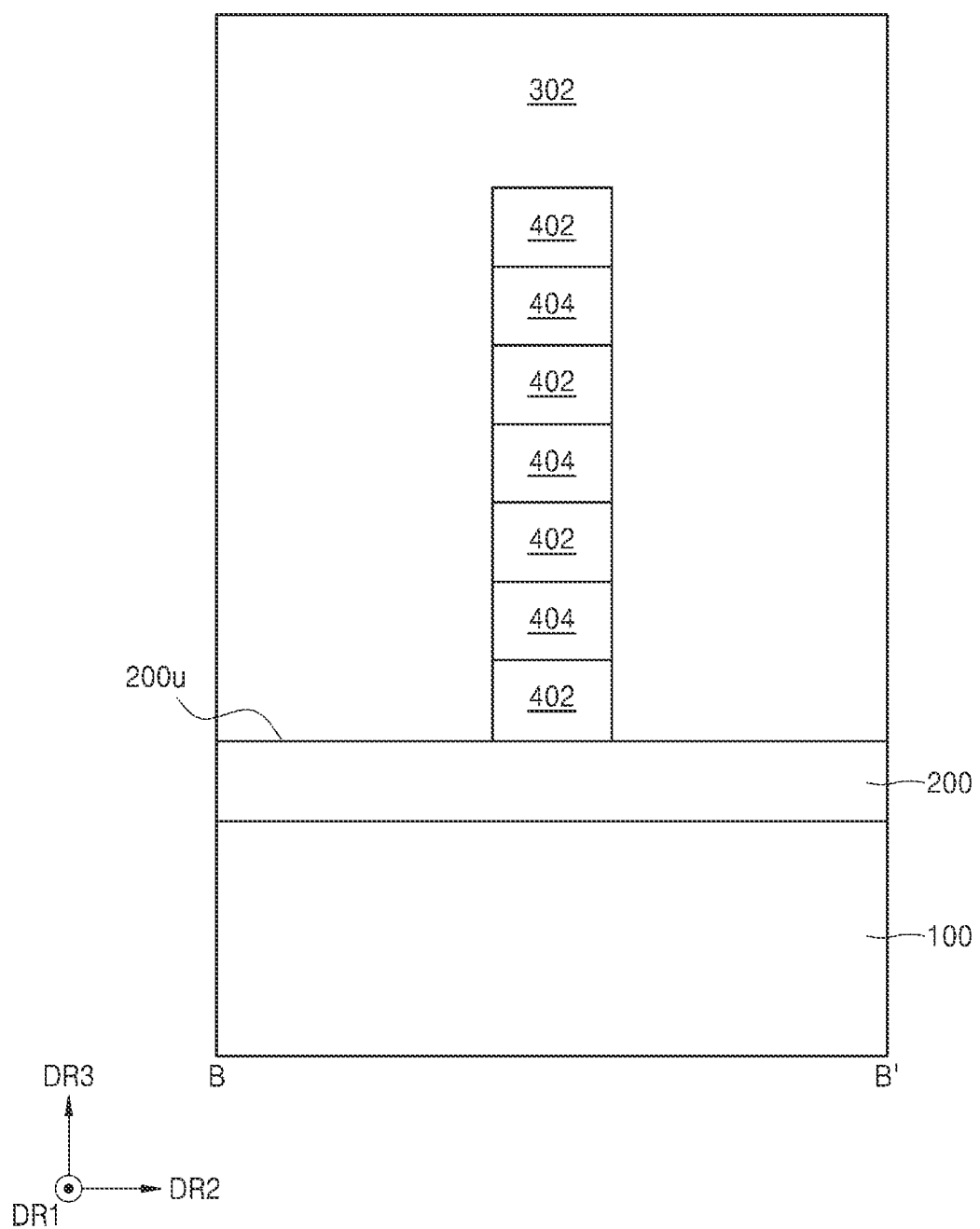
FIGS. 12, 15, 18, and 21 are cross-sectional views of the transistor of FIG. 19, taken along a line B-B'.

Referring to FIGS. 10 through 12, the pair of source/drain patterns SD may be formed on the constant current formation layer 200. The pair of source/drain patterns SD may be formed on sides of the pair of gate spacers 330, respectively, the sides each being opposite to the dummy gate pattern 302. The pair of source/drain patterns SD may be formed in an area from which the stack pattern exposed to the pair of gate spacers 330 and the dummy gate pattern 302 is removed. The forming of the pair of source/drain patterns SD may include an epitaxial growth process. The pair of source/drain patterns SD may include a doped semiconductor material. For example, the pair of source/drain patterns SD may include doped-poly Si. The pair of source/drain patterns SD may have a second conductive type. When a conductive type of the pair of source/drain patterns SD is a p-type, the pair of source/drain patterns SD may include Group III elements (for example, B and In) as impurities. When a conductive type of the pair of source/drain patterns SD is an n-type, the pair of source/drain patterns SD may include Group V elements (for example, P and As) as impurities.

Figure 13:
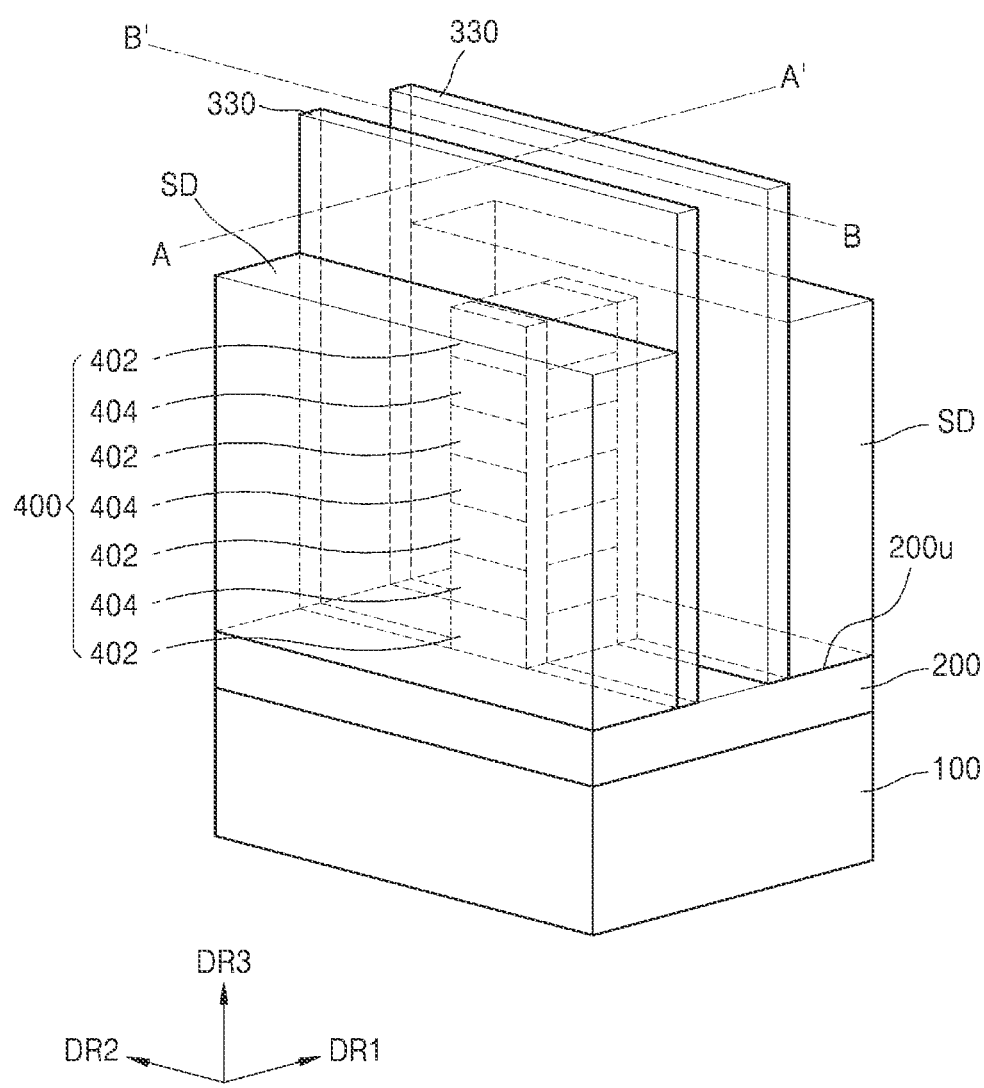
Figure 14:
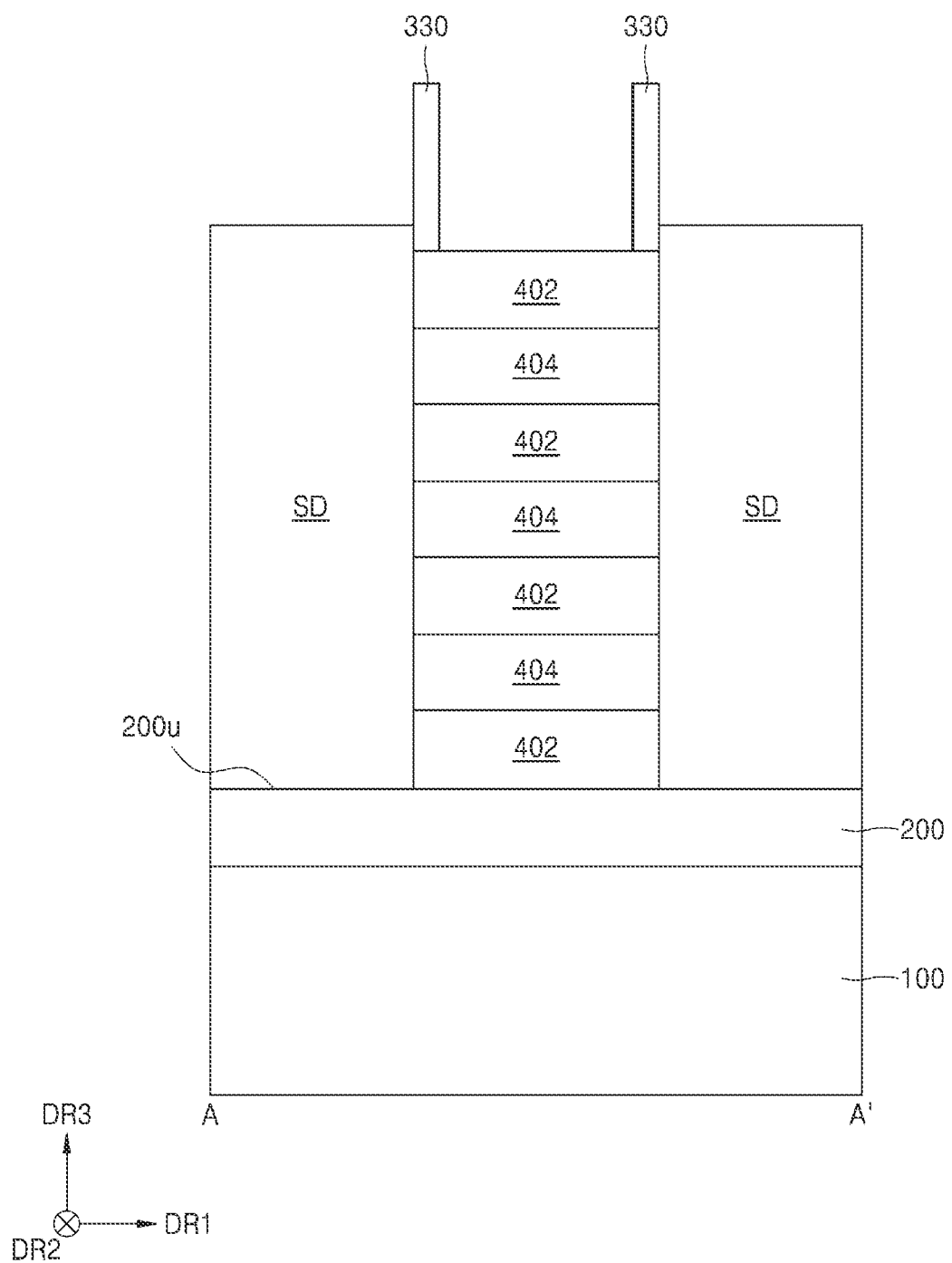
Figure 15:
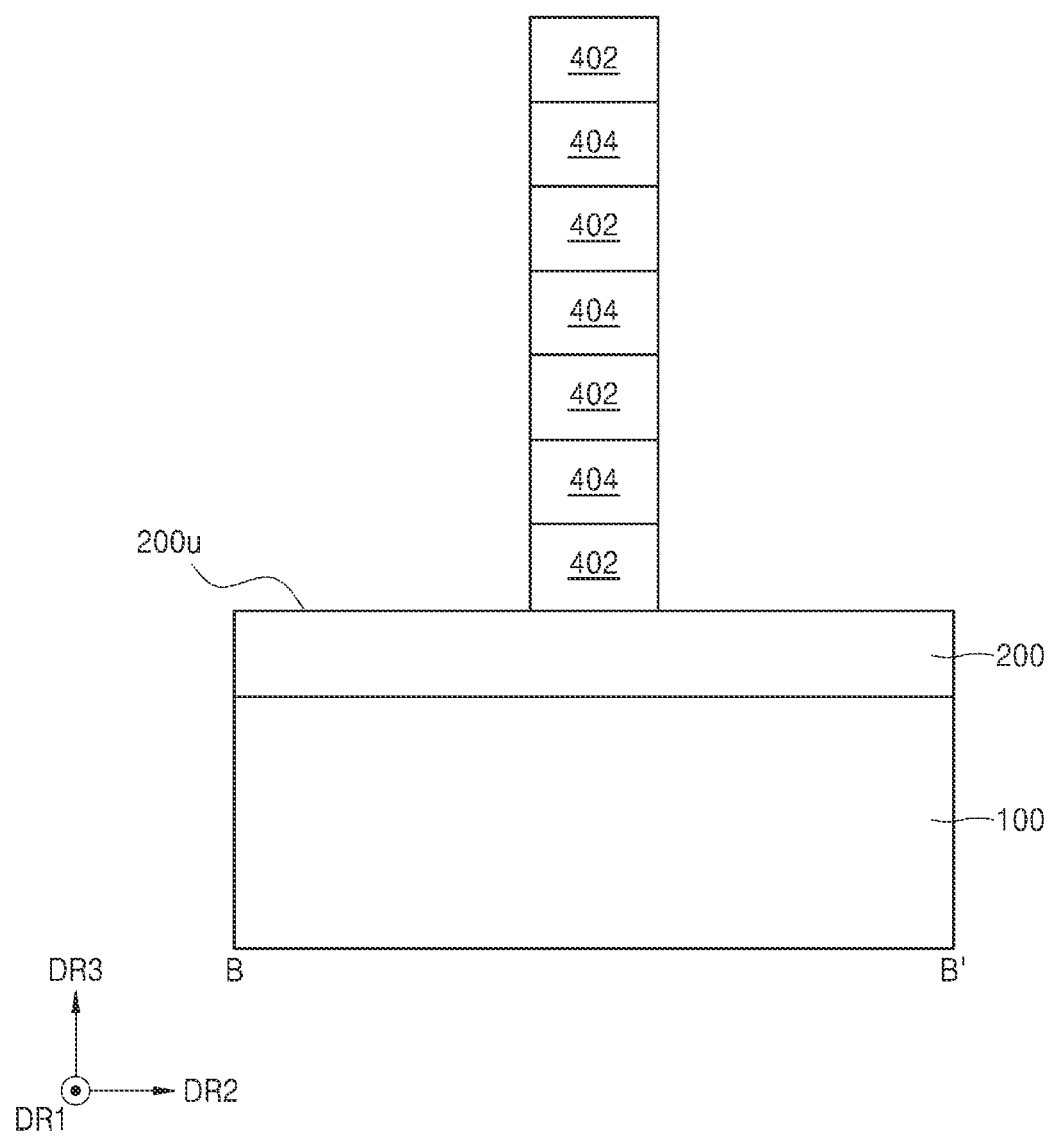

Referring to FIGS. 13 through 15, the dummy gate pattern 302 may be removed. For example, the removing of the dummy gate pattern 302 may include a wet etching process. For example, an etchant may include a hydrofluoric-based material. By removing the dummy gate pattern 302, surfaces of the stack pattern 400, the pair of gate spacers 330, and the constant current formation layer 200 may be exposed between the pair of gate spacers 330.

Figure 16:
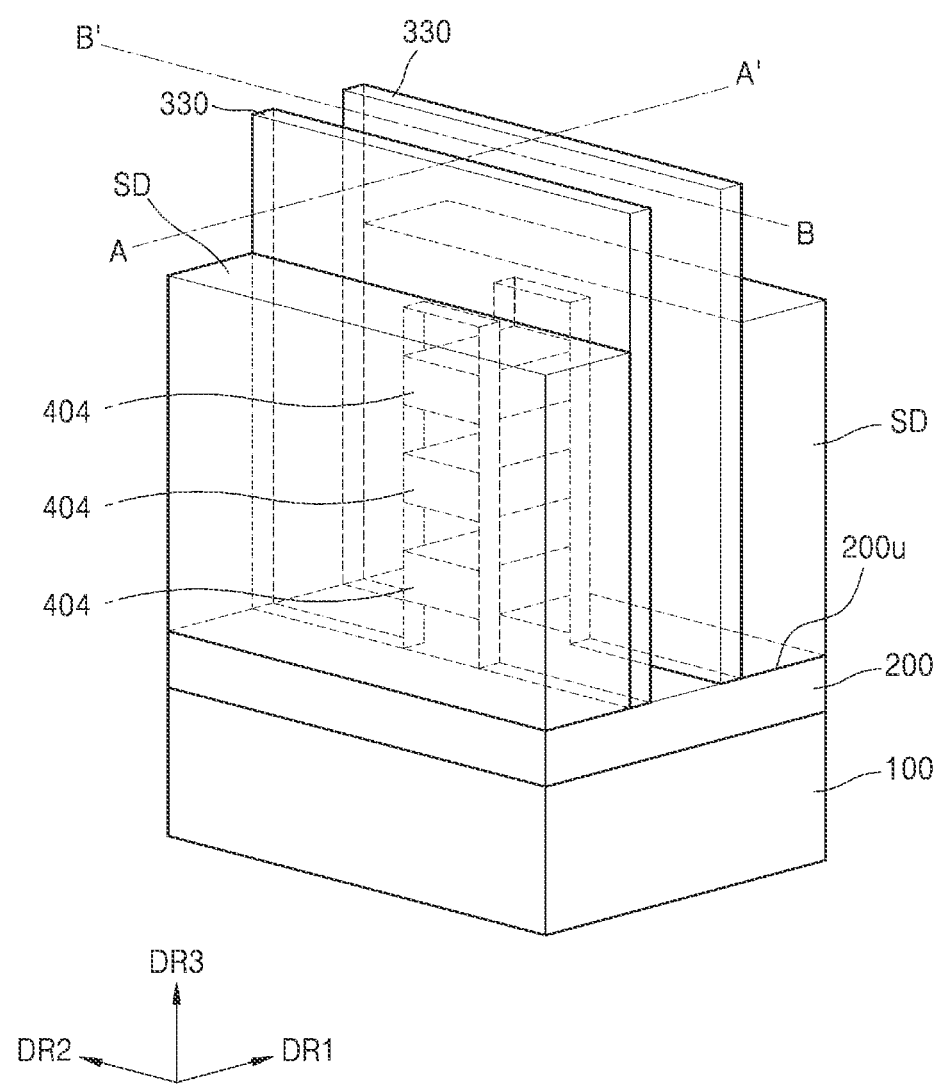
Figure 17:
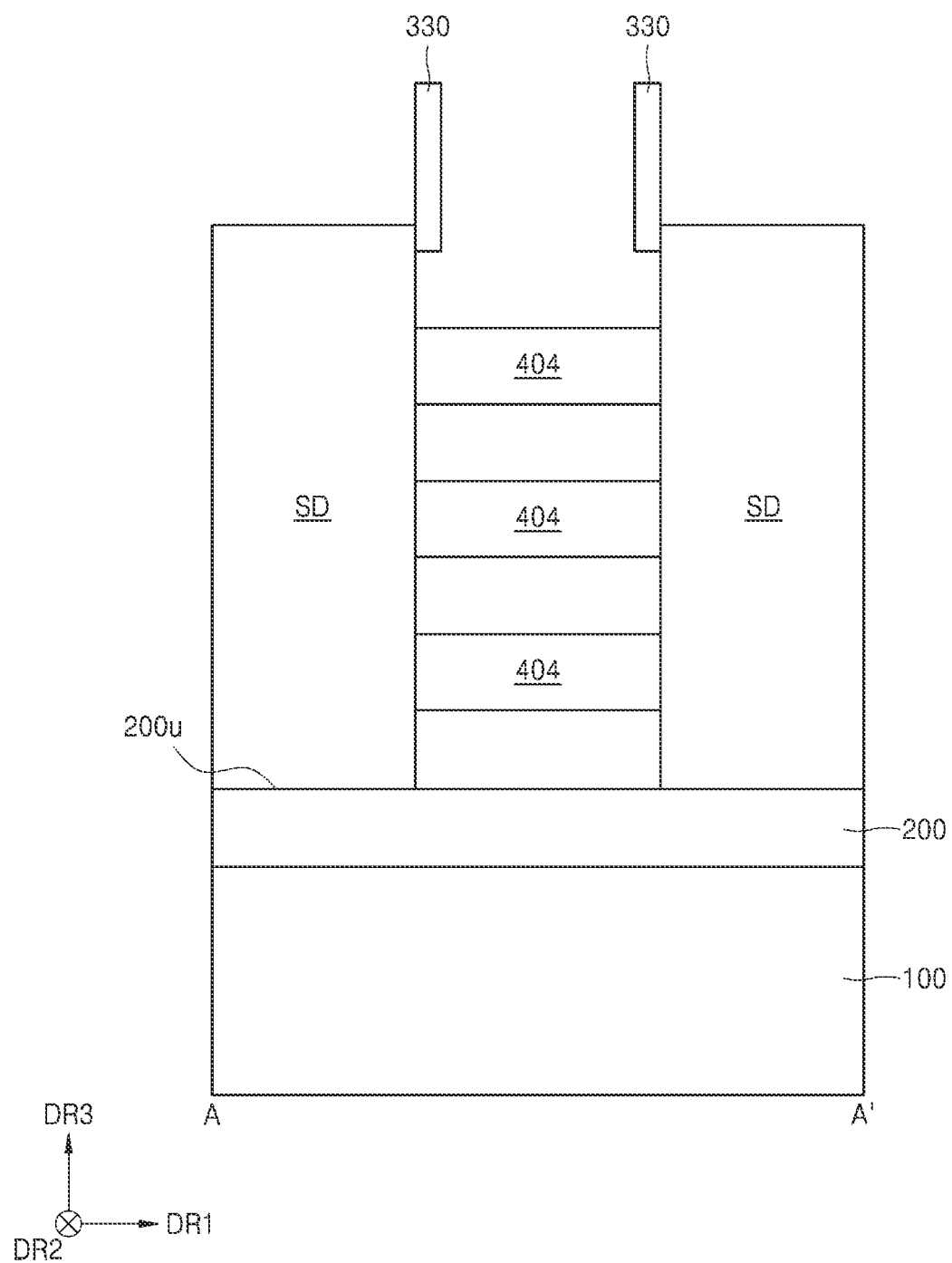
Figure 18:
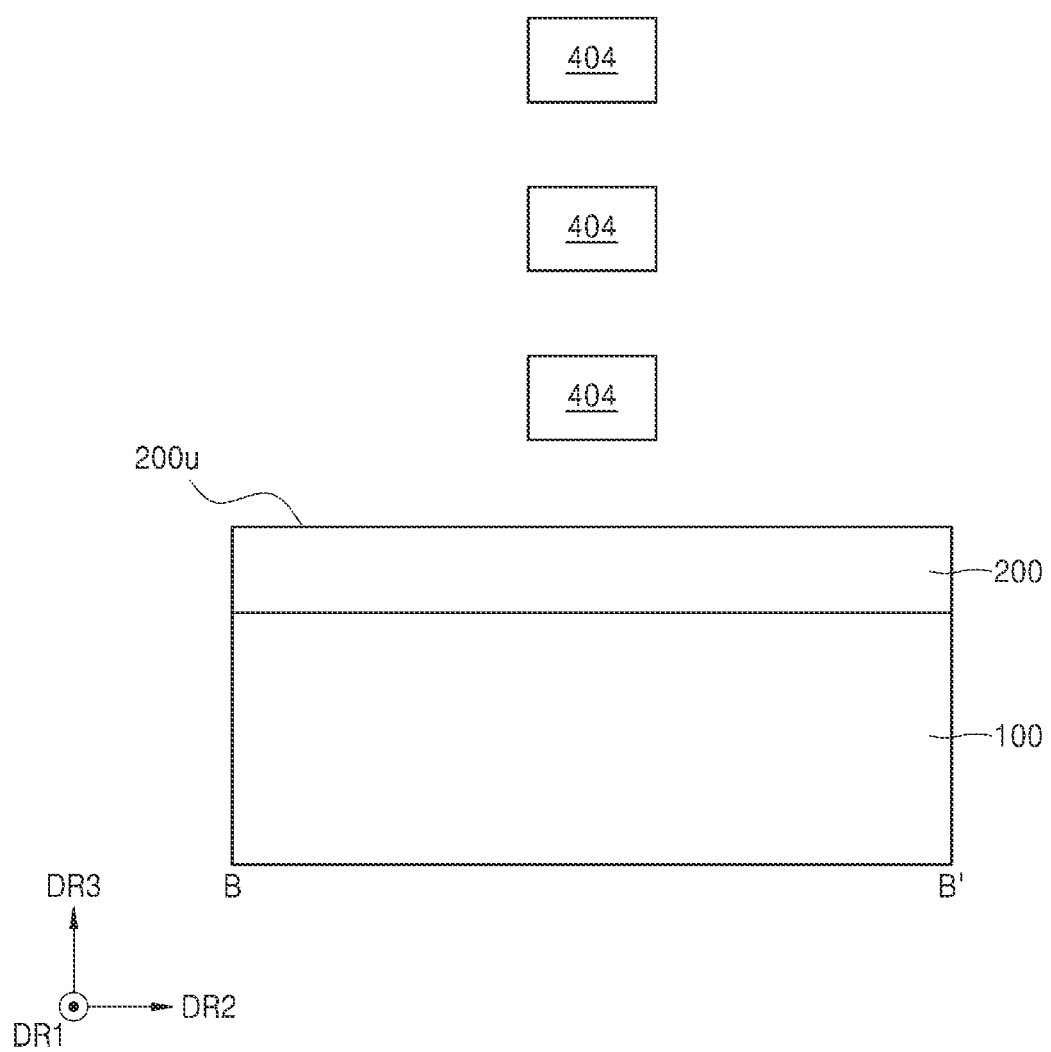

Referring to FIGS. 16 through 18, the sacrificial patterns 402 may be selectively removed. The removing of the sacrificial patterns 402 may include performing a chemical dry etching process or a wet etching process on the sacrificial patterns 402. For example, the chemical dry etching process may use a plasma generated by a radical generator. For example, the wet etching process may include a wet etching process using an ammonia-peroxidation mixture. In the mixture, $H_2O_2$ may serve as an oxidizer, and $NH_4OH$ may serve as an oxide etchant. By removing the sacrificial patterns 402, surfaces of the pair of source/drain patterns SD, the channel patterns 404, and the pair of gate spacers 330 may be exposed between the pair of source/drain patterns SD.

Figure 19:
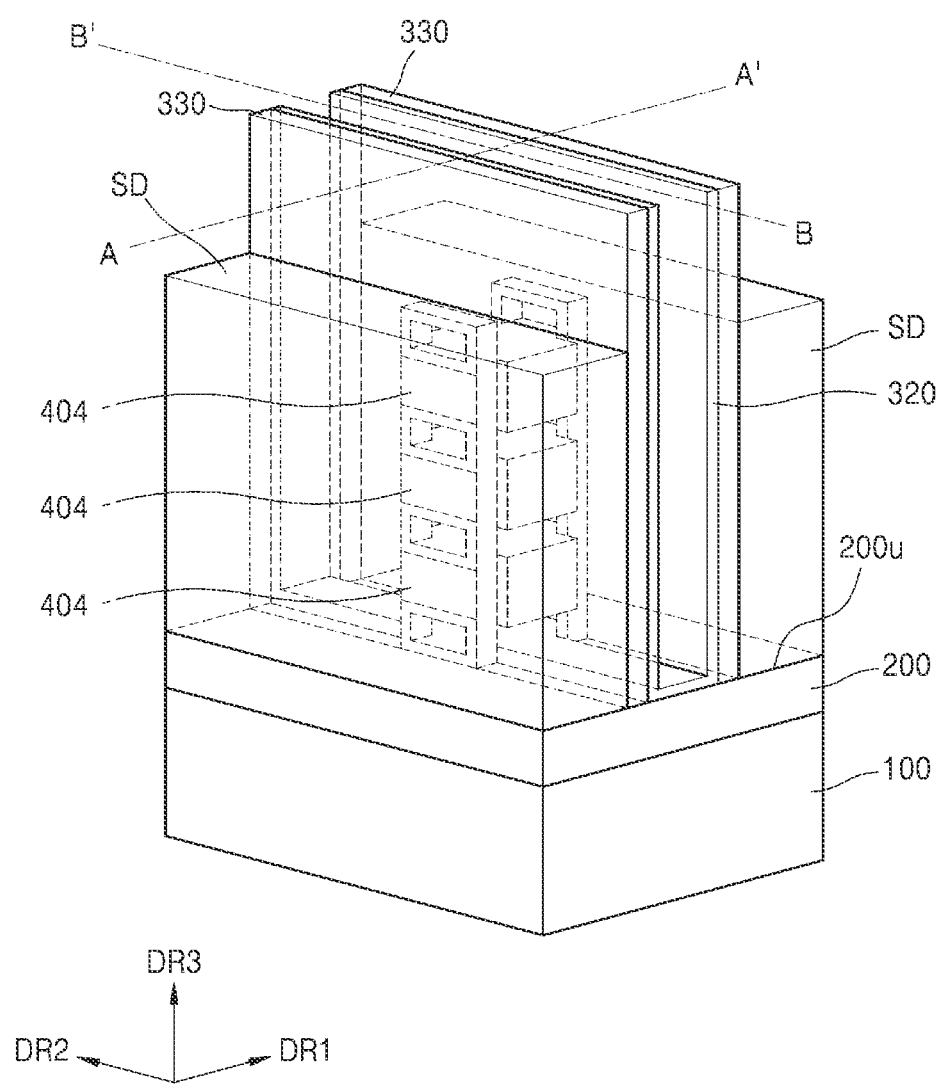
Figure 20:
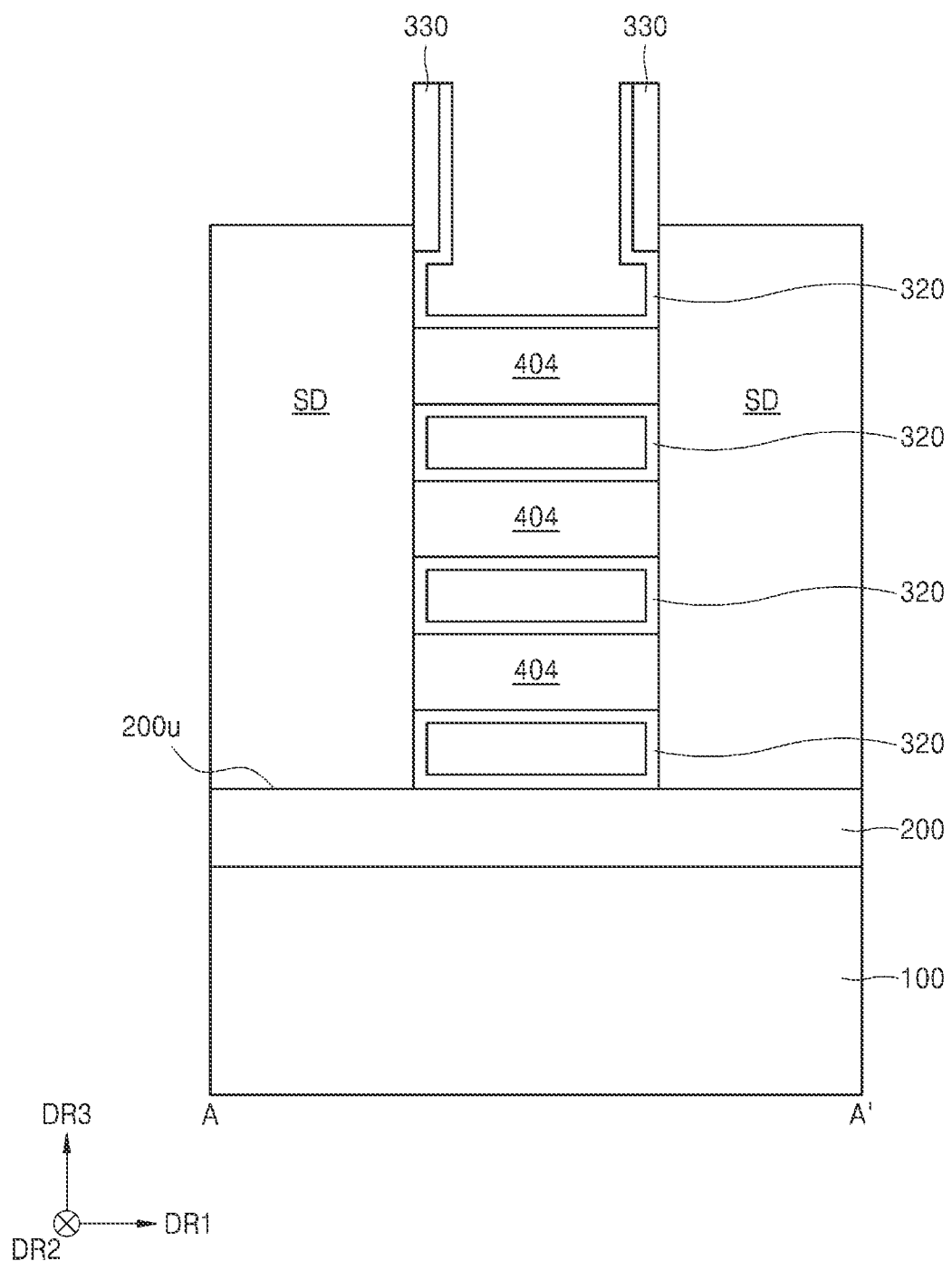
Figure 21:
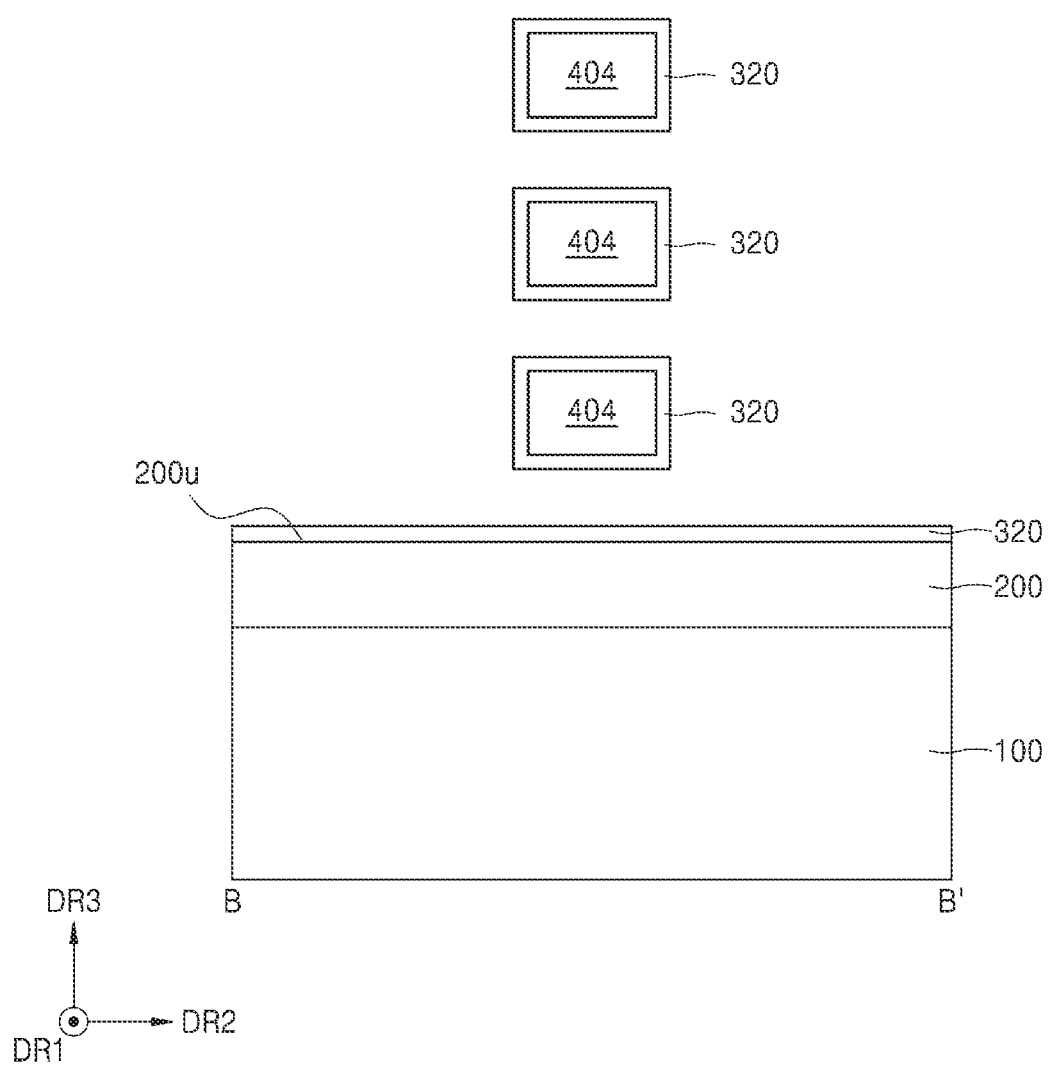

Referring to FIGS. 19 through 21, the gate insulating layer 320 may be formed on the surfaces of the pair of gate spacers 330, the pair of source/drain patterns SD, the channel patterns 404, and the constant current formation layer 220, the surfaces being exposed by removing the dummy gate pattern 302 and the sacrificial patterns 402. The forming of the gate insulating layer 320 may include depositing an electrically insulating material. For example, the depositing of the electrically insulating material may include performing a heat oxidation process, a CVD process, a PVD process, or an ALD process. For example, the gate insulating layer 320 may include at least one material selected from silicon oxide, silicon nitride, silicon oxynitride, ONO, or a high-k dielectric material. For example, the gate insulating layer 320 may include a material having a dielectric constant of about 10 to about 25. For example, the gate insulating layer 320 may include at least one material selected from HfO, HfSiO, HfON, HfSiON, LaO, LaAlO, ZrO, ZrSiO, ZrON, ZrSiON, TaO, TiO, BaSrTiO, BaTiO, SrTiO, YO, AlO, and PbScTaO.

Referring to FIGS. 1 through 3 again, the gate electrode 310 may be formed between the pair of gate spacers 330. The gate electrode 310 may fill an area between the pair of gate spacers 330 and between the pair of source/drain patterns SD. The gate electrode 310 may fill an area surrounded by the gate insulating layer 320. The gate electrode 310 may include an electrically conductive material. For example, the gate electrode 310 may include metal or poly silicon. The forming of the gate electrode 310 may include performing a CVD process, a PVD process, or an ALD process. Thus, the transistor 10 may be formed.

The disclosure may provide a method of manufacturing the gate-all-around-type transistor 10 in which a constant current may flow between any one of the pair of source/drain patterns SD, which is a drain, and the substrate 100, through the constant current formation layer 200.

Figure 22:
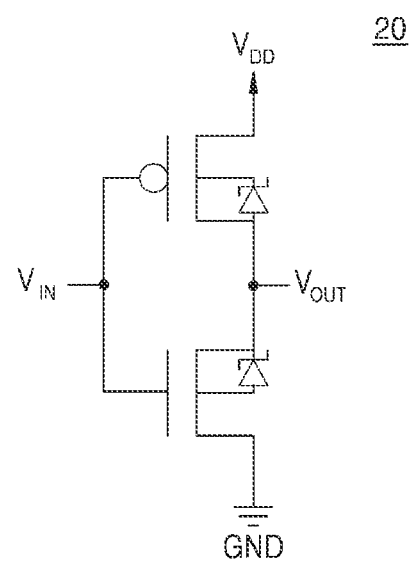
FIG. 22 is a circuit diagram of a ternary inverter according to example embodiments.

FIG. 22 is a circuit diagram of a ternary inverter according to example embodiments. For brevity of explanation, aspects that are substantially the same as the aspects described with reference to FIGS. 1 through 3 may not be described.

Referring to FIG. 22, a ternary inverter 20 including an NMOS transistor and a PMOS transistor may be provided.

Each of the NMOS transistor and the PMOS transistor may be substantially the same as the transistor 10 described with reference to FIGS. 1 through 3. Conductive types of the substrate 100 and the constant current formation layer 200 of the NMOS transistor may be p-types. Conductive types of the pair of source/drain patterns SD of the NMOS transistor may be n-types. Conductive types of the substrate 100 and the constant current formation layer 200 of the PMOS transistor may be n-types. Conductive types of the pair of source/drain patterns SD of the PMOS transistor may be p-types.

A ground voltage may be applied to the source and the substrate of the NMOS transistor. For brevity of explanation, it may be assumed that the ground voltage is 0 volt (V), hereinafter. A driving voltage $V_{DD}$ may be applied to the source and the substrate of the PMOS transistor. An input voltage Vin may be applied to each of a gate electrode of the NMOS transistor and a gate electrode of the PMOS transistor.

The drain of the NMOS transistor may be electrically connected to the drain of the PMOS transistor, and the drain of the NMOS transistor and the drain of the PMOS transistor may have the same voltage as each other. The voltage of the drain of the NMOS transistor and the drain of the PMOS transistor may be an output voltage Vout of the ternary inverter 20.

A constant current may flow from the drain of the NMOS transistor to the substrate of the NMOS transistor. A constant current may flow from the substrate of the PMOS transistor to the drain of the PMOS transistor. The constant currents may be independent from the input voltage Vin.

For example, for the PMOS transistor to have a constant current superior to a channel current and for the NMOS transistor to have a channel current superior to a constant current, a first input voltage may be applied to the gate electrode of the PMOS transistor and the gate electrode of the NMOS transistor. Here, the output voltage Vout of the ternary inverter 20 may be a first voltage.

As another example, for the NMOS transistor to have a constant current superior to a channel current and for the PMOS transistor to have a channel current superior to a constant current, a second input voltage may be applied to the gate electrode of the PMOS transistor and the gate electrode of the NMOS transistor. Here, the output voltage of the ternary inverter 20 may be a second voltage that is greater than the first voltage.

As another example, for each of the NMOS transistor and the PMOS transistor to have a constant current superior to a channel current, a third input voltage may be applied to the gate electrode of the PMOS transistor and the gate electrode of the NMOS transistor. Here, the output voltage of the ternary inverter 20 may be a third voltage between the first voltage and the second voltage.

The constant current flowing from the drain of the NMOS transistor to the substrate of the NMOS transistor and the constant current flowing from the substrate of the PMOS transistor to the drain of the PMOS transistor may flow regardless of gate voltages applied to the gate electrodes of the PMOS transistor and the NMOS transistor. A current in the ternary inverter 20 may flow from the substrate of the PMOS transistor to the substrate of the NMOS transistor through the drain of the PMOS transistor and the drain of the NMOS transistor. The driving voltage $V_{DD}$ applied to the substrate of the PMOS transistor may be distributed to a resistor between the substrate of the PMOS transistor and the drain of the PMOS transistor and a resistor between the substrate of the NMOS transistor and the drain of the NMOS transistor. The output voltage Vout may be a voltage applied to the resistor between the substrate of the NMOS transistor and the drain of the NMOS transistor. The output voltage Vout may have a value between the driving voltage $V_{DD}$ and 0V.

The output voltage Vout may have 0V (a state of "0"), a voltage between the driving voltage $V_{DD}$ and 0V (a state of "1"), or a driving voltage $V_{DD}$ (a state of "2") according to the input voltage Vin. The disclosure may provide the ternary inverter having three states according to the input voltage Vin.

For example, in order to use the required driving voltage $V_{DD}$, a threshold voltage and/or an intensity of a constant current of each of the NMOS transistor and the PMOS transistor may be adjusted. In other words, the threshold voltage and/or the intensity of the constant current of each of the NMOS transistor and the PMOS transistor may be determined according to the driving voltage $V_{DD}$ to be used. For example, the threshold voltage may be adjusted by a doping concentration of the channel patterns (404 of FIGS. 1 through 3) and/or a work function of the gate electrode (310 of FIGS. 1 through 3). For example, the work function of the gate electrode (310 of FIGS. 1 through 3) may be adjusted by using a material of the gate electrode (310 of FIGS. 1 through 3) or an additional work function adjusting layer. For example, the additional work function adjusting layer may be arranged between the gate insulating layer (320 of FIGS. 1 through 3) and the channel patterns (404 of FIGS. 1 through 3). For example, the intensity of the constant current may be adjusted by using a doping concentration of the constant current formation layer (200 of FIGS. 1 through 3) and/or a heat processing condition.

Figure 23:
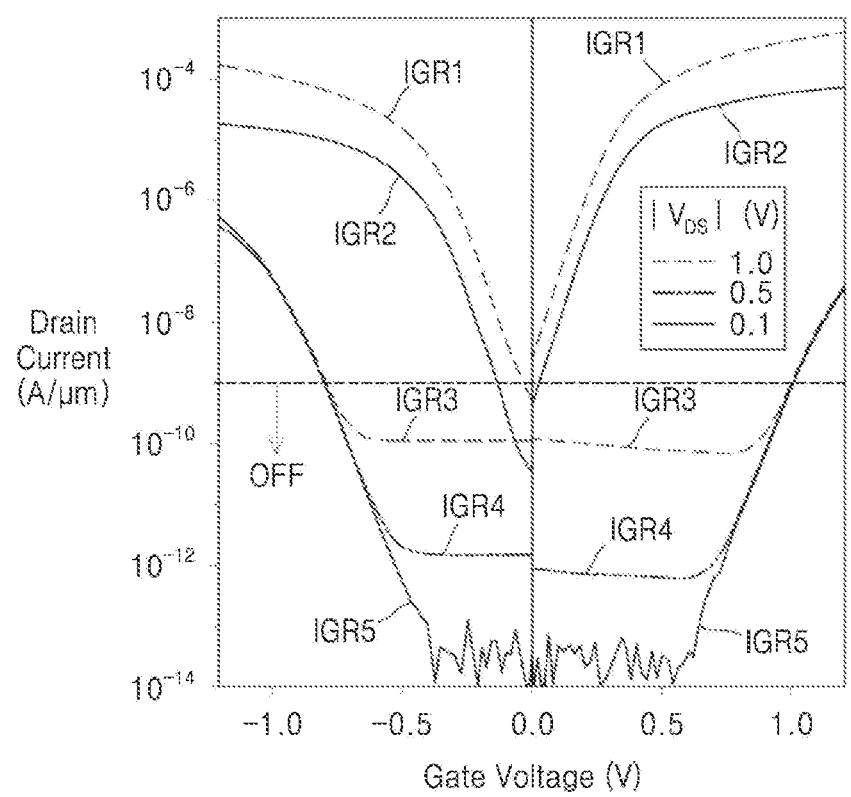
FIG. 23 shows gate voltage-drain current graphs of a ternary inverter and a binary inverter according to an example embodiment.

FIG. 23 shows gate voltage-drain current graphs of a ternary inverter and a binary inverter according to an example embodiment.

FIG. 23 illustrates gate voltage-drain current graphs IGR1 and IGR2 of the binary inverter and gate voltage-drain current graphs IGR3, IGR4, and IGR5 of the ternary inverter. For example, the ternary inverter may be substantially the same as the ternary inverter described with reference to FIG. 22.

Drain currents of the binary inverter art may not have a constant current component flowing regardless of a gate voltage.

Drain currents of the ternary inverter art may have a constant current component flowing regardless of a gate voltage. For example, even when the ternary inverter has an off state, a constant current may flow in ternary inverters.

Figure 24:
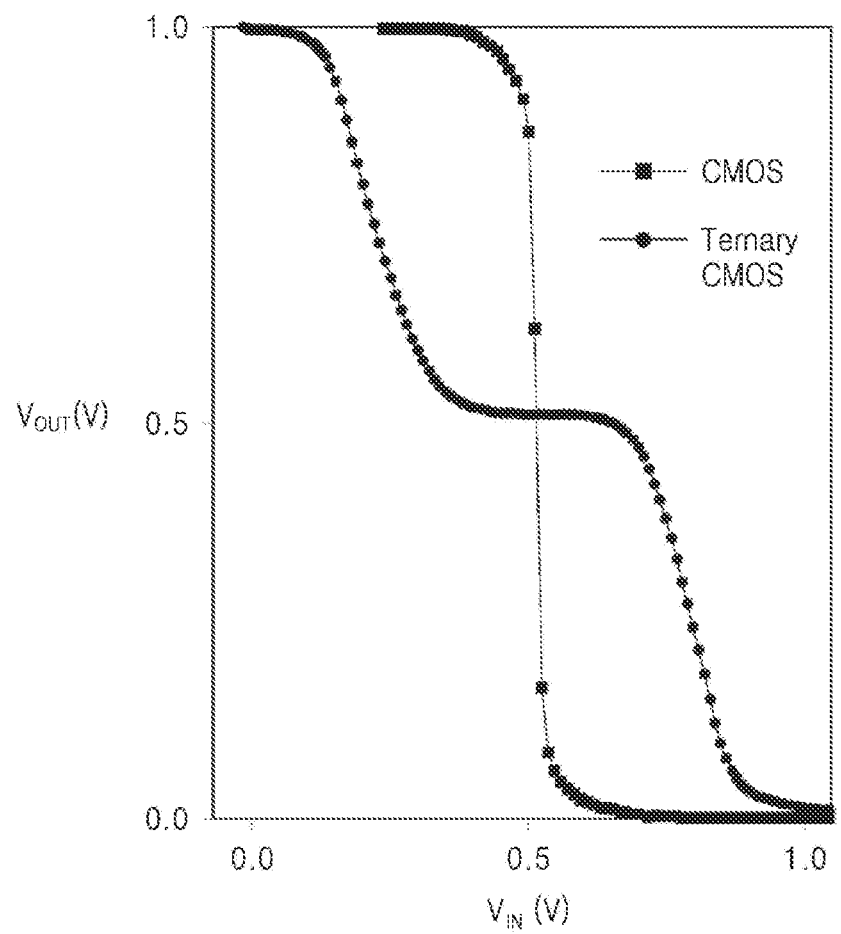
FIG. 24 shows input voltage (Vin)-output voltage (Vout) graphs of a ternary inverter and a binary inverter.

FIG. 24 shows input voltage (Vin)-output voltage (Vout) graphs of a ternary inverter and a binary inverter.

Referring to FIG. 8, the driving voltage $V_{DD}$ of the ternary inverter and the binary inverter may be 1.0V, and the ground voltage GND may be 0V. The input voltage Vin of the ternary inverter and the binary inverter may be 0V through 1.0V. For example, the ternary inverter may be substantially the same as the ternary inverter described with reference to FIG. 22.

In the case of the binary inverter, when the input voltage is changed from 0V to 1V, the output voltage Vout may be drastically decreased from 1V to 0V around the input voltage of about 0.5. That is, the binary inverter may have two states (for example, the state of "0" and the state of "1").

In the case of the ternary inverter according to an embodiment, when the input voltage is changed from 0V to 1V, the output voltage Vout may be drastically decreased from 1V to 0.5V, may be maintained as 0.5V, and may be once again drastically decreased from 0.5V to 0V. That is, the ternary inverter according to an embodiment may have three states (for example, the state of "0," the state of "1," and the state of "2").

Figure 25:
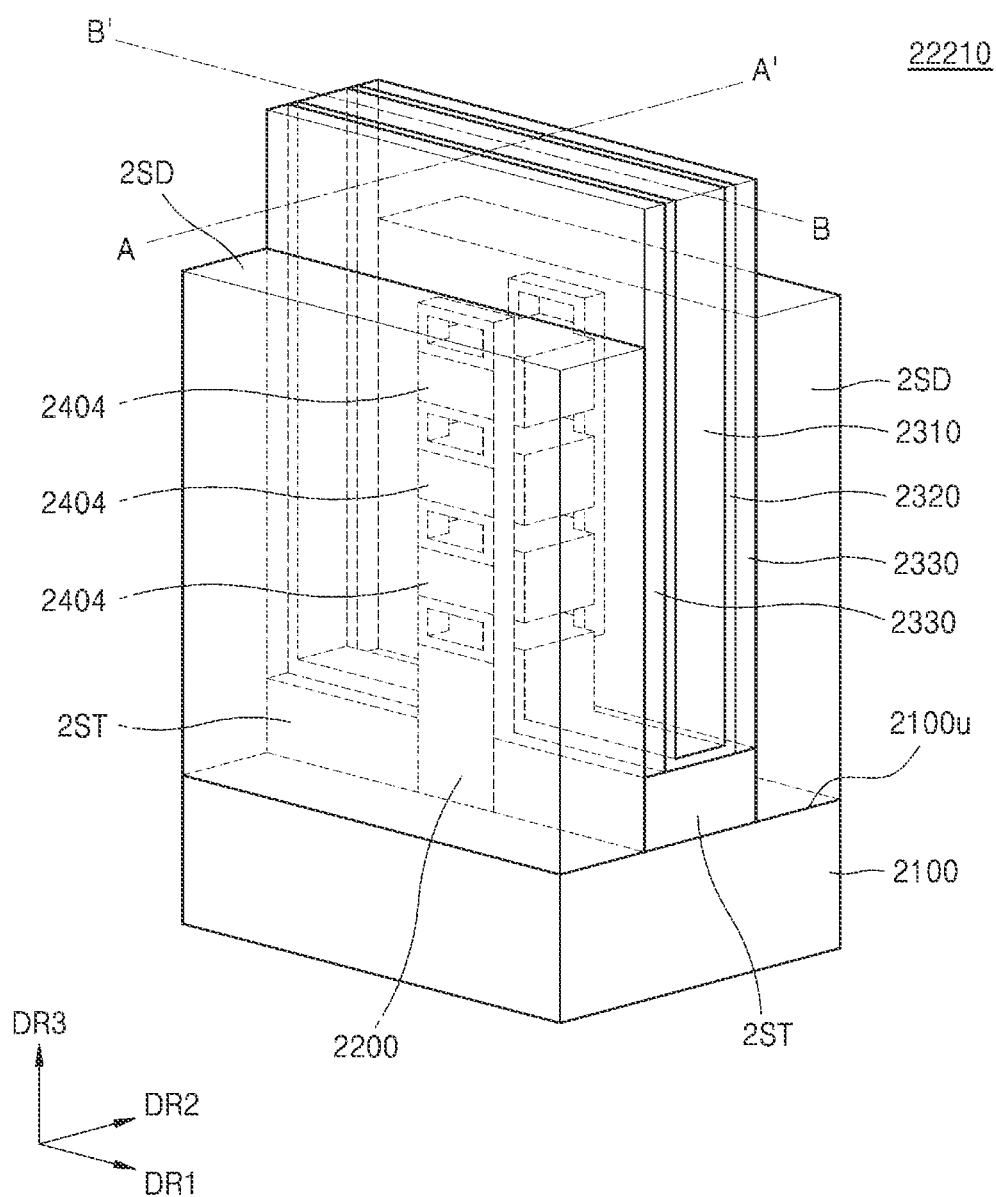
FIG. 25 is a perspective view of a transistor according to example embodiments.
Figure 26:
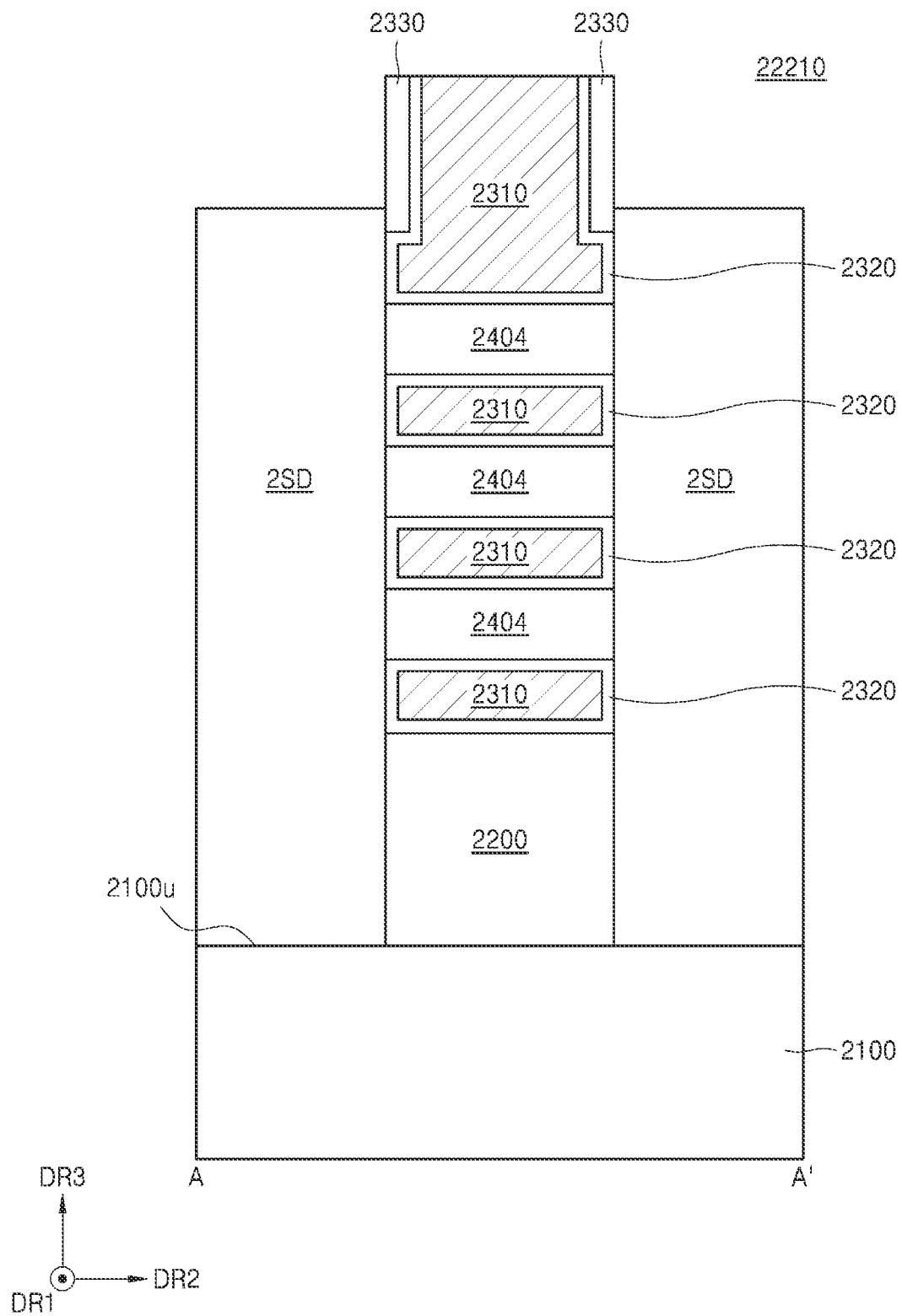
FIG. 26 is a cross-sectional view of the transistor of FIG. 25, taken along a line A-A'.
Figure 27:
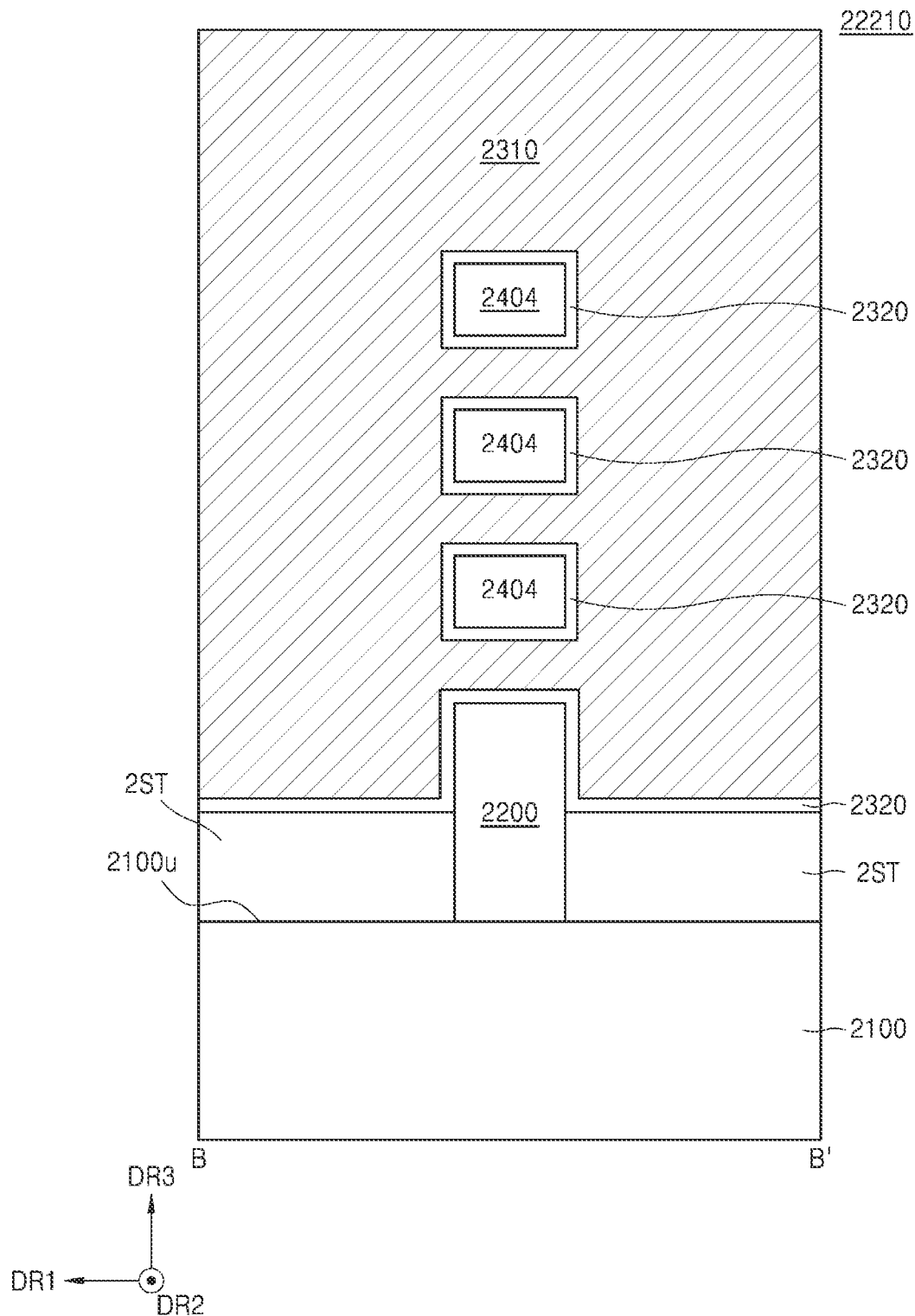
FIG. 27 is a cross-sectional view of the transistor of FIG. 25, taken along a line B-B'.

FIG. 25 is a perspective view of a transistor according to example embodiments. FIG. 26 is a cross-sectional view of the transistor of FIG. 25, taken along a line A-A'. FIG. 27 is a cross-sectional view of the transistor of FIG. 25, taken along a line B-B'.

Referring to FIGS. 25 through 27, a transistor 22210 may be provided. The transistor 22210 may include a substrate 2100, a constant current formation pattern 2200, a pair of device isolation patterns 2ST, a pair of source/drain patterns 2SD, a gate electrode 2310, a gate insulating layer 2320, a pair of gate spacers 2330, and channel patterns 2404.

The substrate 2100 may include a semiconductor substrate. For example, the substrate 2100 may include Si. The substrate 2100 may have a first conductive type. For example, the first conductive type may be an n-type or a p-type. When a conductive type of the substrate 2100 is an n-type, the substrate 2100 may include Group V elements (for example, P and As) as impurities. When a conductive type of the substrate 2100 is a p-type, the substrate 2100 may include Group III elements (for example, B and In) as impurities.

The constant current formation layer 2200 may be provided on the substrate 2100. The constant current formation layer 2200 may include an epitaxial layer formed by an epitaxial growth process. For example, the constant current formation layer 2200 may include Si. The constant current formation layer 2200 may have the first conductive type. When a conductive type of the constant current formation layer 2200 is an n-type, the constant current formation layer 2200 may include Group V elements (for example, P and As) as impurities. When a conductive type of the constant current formation layer 2200 is a p-type, the constant current formation layer 2200 may include Group III elements (for example, B and In) as impurities. A doping concentration of the constant current formation layer 2200 may be higher than a doping concentration of the substrate 2100. For example, the doping concentration of the constant current formation layer 2200 may be greater than or equal to about $3 \times 10^{18}$ cm$^{-3}$.

The pair of device isolation patterns 2ST may be provided on the substrate 2100. The pair of device isolation patterns 2ST may be spaced apart from each other with the constant current formation pattern 2200 therebetween. For example, the pair of device isolation patterns 2ST may be spaced apart from each other in a first direction DR1 that is parallel to an upper surface 100u of the substrate 2100. The pair of device isolation patterns 2ST may extend in the first direction DR1. Side surfaces of the pair of device isolation patterns 2ST and the constant current formation pattern 2200, the side surfaces extending in the first direction DR1, may be co-planar. A width of the pair of device isolation patterns 2ST may be the same as a width of the constant current formation pattern 2200. For example, the width of the pair of device isolation patterns 2ST and the width of the constant current formation pattern 2200 may be sizes of the pair of device isolation patterns 2ST and the constant current formation pattern 2200 in a second direction DR2 intersecting with the first direction DR1 and parallel to the upper surface 100u of the substrate 2100. A thickness of the pair of device isolation patterns 2ST may be less than a thickness of the constant current formation pattern 2200. The thickness of the pair of device isolation patterns 2ST and the thickness of the constant current formation pattern 2200 may be the size of the pair of device isolation patterns 2ST and the thickness of the constant current formation pattern 2200 in a third direction DR3 intersecting with the upper surface 100u of the substrate 2100. For example, the first direction DR1, the second direction DR2, and the third direction DR3 may be perpendicular to one another. An upper surface of the pair of device isolation patterns 2ST may have a lower height than an upper surface of the constant current formation pattern 2200. However, relative heights of the upper surface of the pair of device isolation patterns 2ST and the upper surface of the constant current formation pattern 2200 are not particularly limited. That is, according to another embodiment, the upper surface of the pair of device isolation patterns 2ST may have the same height as the upper surface of the constant current formation pattern 2200 or a greater height than the upper surface of the constant current formation pattern 2200. The constant current formation pattern 2200 may protrude from the upper surfaces of the pair of device isolation patterns 2ST in the third direction DR3. The pair of device isolation patterns 2ST may include an electrically insulating material. For example, the pair of device isolation patterns 2ST may include $SiO_2$.

The pair of source/drain patterns 2SD may be provided on the substrate 2100. For example, the pair of source/drain patterns 2SD may directly contact the substrate 2100. The pair of source/drain patterns 2SD may be spaced apart from each other with the constant current formation pattern 2200 and the pair of device isolation patterns 2ST therebetween. For example, the pair of source/drain patterns 2SD may be spaced apart from each other in the second direction DR2.

The pair of source/drain patterns 2SD may include a doped semiconductor material. For example, the pair of source/drain patterns 2SD may include doped-poly Si. The pair of source/drain patterns 2SD may include epitaxial layers. The pair of source/drain patterns 2SD may have a second conductive type that is different from a first conductive type. When the first conductive type is an n-type, the second conductive type may be a p-type. When a conductive type of the pair of source/drain patterns 2SD is a p-type, the pair of source/drain patterns 2SD may include Group III elements (for example, B and In) as impurities. When the first conductive type is a p-type, the second conductive type may be an n-type. When a conductive type of the pair of source/drain patterns 2SD is an n-type, the pair of source/drain patterns 2SD may include Group V elements (for example, P and As) as impurities. One of the pair of source/drain patterns 2SD may be a source of the transistor 22210, and the other may be a drain of the transistor 22210.

The constant current formation layer 2200 and the pair of source/drain patterns 2SD may be electrically connected to each other. For example, the constant current formation layer 2200 and the pair of source/drain patterns 2SD may directly contact each other. An electric field may be formed between the constant current formation layer 2200 and the pair of source/drain patterns 2SD. For example, an intensity of the electric field may be greater than or equal to about $10^6$ V/cm.

The constant current formation layer 2200 may generate a constant current between any one of the pair of source/drain patterns 2SD, which is a drain, and the constant current formation pattern 2200. The constant current may include a BTBT current between the one of the pair of source/drain patterns 2SD, which is the drain, and the constant current formation pattern 2200. The constant current may be independent from a gate voltage applied to the gate electrode 2310. That is, the constant current may flow regardless of the gate voltage. When the transistor 22210 is an NMOS transistor, the constant current may flow from the one of the pair of source/drain patterns 2SD, which is the drain, to the substrate 2100 through the constant current formation pattern 2200. When the transistor 22210 is a PMOS transistor, the constant current may flow from the substrate 2100 to the one of the pair of source/drain patterns 2SD, which is the drain, through the constant current formation pattern 2200.

The gate electrode 2310 may be provided on the constant current formation pattern 2200 and the pair of device isolation patterns 2ST. The gate electrode 2310 may extend in the first direction DR1. The gate electrode 2310 may be provided between the pair of source/drain patterns 2SD. The gate electrode 2310 may include an electrically conductive material. For example, the gate electrode may include a doped semiconductor material, a metal, an alloy, or a combination thereof. For example, the gate electrode may include doped-poly Si, W, TiN, or a combination thereof.

Each of the pair of gate spacers 2330 may be provided between the gate electrode 2310 and each of the pair of source/drain patterns 2SD. The pair of gate spacers 2330 may be provided on both side surfaces of the gate electrode 2310, respectively. For example, the pair of gate spacers 2330 may directly contact the pair of source/drain patterns 2SD, respectively. The pair of gate spacers 2330 may extend in the third direction DR3. For example, the pair of gate spacers 2330 may extend from a height that is the same as the upper surface 100u of the substrate 2100 to an upper surface of the gate electrode 2310. The pair of gate spacers 2330 may electrically disconnect the gate electrode 2310 from the pair of source/drain patterns 2SD. The gate spacers 2330 may include an electrically insulating material. For example, the pair of gate spacers 2330 may include silicon oxide (that is, $SiO_2$), silicon nitride (that is, SiN), or silicon oxynitride (that is, SION).

The channel patterns 2404 may be provided between the pair of source/drain patterns 2SD. The channel patterns 2404 may extend in the second direction DR2. The channel patterns 2404 may penetrate the gate electrode 2310. The channel patterns 2404 may directly contact the pair of source/drain patterns 2SD. The channel patterns 2404 may include a semiconductor material. For example, the channel patterns 2404 may include Si. The channel patterns 2404 may have the first conductive type. For example, when a conductive type of the channel patterns 2404 is an n-type, the channel patterns 2404 may include Group V elements (for example, P and As) as impurities. When a conductive type of the channel patterns 2404 is a p-type, the channel patterns 2404 may include Group III elements (for example, B and In) as impurities. Three channel patterns 2404 are illustrated. However, it is an example. As another example, the channel patterns 2404 may include more or less than three channel patterns. A channel of the transistor 22210 may be formed in the channel patterns 2404.

The gate insulating layer 2320 may be provided on a surface of the gate electrode 2310. The gate insulating layer 2320 may be provided between the gate electrode 2310 and the channel patterns 2404, between the gate electrode 2310 and the pair of gate spacers 2330, between the gate electrode 2310 and the pair of source/drain patterns 2SD, between the gate electrode 2310 and the constant current formation layer 2200, and between the gate electrode 2310 and the pair of device isolation patterns 2ST. For example, the gate insulating layer 2320 may surround the channel patterns 2404. The gate insulating layer 2320 may separate the gate electrode 2310 from the channel patterns 2404, the pair of gate spacers 2330, the pair of source/drain patterns 2SD, the constant current formation layer 2200, and the pair of device isolation patterns 2ST. The gate insulating layer 2320 may electrically disconnect the gate electrode 2310 from the channel patterns 2404, the pair of source/drain patterns 2SD, and the constant current formation layer 2200. The gate insulating layer 2320 may include an electrically insulating material. For example, the gate insulating layer 2320 may include at least one material selected from silicon oxide, silicon nitride, silicon oxynitride, ONO, or a high-k dielectric material. For example, the gate insulating layer 2320 may include a material having a dielectric constant of about 10 to about 25. For example, the gate insulating layer 2320 may include at least one material selected from HfO, HfSiO, HfON, HfSiON, LaO, LaAlO, ZrO, ZrSiO, ZrON, ZrSiON, TaO, TiO, BaSrTiO, BaTiO, SrTiO, YO, AlO, and PbScTaO.

For example, a threshold voltage of the transistor 22210 may be adjusted by a doping concentration of the channel patterns 2404 and a work function of the gate electrode 2310. For example, the work function of the gate electrode 2310 may be adjusted by using a material of the gate electrode 2310 or by using an additional work function adjustment layer (not shown). For example, the additional work function adjustment layer may be arranged between the gate insulating layer 2320 and the channel patterns 2404.

The gate electrode 2310, the gate insulating layer 2320, and the gate spacers 2330 may be referred to as a gate structure.

The disclosure may provide the gate-all-around-type transistor 22210 having a constant current flowing between the constant current formation pattern 2200 and any one of the pair of source/drain patterns 2SD, which is a drain.

Figure 28:
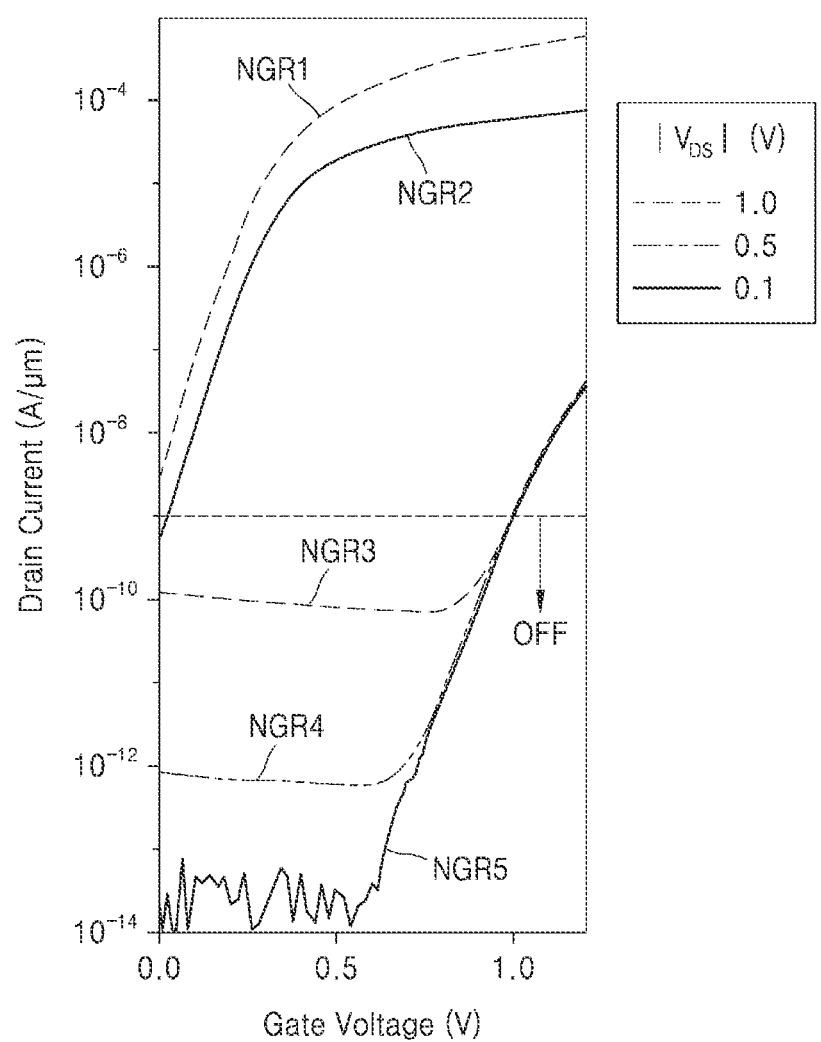
FIG. 28 shows gate voltage-drain current graphs of NMOS transistors according to an embodiment and NMOS transistors according to the related art.

FIG. 28 shows gate voltage-drain current graphs of NMOS transistors according to an embodiment and NMOS transistors according to the related art.

Referring to FIG. 28, gate voltage-drain current graphs NGR1 and NGR2 of the NMOS transistor according to the related art and gate voltage-drain current graphs NGR3, NGR4, and NGR5 of the NMOS transistor according to an embodiment are illustrated.

Drain currents of the NMOS transistors according to the related art may not have a constant current component flowing regardless of a gate voltage.

Drain currents of the NMOS transistors according to an embodiment may have a constant current component flowing regardless of a gate voltage. For example, even when the NMOS transistors according to an embodiment are in an off state, a constant current may flow in the NMOS transistors according to an embodiment.

Figure 29:
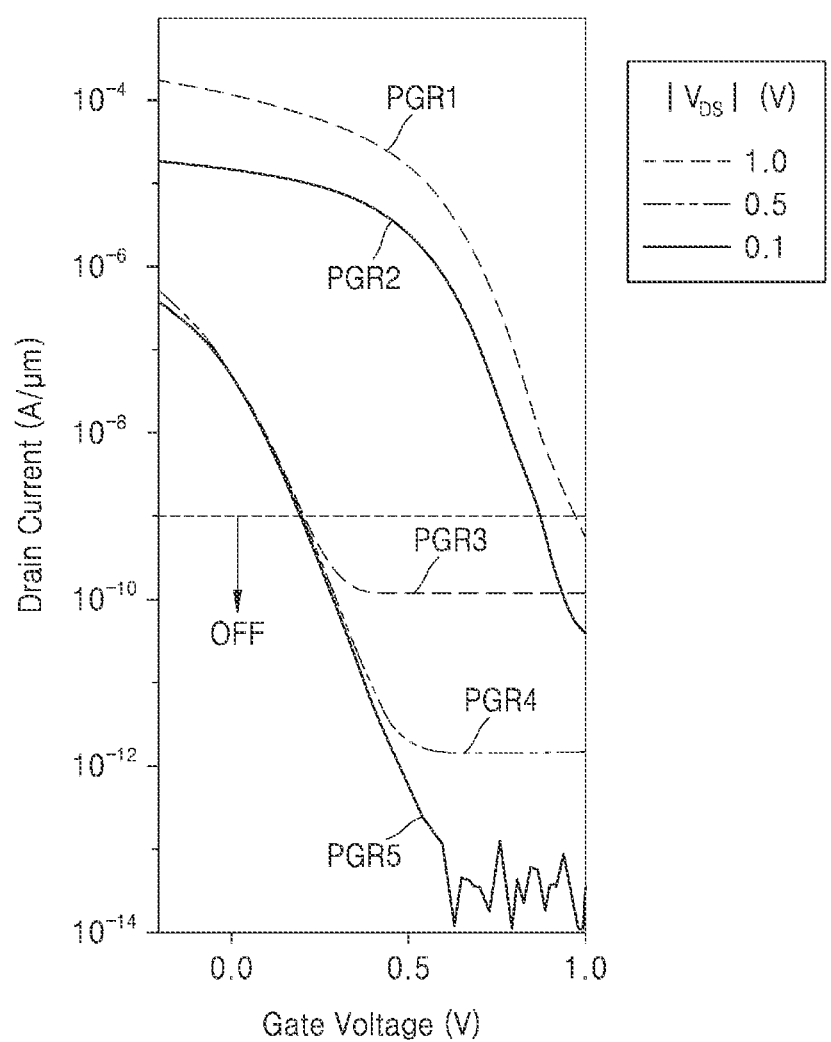
FIG. 29 shows gate voltage-drain current graphs of PMOS transistors according to an embodiment and PMOS transistors according to the related art.

FIG. 29 shows gate voltage-drain current graphs of PMOS transistors according to an embodiment and PMOS transistors according to the related art.

Referring to FIG. 29, gate voltage-drain current graphs PGR1 and PGR2 of the PMOS transistor according to the related art and gate voltage-drain current graphs PGR3, PGR4, and PGR5 of the PMOS transistor according to an embodiment are illustrated.

Drain currents of the PMOS transistors according to the related art may not have a constant current component flowing regardless of a gate voltage.

Drain currents of the PMOS transistors according to an embodiment may have a constant current component flowing regardless of a gate voltage. For example, even when the PMOS transistors according to an embodiment are in an off state, a constant current may flow in the PMOS transistors according to an embodiment.

FIGS. 30 through 35, 38, 41, and 44 are perspective views for describing a method of manufacturing the transistor of FIGS. 25 through 27. FIGS. 36, 39, 42, and 45 are cross-sectional views of the transistor of FIGS. 35, 38, 41, and 44, respectively, taken along a line A-A'. FIGS. 37, 40, 43, and 46 are cross-sectional views of the transistor of FIGS. 35, 38, 41, and 44, respectively, taken along a line B-B'.

Figure 30:
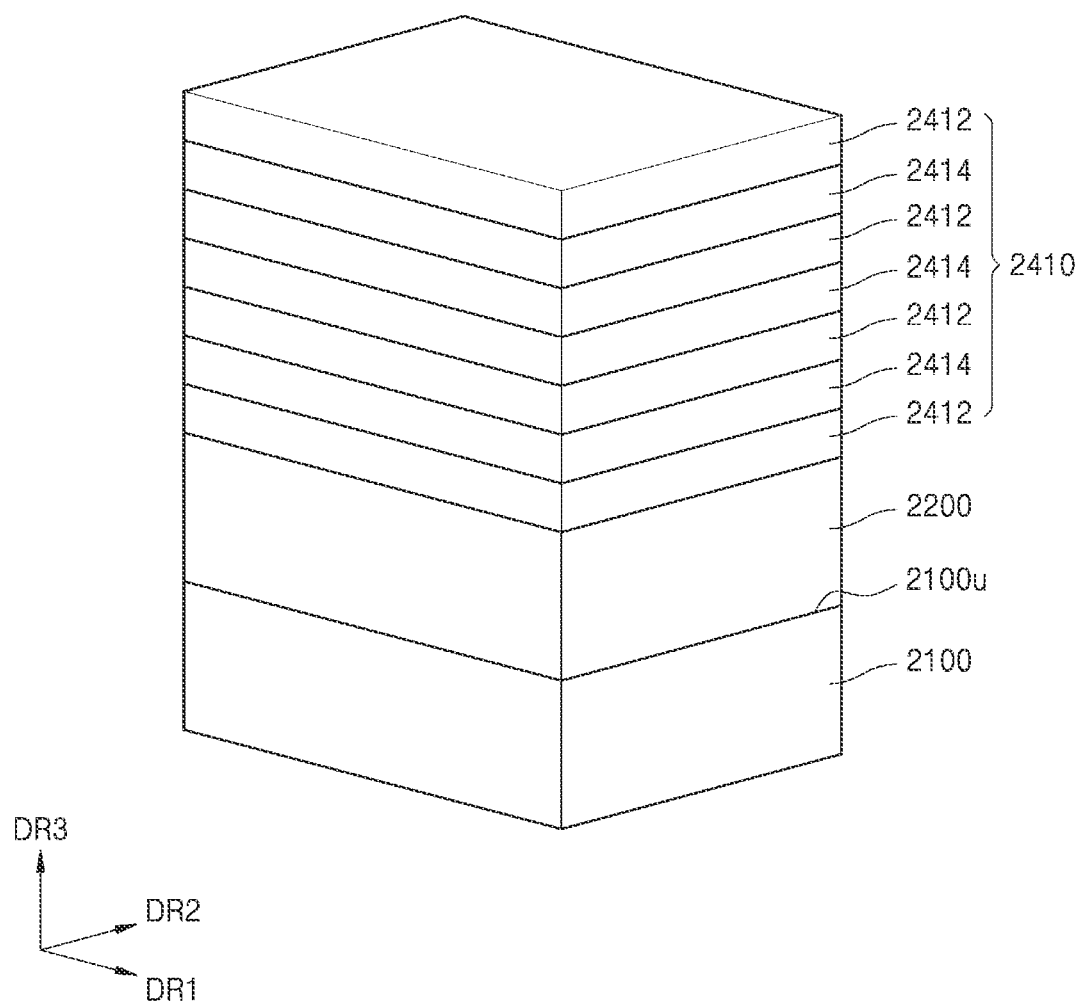
FIGS. 30 through 35, 38, 41, and 44 are perspective views for describing a method of manufacturing the transistor of FIGS. 25 through 27.

Referring to FIG. 30, a constant current formation layer 2202 may be formed on the substrate 2100. For example, the constant current formation layer 2202 may be formed by an epitaxial growth process. That is, the constant current formation layer 2202 may include an epitaxial layer. The constant current formation layer 2202 may include a semiconductor layer having a first conductive type. For example, when a conductive type of the constant current formation layer 2202 is an n-type, the constant current formation layer 2202 may include a silicon layer including Group V elements (for example, P and As) as impurities. When a conductive type of the constant current formation layer 2202 is a p-type, the constant current formation layer 2202 may include a silicon layer including Group III elements (for example, B and In) as impurities. A doping concentration of the constant current formation layer 2202 may be higher than a doping concentration of the substrate 2100. For example, the doping concentration of the constant current formation layer 2202 may be greater than or equal to about $3 \times 10^{18}$ cm$^{-3}$.

A stack layer 2410 may be formed on the constant current formation layer 2202. The stack layer 2410 may be formed by alternately stacking sacrificial layers 2412 and channel layers 2414. The sacrificial layers 2412 and the channel layers 2414 may include materials having different etch selectivities from each other. For example, the sacrificial layers 2412 may include SiGe, and the channel layers 2414 may include Si. For example, the sacrificial layers 2412 may include Si, and the channel layers 2414 may include SiGe. However, in this specification, an embodiment in which the sacrificial layers 2412 may include SiGe, and the channel layers 2414 may include Si is described. The forming of the stack layer 2410 may include performing a CVD process, a PVD process, or an ALD process.

Figure 31:
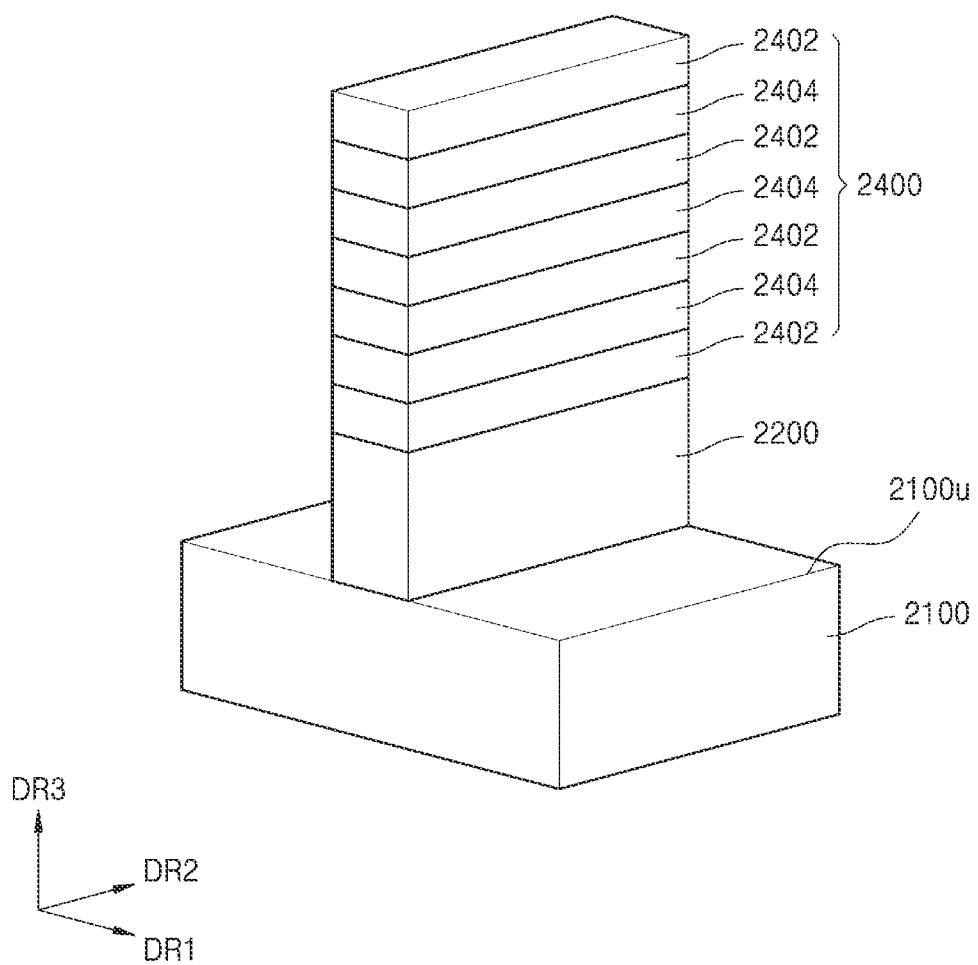

Referring to FIG. 31, a stack pattern 2400 and a constant current formation pattern 2200 may be formed. The forming of the stack pattern 2400 and the constant current formation pattern 2200 may include patterning the stack layer 2410 and the constant current formation layer 2202. For example, the stack layer 2410 and the constant current formation layer 2202 may be etched by an anisotropic etching process using an etch mask (not shown) provided on the stack layer 2410. The patterning of the stack layer 2410 may be performed until the upper surface 100u of the substrate 2100 is exposed. The etch mask may be removed during or after the etching process. The constant current formation pattern 2200 and the stack pattern 2400 may extend in the second direction DR2. The stack pattern 2400 may include sacrificial patterns 2402 and channel patterns 2404 alternately stacked. The sacrificial patterns 2402 may be formed by etching the sacrificial layers 2412. The channel patterns 2404 may be formed by etching the channel layers 2414. The constant current formation pattern 2200 may be formed between the lowermost sacrificial pattern 2402 and the substrate 2100.

Figure 32:
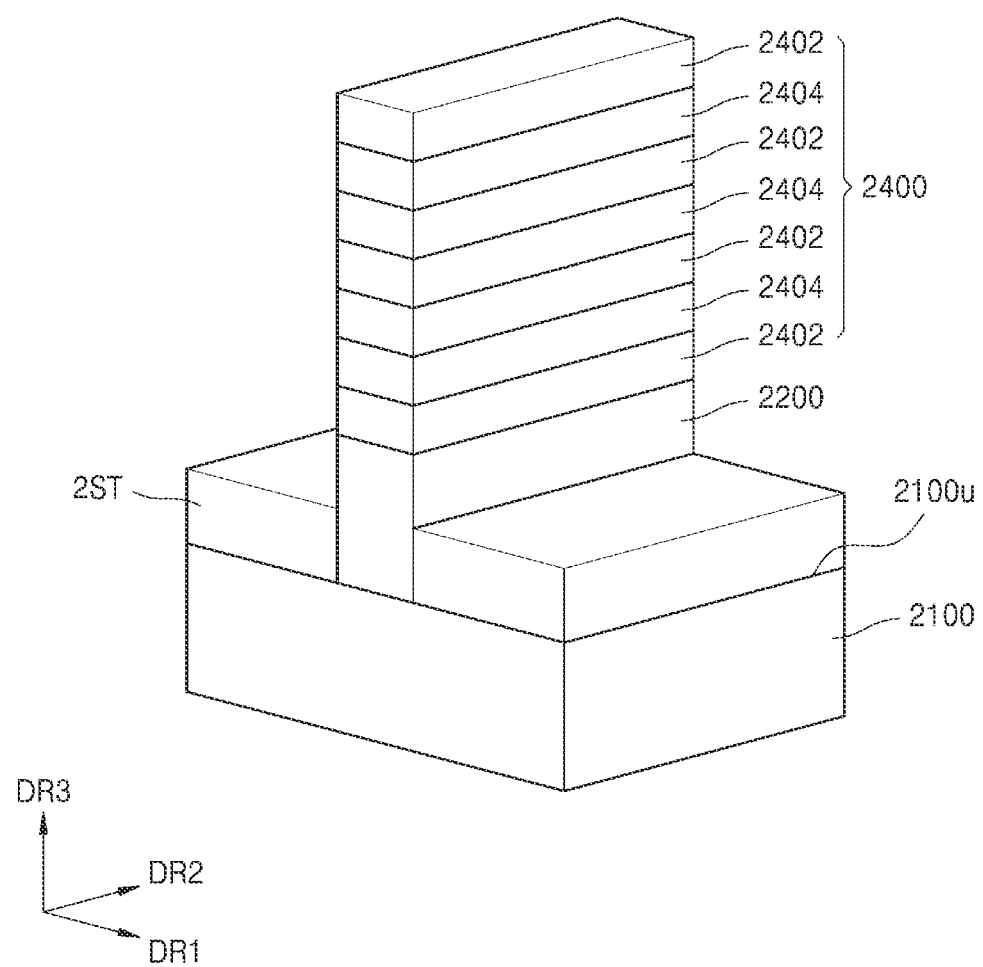

Referring to FIG. 32, the pair of device isolation patterns 2ST may be formed on the substrate 2100. The pair of device isolation patterns 2ST may be spaced apart from each other with the constant current formation pattern 2200 therebetween. For example, the pair of device isolation patterns 2ST may be spaced apart from each other in the first direction DR1. The forming of the pair of device isolation patterns 2ST may include depositing an electrically insulating material on the upper surface 100u of the substrate 2100, the upper surface 100u being exposed to the constant current formation pattern 2200. For example, the electrically insulating material may include SiO$_2$. The electrically insulating material may be deposited to a height that is less than an upper surface of the constant current formation pattern 2200. An upper surface of the pair of device isolation patterns 2ST may be lower than an upper surface of the constant current formation pattern 2200. A thickness of the pair of device isolation patterns 2ST may be less than a thickness of the constant current formation pattern 2200.

Figure 33:
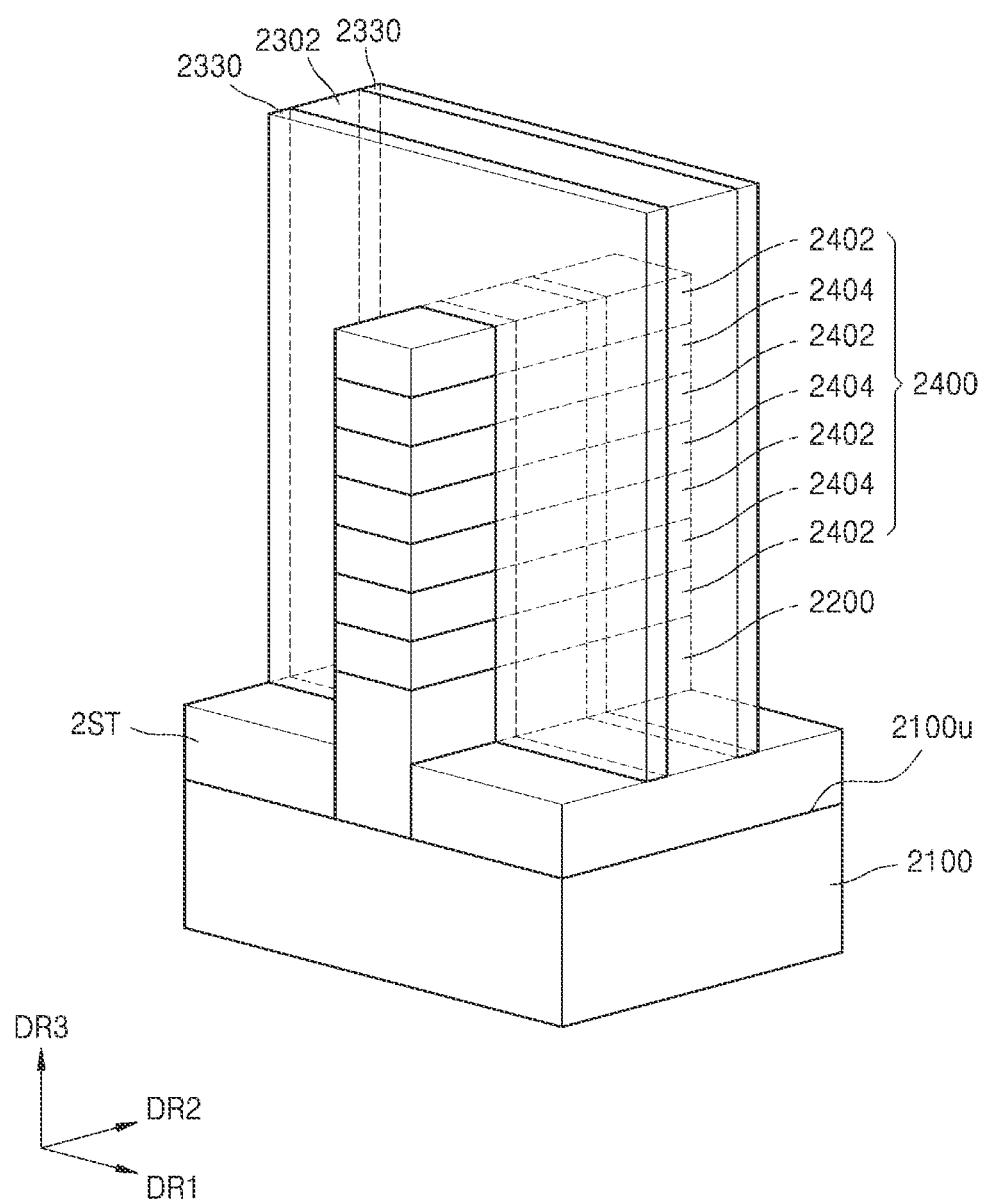

Referring to FIG. 33, a dummy gate pattern 2302 and a pair of gate spacers 2330 may be formed on the substrate 2100. The dummy gate pattern 2302 may extend in the first direction DR1. The dummy gate pattern 2302 may intersect with the constant current formation pattern 2200 and the stack pattern 2400. A portion of the constant current formation pattern 2200, the portion protruding onto the pair of device isolation patterns 2ST, may intersect with the dummy gate pattern 2302. The dummy gate pattern 2302 may be formed on the constant current formation pattern 2200, the stack pattern 2400, and the pair of device isolation patterns 2ST. The constant current formation pattern 2200, the stack pattern 2400, and the pair of device isolation patterns 2ST may be arranged between the dummy gate pattern 2302 and the substrate 2100. The stack pattern 2400, the constant current formation pattern 2200, and the pair of device isolation patterns 2ST may be exposed to both side surfaces of the dummy gate pattern 2302. The both side surfaces of the dummy gate pattern 2302 may be arranged on the opposite sides in the second direction DR2. The dummy gate pattern 2302 may have a higher etch selectivity than the pair of gate spacers 2330. For example, the dummy gate pattern 2302 may include silicon nitride (that is, SiN). For example, the forming of the dummy gate pattern 2302 may include forming a dummy gate layer (not shown) covering the constant current formation pattern 2200 and the stack pattern 2400 and patterning the dummy gate layer. The patterning of the dummy gate layer may be performed until an upper surface of the pair of device isolation patterns 2ST is exposed.

The pair of gate spacers 2330 may be provided on the both side surfaces of the dummy gate pattern 2302. The pair of gate spacers 2330 may cover the both side surfaces of the dummy gate pattern 2302. The pair of gate spacers 2330 may cover the stack pattern 2400, the constant current formation pattern 2200, and the pair of device isolation patterns 2ST exposed to the both side surfaces of the dummy gate pattern 2302. The pair of gate spacers 2330 may have a lower etch selectivity than the dummy gate pattern 2302. For example, the pair of gate spacers 2330 may include silicon oxide (that is, $SiO_2$). The forming of the pair of gate spacers 2330 may include forming a preliminary gate spacer layer (not shown) on the dummy gate pattern 2302, the stack pattern 2400, the constant current formation pattern 2200, and the pair of device isolation patterns 2ST and etching the preliminary gate spacer layer. For example, the etching of the preliminary gate spacer layer may include an anisotropic dry etching process. The etching of the preliminary gate spacer layer may be performed until the stack pattern 2400, the constant current formation pattern 2200, and the pair of device isolation patterns 2ST are exposed.

Figure 34:
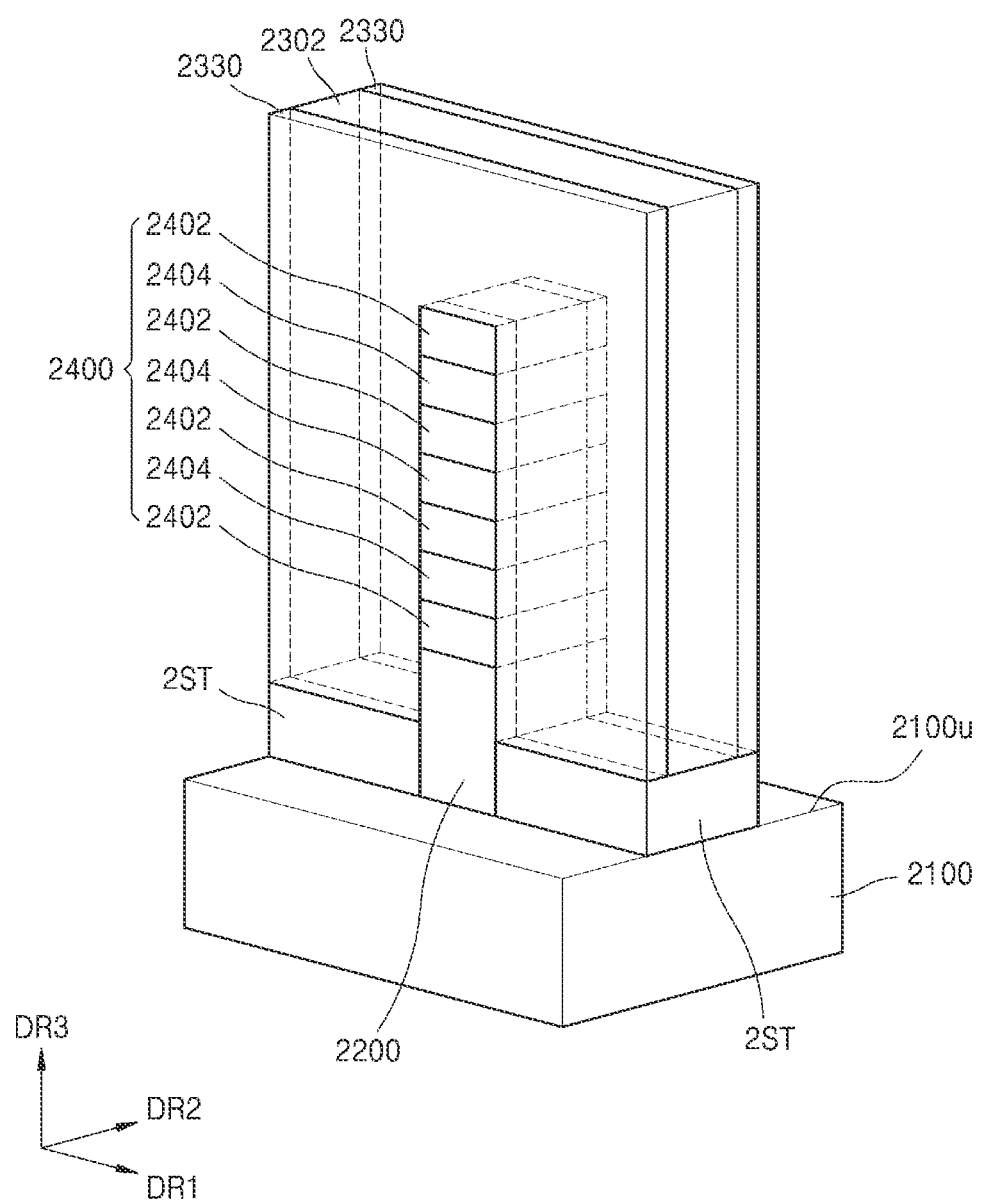

Referring to FIG. 34, the stack pattern 2400, the constant current formation pattern 2200, and the pair of device isolation patterns 2ST exposed to the pair of gate spacers 2330 and the dummy gate pattern 2302 may be removed. The removing of the stack pattern 2400, the constant current formation pattern 2200, and the pair of device isolation patterns 2ST may include performing an anisotropic etching process using an etch mask (not shown). The anisotropic etching process may be performed until the substrate 2100 is exposed. The etch mask may be removed during or after the etching process.

Figure 35:
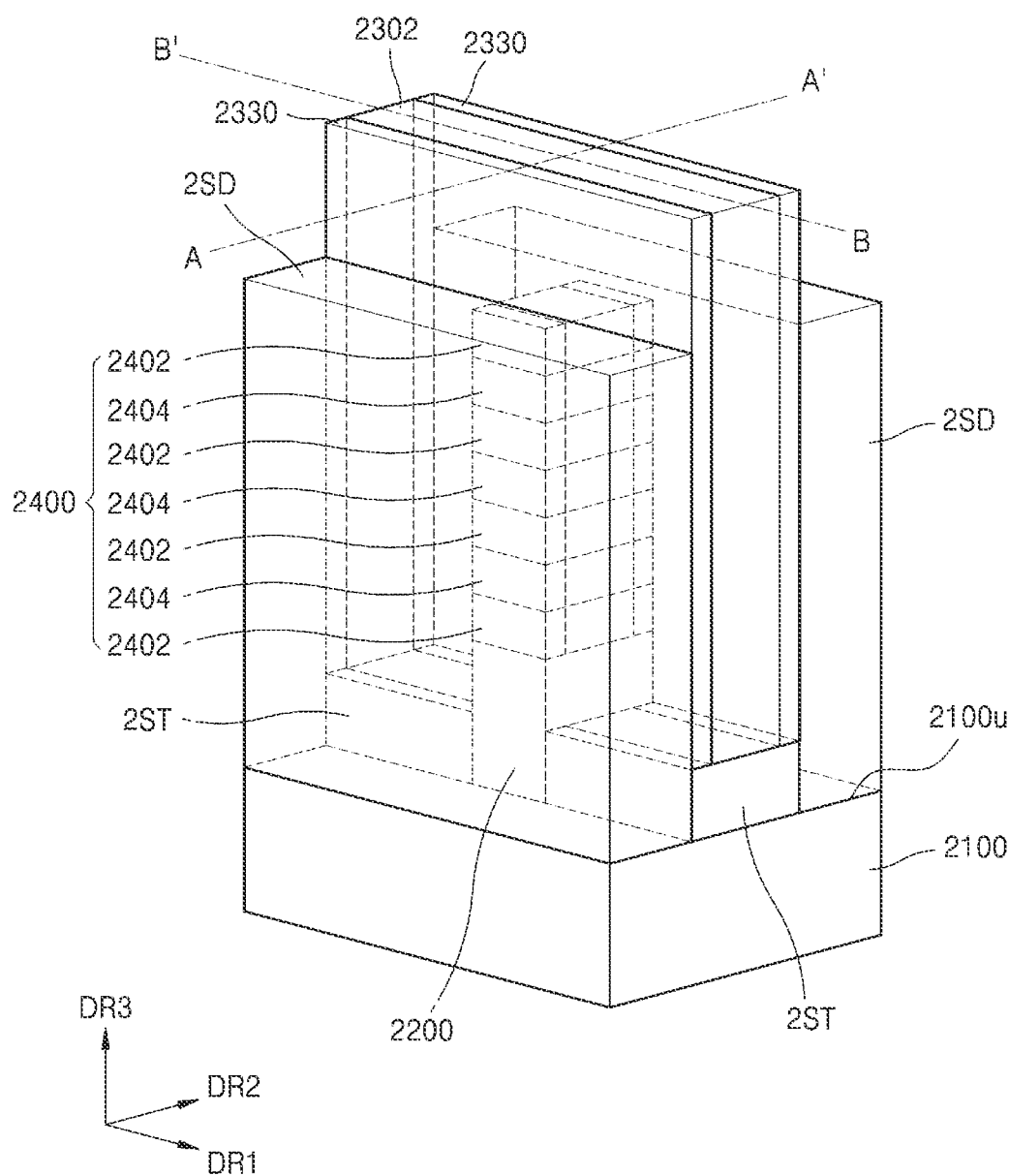
Figure 36:
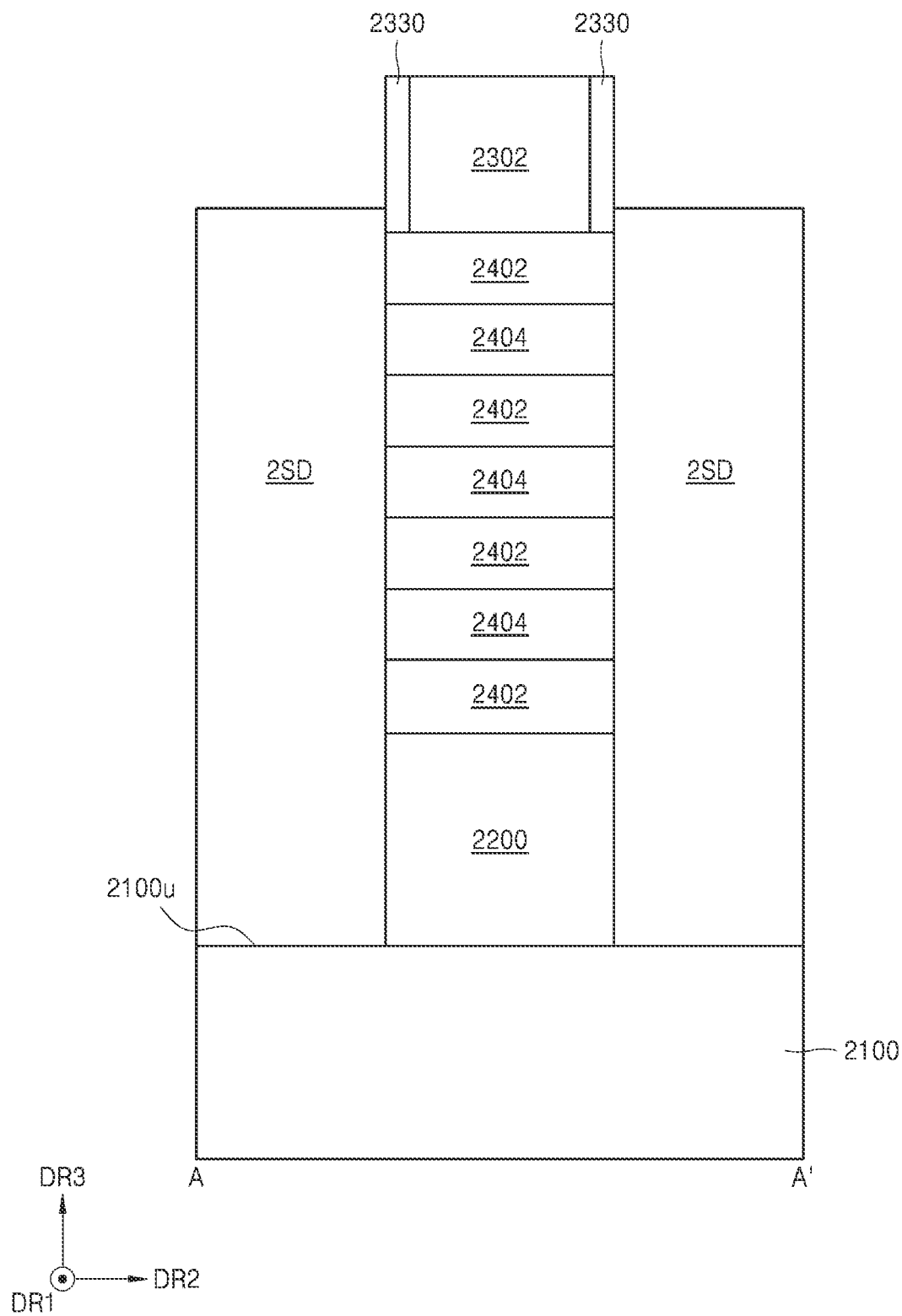
FIGS. 36, 39, 42, and 45 are cross-sectional views of the transistor of FIGS. 35, 38, 41, and 44, respectively, taken along a line A-A'.
Figure 37:
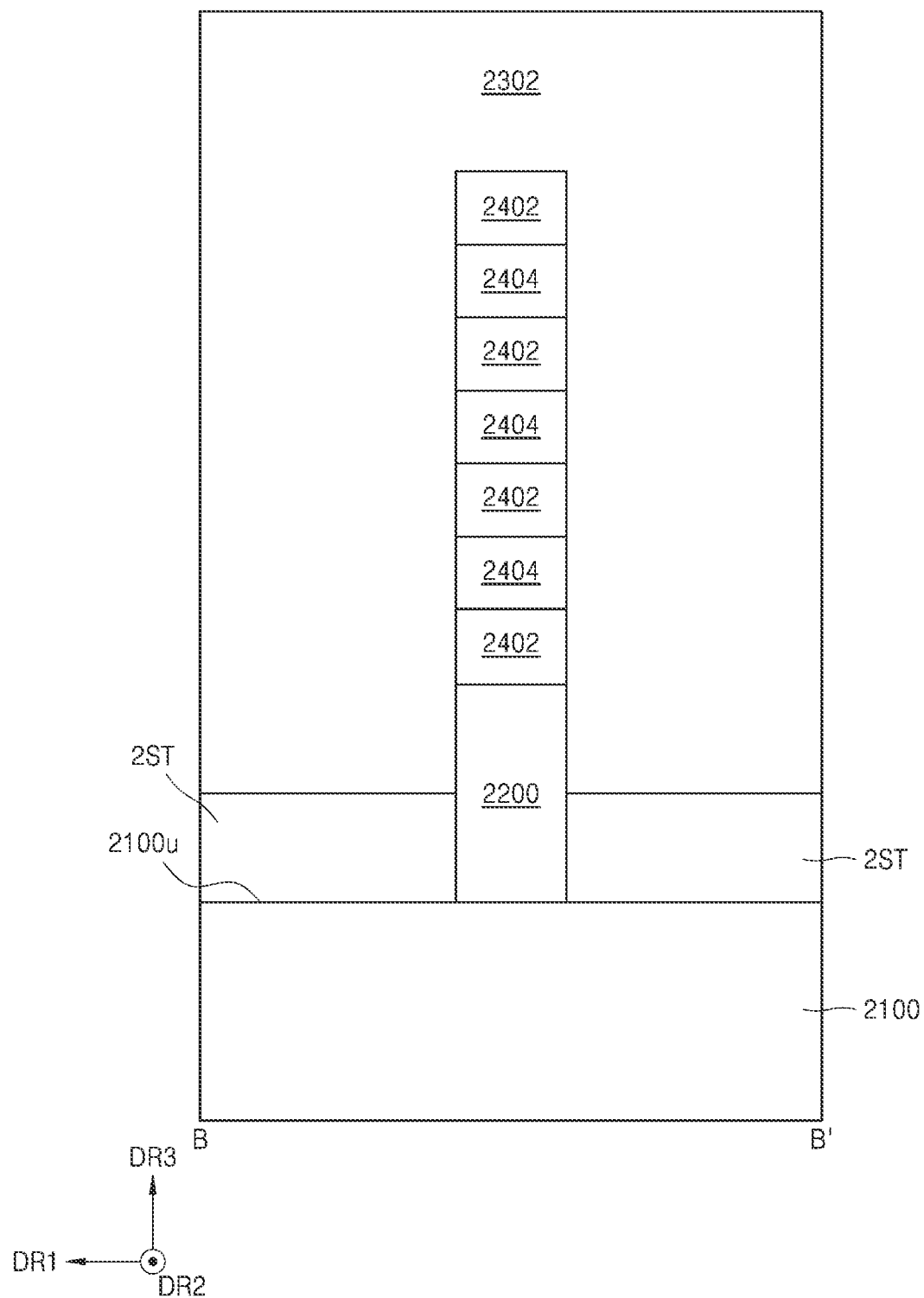
FIGS. 37, 40, 43, and 46 are cross-sectional views of the transistor of FIGS. 35, 38, 41, and 44, respectively, taken along a line B-B'.

Referring to FIGS. 35 through 37, the pair of source/drain patterns 2SD may be formed on the substrate 2100. The pair of source/drain patterns 2SD may be formed on sides of the pair of gate spacers 2330, respectively, the sides each being opposite to the dummy gate pattern 2302. The pair of source/drain patterns 2SD may be formed in an area from which the stack pattern 2400, the constant current formation pattern 2200, and the pair of device isolation patterns 2ST exposed to the pair of gate spacers 2330 and the dummy gate pattern 2302 may be removed. The forming of the pair of source/drain patterns 2SD may include an epitaxial growth process. The pair of source/drain patterns 2SD may include a doped semiconductor material. For example, the pair of source/drain patterns 2SD may include doped-poly Si. The pair of source/drain patterns 2SD may have a second conductive type. When a conductive type of the pair of source/drain patterns 2SD is a p-type, the pair of source/drain patterns 2SD may include Group III elements (for example, B and In) as impurities. When a conductive type of the pair of source/drain patterns 2SD is an n-type, the pair of source/drain patterns 2SD may include Group V elements (for example, P and As) as impurities.

Figure 38:
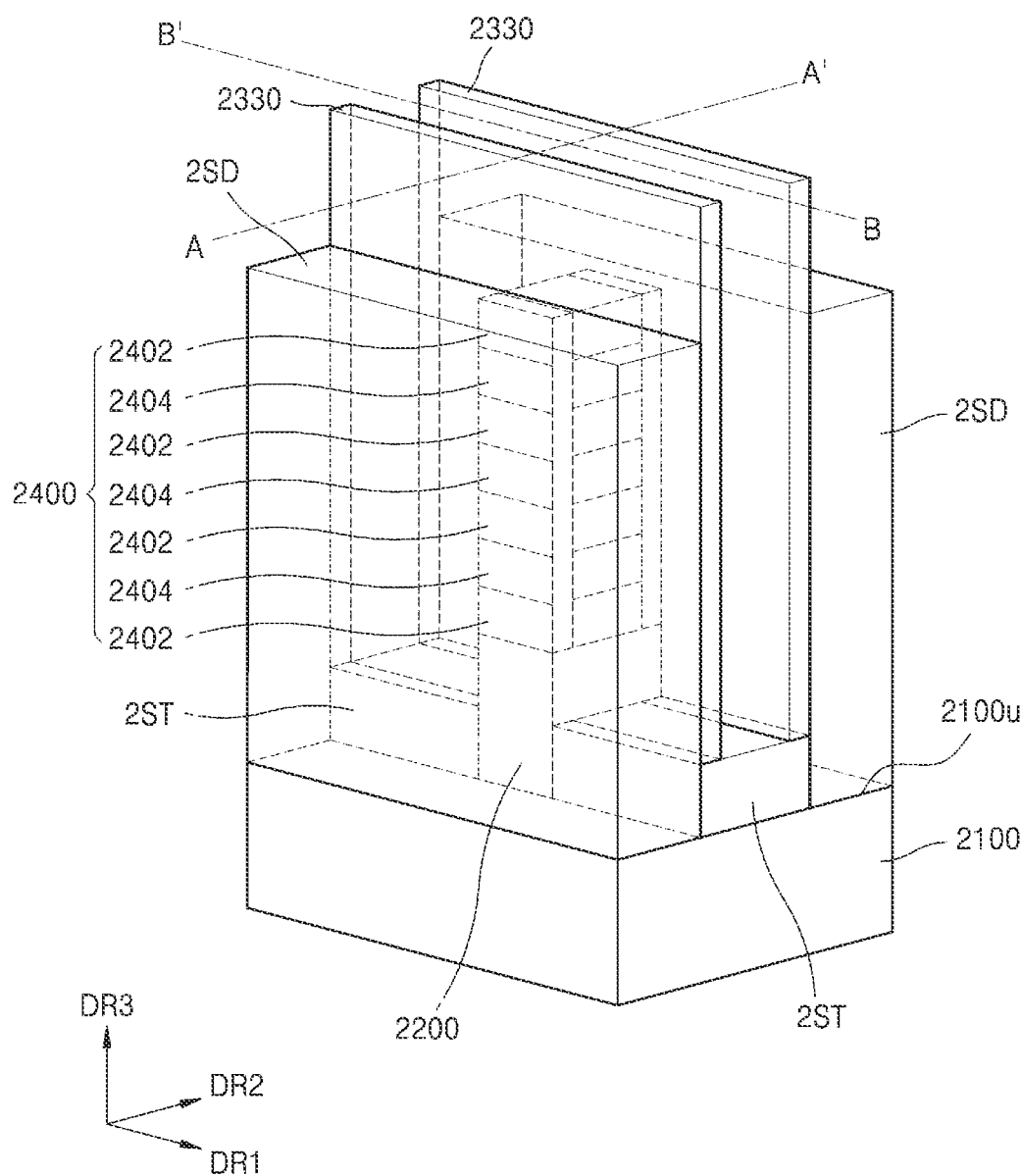
Figure 39:
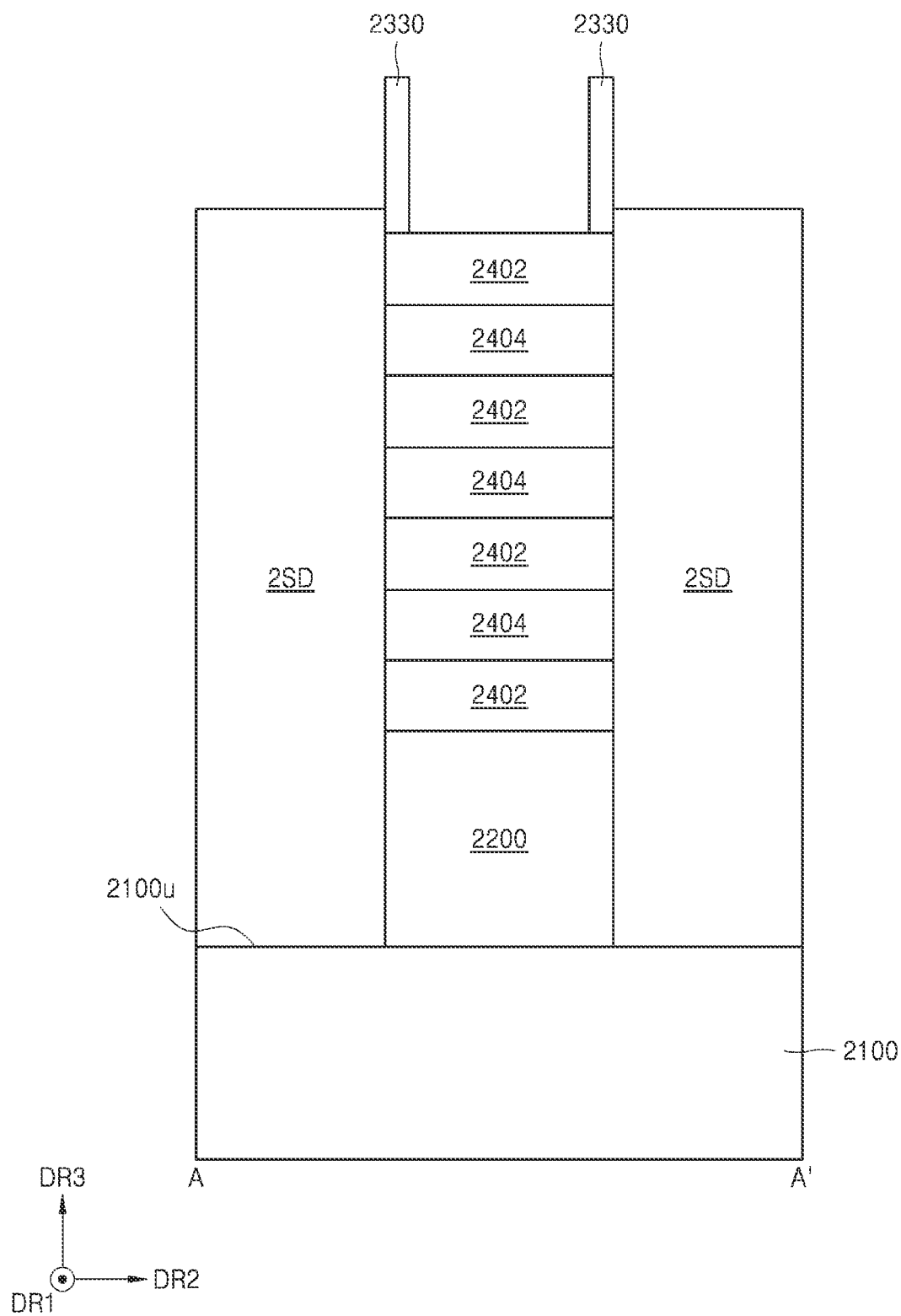
Figure 40:
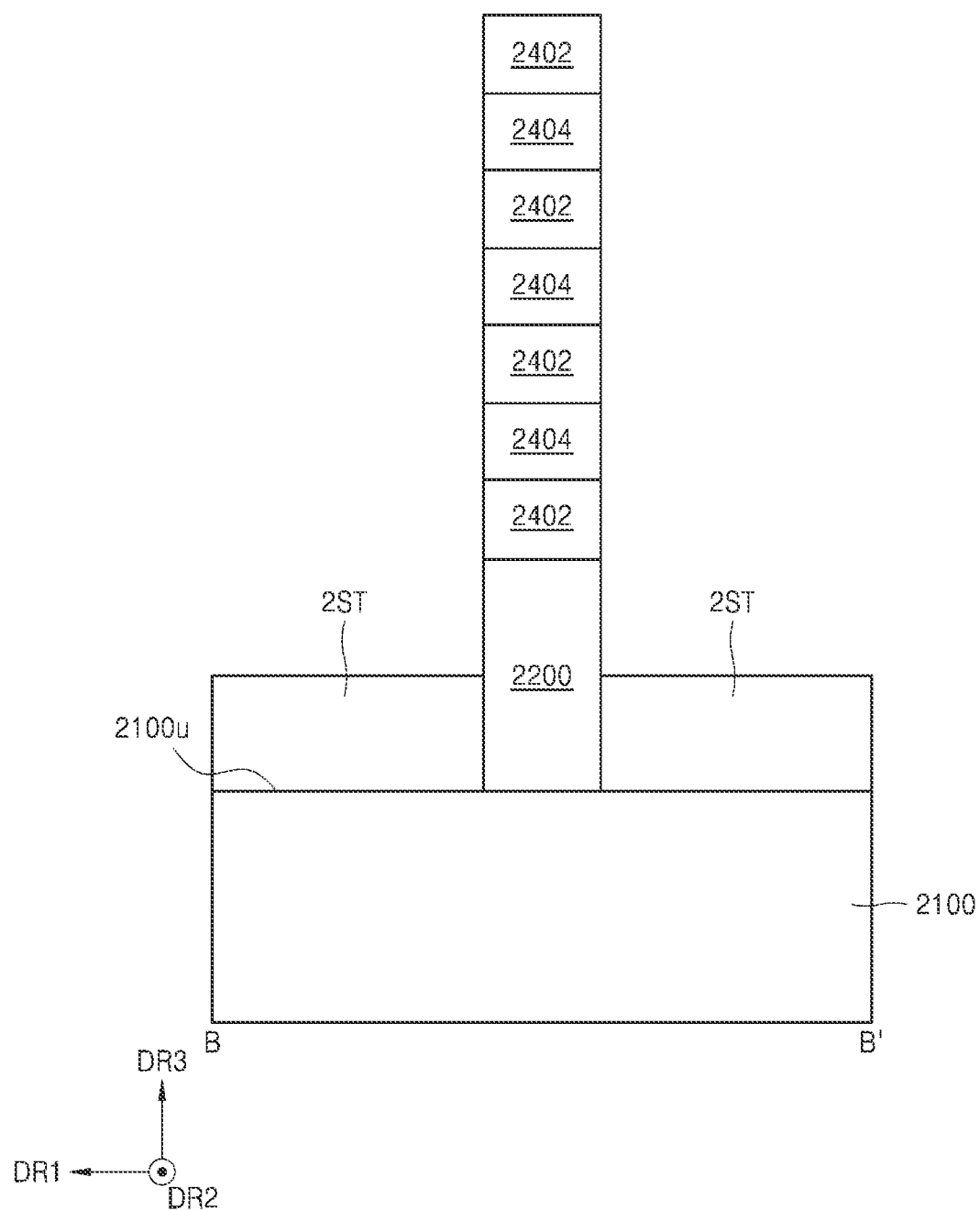

Referring to FIGS. 38 through 40, the dummy gate pattern 2302 may be removed. For example, the removing of the dummy gate pattern 2302 may include a wet etching process. For example, an etchant may include a hydrofluoric-based material. By removing the dummy gate pattern 2302, surfaces of the stack pattern 2400, the pair of gate spacers 2330, the constant current formation layer 2200, and the pair of device isolation patterns 2ST may be exposed between the pair of gate spacers 2330.

Figure 41:
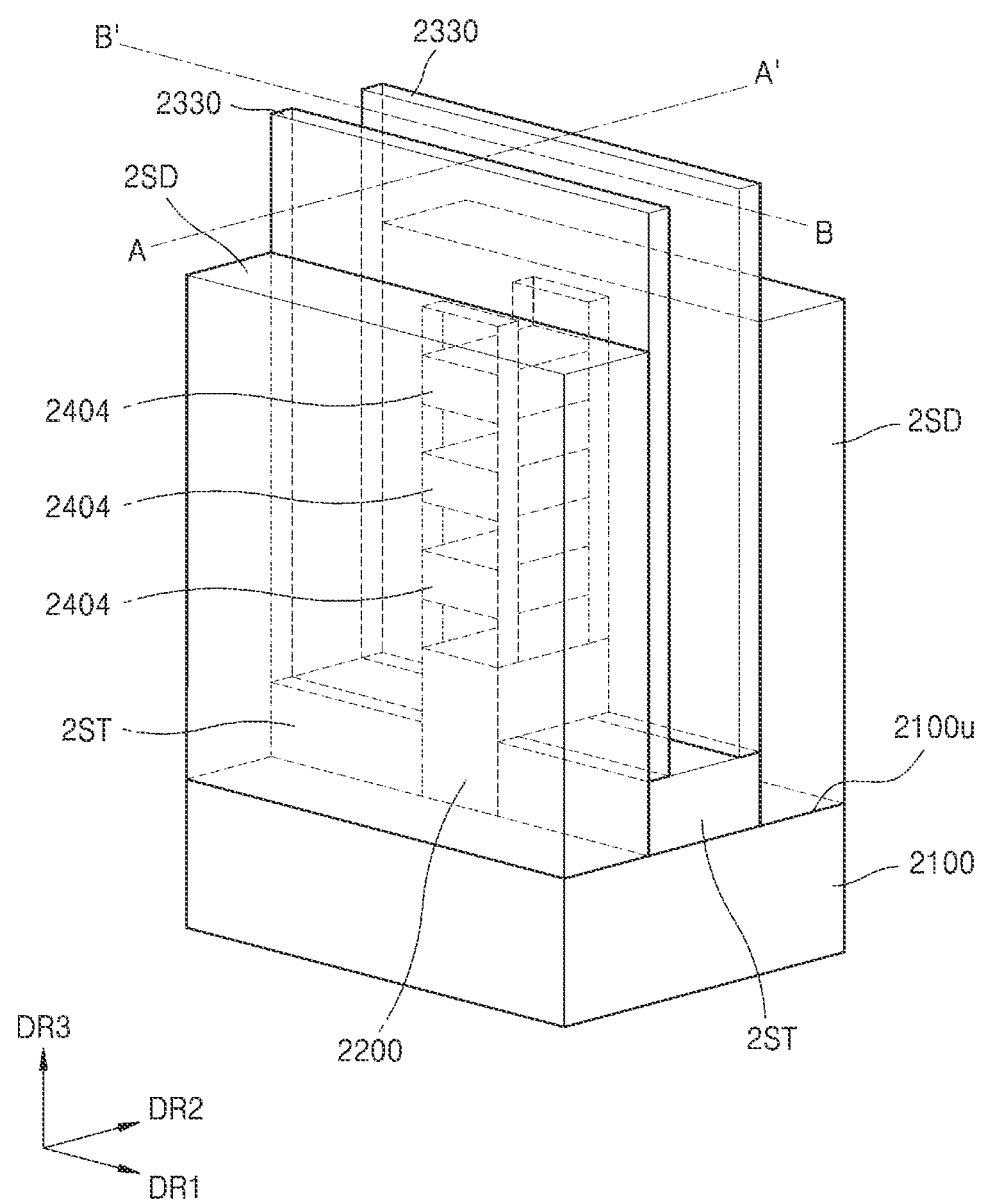
Figure 42:
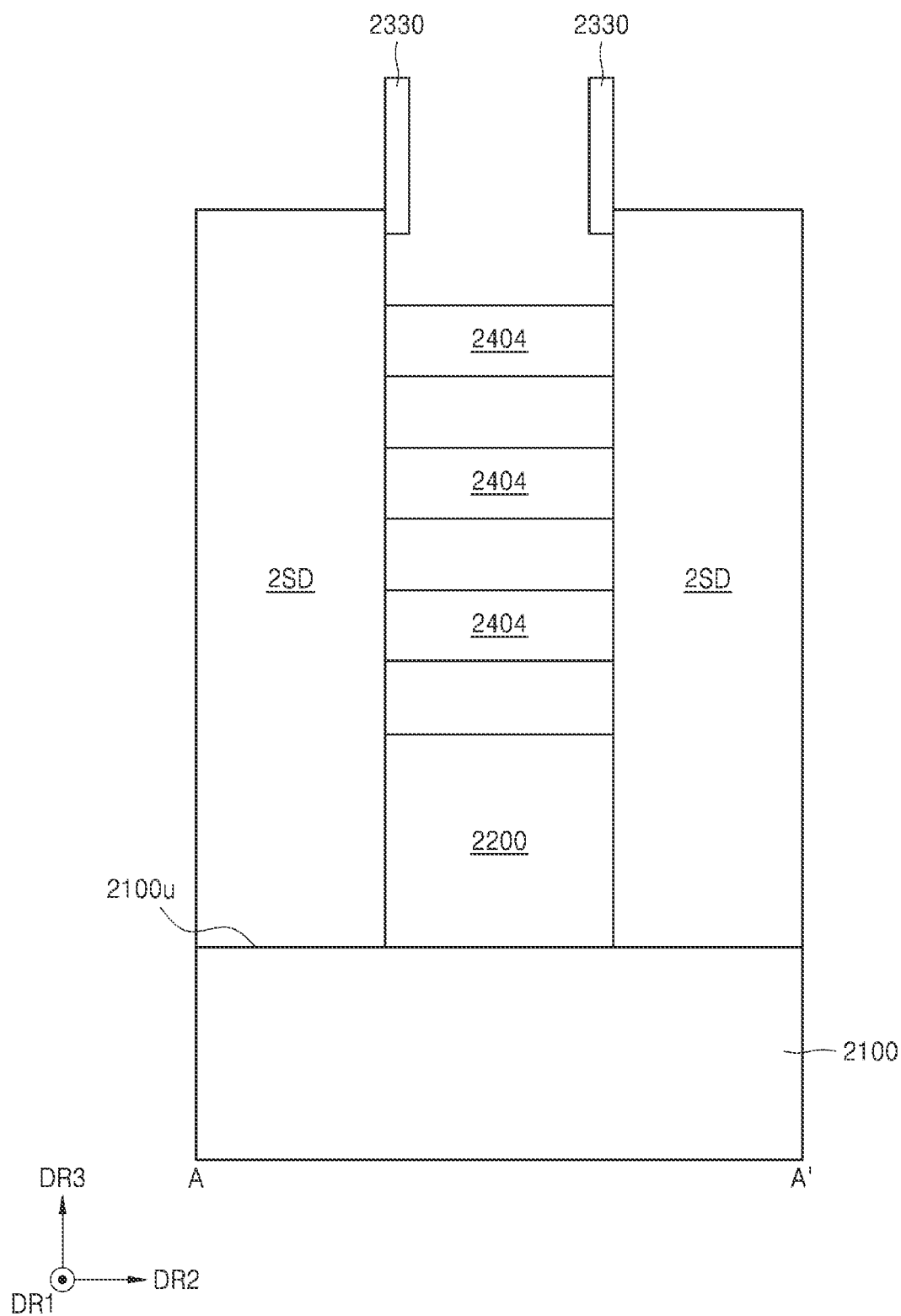
Figure 43:
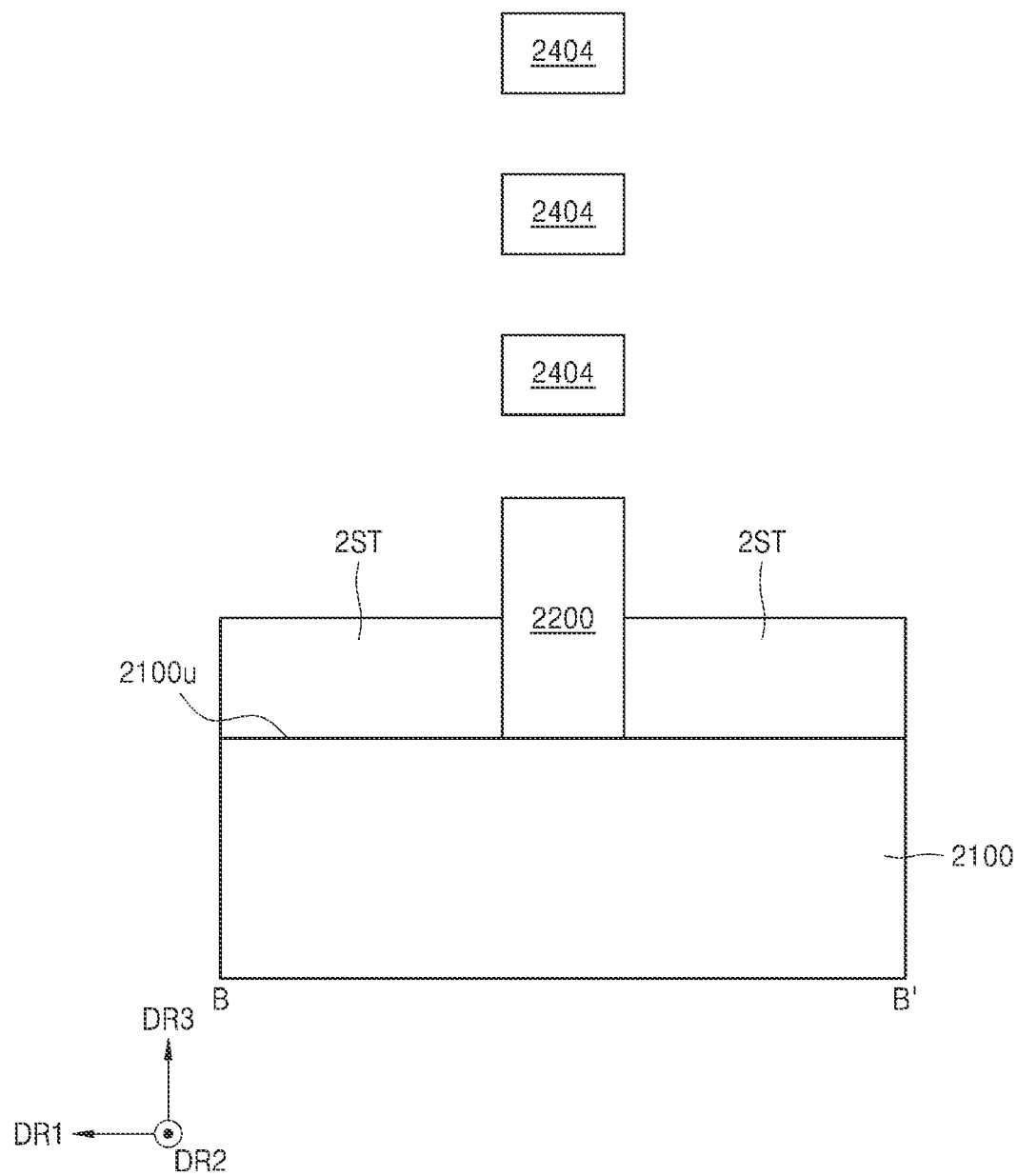

Referring to FIGS. 41 through 43, the sacrificial patterns 2402 may be selectively removed. The removing of the sacrificial patterns 2402 may include performing a chemical dry etching process or a wet etching process on the sacrificial patterns 2402. For example, the chemical dry etching process may use a plasma generated by a radical generator. For example, the wet etching process may include a wet etching process using an ammonia-peroxidation mixture. In the mixture, $H_2O_2$ may serve as an oxidizer, and $NH_4OH$ may serve as an oxide etchant. By removing the sacrificial patterns 2402, surfaces of the pair of source/drain patterns 2SD, the channel patterns 2404, and the pair of gate spacers 2330 may be exposed between the pair of source/drain patterns 2SD.

Figure 44:
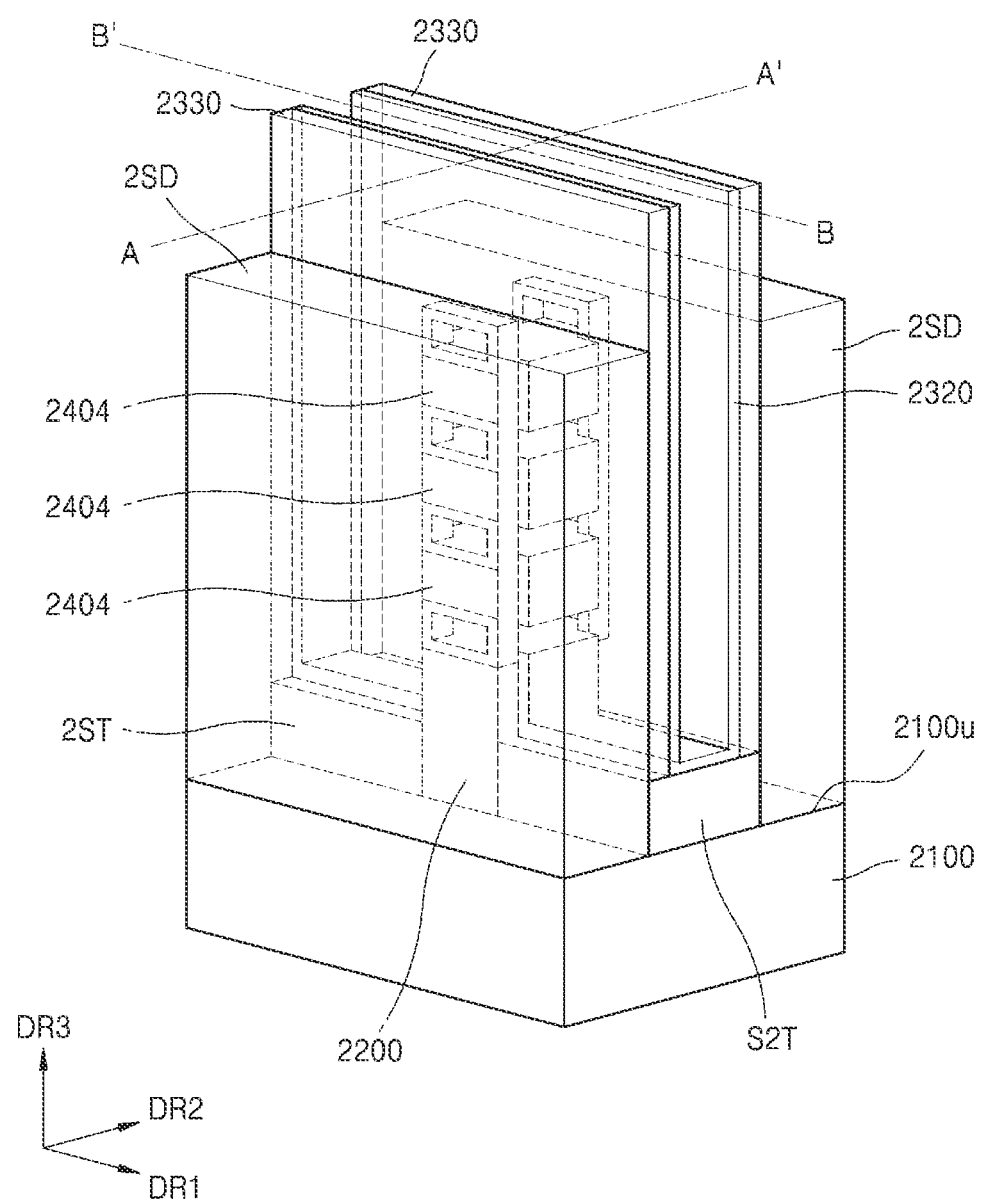
Figure 45:
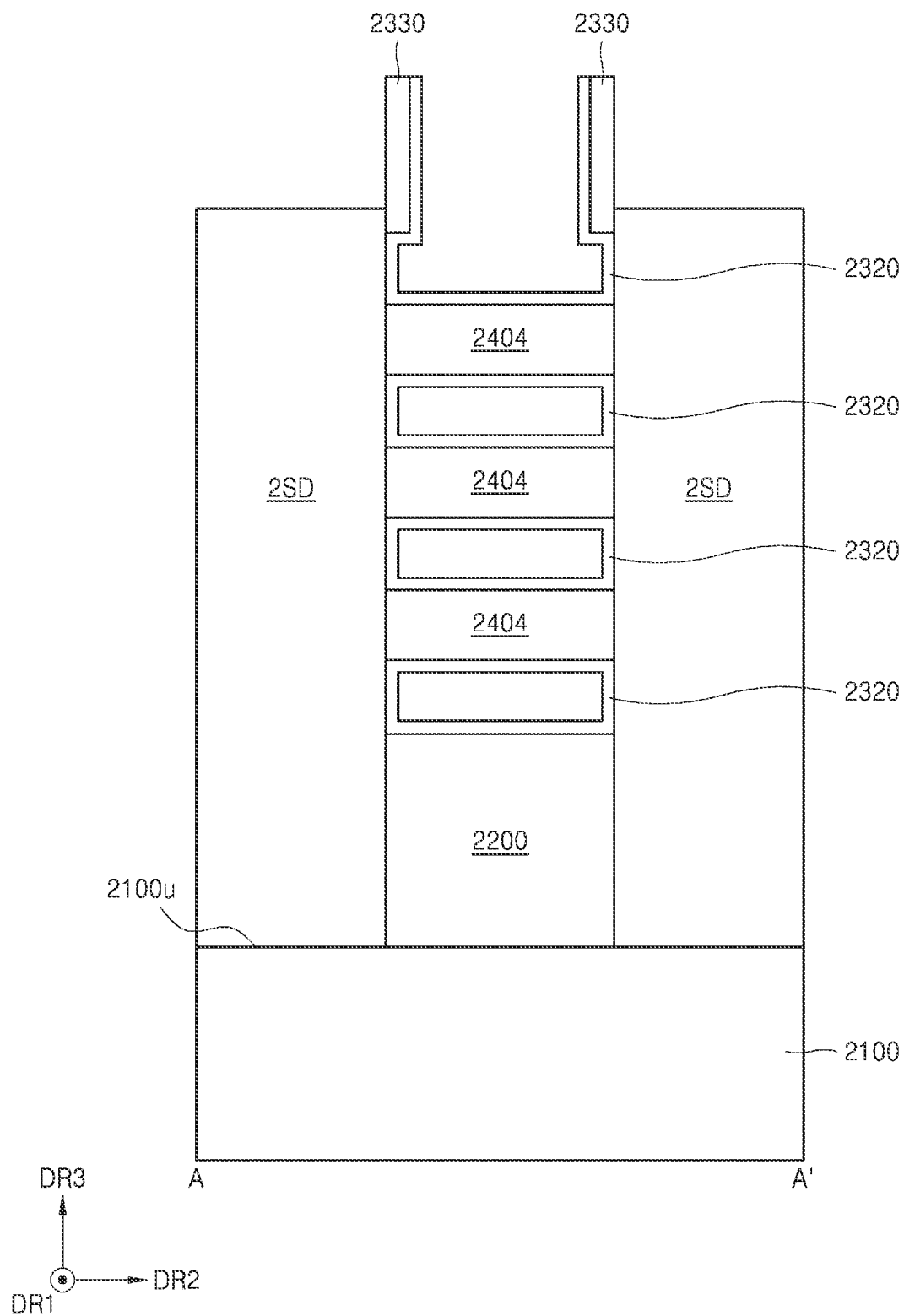
Figure 46:
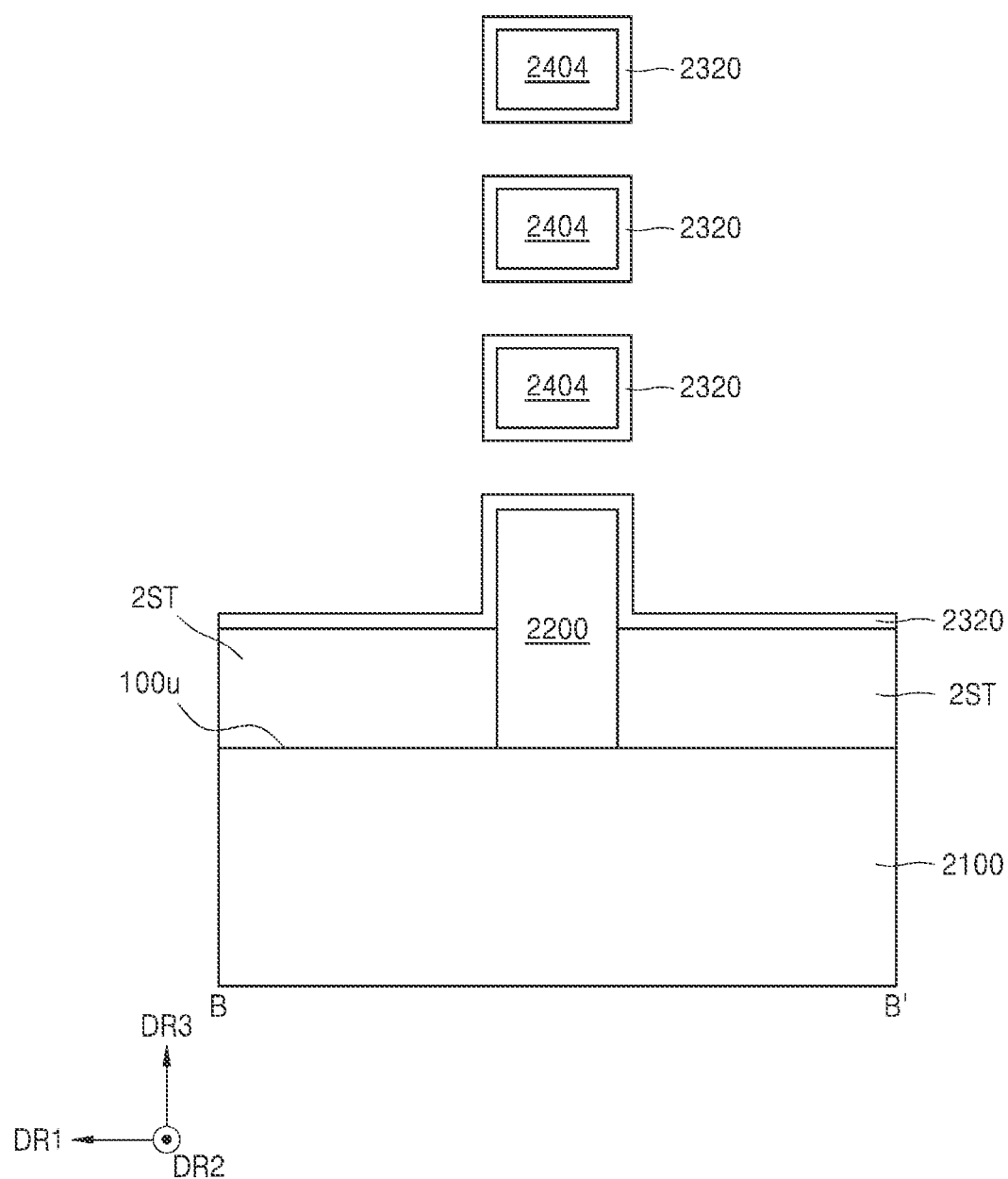

Referring to FIGS. 44 through 46, the gate insulating layer 2320 may be formed on the surfaces of the pair of gate spacers 2330, the pair of source/drain patterns 2SD, the channel patterns 2404, the constant current formation layer 2200, and the pair of device isolation patterns 2ST, the surfaces being exposed by removing the dummy gate pattern 2302 and the sacrificial patterns 2402. The forming of the gate insulating layer 2320 may include depositing an electrically insulating material. For example, the depositing of the electrically insulating material may include performing a heat oxidation process, a CVD process, a PVD process, or an ALD process. For example, the gate insulating layer 2320 may include at least one material selected from silicon oxide, silicon nitride, silicon oxynitride, ONO, or a high-k dielectric material. For example, the gate insulating layer 2320 may include a material having a dielectric constant of about 10 to about 25. For example, the gate insulating layer 2320 may include at least one material selected from HfO, HfSiO, HfON, HfSiON, LaO, LaAlO, ZrO, ZrSiO, ZrON, ZrSiON, TaO, TiO, BaSrTiO, BaTiO, SrTiO, YO, AlO, and PbScTaO.

Referring to FIGS. 25 through 27 again, the gate electrode 2310 may be formed between the pair of gate spacers 2330. The gate electrode 2310 may fill an area between the pair of gate spacers 2330 and between the pair of source/drain patterns 2SD. The gate electrode 2310 may fill an area surrounded by the gate insulating layer 2320. The gate electrode 2310 may include an electrically conductive material. For example, the gate electrode 2310 may include metal or poly silicon. The forming of the gate electrode 2310 may include performing a CVD process, a PVD process, or an ALD process. Thus, the transistor 22210 may be formed.

The gate electrode 2310, the gate insulating layer 2320, and the gate spacers 2330 may be referred to as a gate structure.

The disclosure may provide a method of manufacturing the gate-all-around-type transistor 22210 in which a constant current may flow between any one of the pair of source/drain patterns SD, which is a drain, and the substrate 2100, through the constant current formation pattern 2200.

Figure 47:
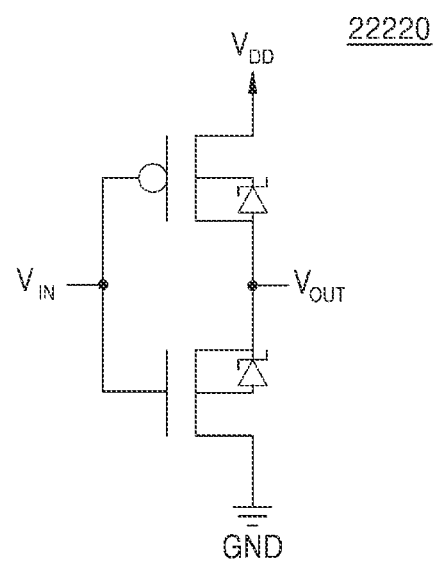
FIG. 47 is a circuit diagram of a ternary inverter according to example embodiments.

FIG. 47 is a circuit diagram of a ternary inverter according to example embodiments. For brevity of explanation, aspects that are substantially the same as the aspects described with reference to FIGS. 25 through 27 may not be described.

Referring to FIG. 47, a ternary inverter 22220 including an NMOS transistor and a PMOS transistor may be provided.

Each of the NMOS transistor and the PMOS transistor may be substantially the same as the transistor 22210 described with reference to FIGS. 25 through 27. Conductive types of the substrate 2100 and the constant current formation layer 2200 of the NMOS transistor may be p-types. Conductive types of the pair of source/drain patterns 2SD of the NMOS transistor may be n-types. Conductive types of the substrate 2100 and the constant current formation layer 2200 of the PMOS transistor may be n-types. Conductive types of the pair of source/drain patterns 2SD of the PMOS transistor may be p-types.

A ground voltage may be applied to the source and the substrate of the NMOS transistor. For brevity of explanation, it may be assumed that the ground voltage is 0 volt (V), hereinafter. A driving voltage $V_{DD}$ may be applied to the source and the substrate of the PMOS transistor. An input voltage Vin may be applied to each of a gate electrode of the NMOS transistor and a gate electrode of the PMOS transistor.

The drain of the NMOS transistor may be electrically connected to the drain of the PMOS transistor, and the drain of the NMOS transistor and the drain of the PMOS transistor may have the same voltage as each other. The voltage of the drain of the NMOS transistor and the drain of the PMOS transistor may be an output voltage Vout of the ternary inverter 22220.

A constant current may flow from the drain of the NMOS transistor to the substrate of the NMOS transistor. A constant current may flow from the substrate of the PMOS transistor to the drain of the PMOS transistor. The constant currents may be independent from the input voltage Vin.

For example, for the PMOS transistor to have a constant current superior to a channel current and for the NMOS transistor to have a channel current superior to a constant current, a first input voltage may be applied to the gate electrode of the PMOS transistor and the gate electrode of the NMOS transistor. Here, the output voltage Vout of the ternary inverter 22220 may be a first voltage.

As another example, for the NMOS transistor to have a constant current superior to a channel current and for the PMOS transistor to have a channel current superior to a constant current, a second input voltage may be applied to the gate electrode of the PMOS transistor and the gate electrode of the NMOS transistor. Here, the output voltage of the ternary inverter 22220 may be a second voltage that is greater than the first voltage.

As another example, for each of the NMOS transistor and the PMOS transistor to have a constant current superior to a channel current, a third input voltage may be applied to the gate electrode of the PMOS transistor and the gate electrode of the NMOS transistor. Here, the output voltage of the ternary inverter 22220 may be a third voltage between the first voltage and the second voltage.

The constant current flowing from the drain of the NMOS transistor to the substrate of the NMOS transistor and the constant current flowing from the substrate of the PMOS transistor to the drain of the PMOS transistor may flow regardless of gate voltages applied to the gate electrodes of the PMOS transistor and the NMOS transistor. A current in the ternary inverter 22220 may flow from the substrate of the PMOS transistor to the substrate of the NMOS transistor through the drain of the PMOS transistor and the drain of the NMOS transistor. A driving voltage $V_{DD}$ applied to the substrate of the PMOS transistor may be distributed to a resistor between the substrate of the PMOS transistor and the drain of the PMOS transistor and a resistor between the substrate of the NMOS transistor and the drain of the NMOS transistor. The output voltage Vout may be a voltage applied to the resistor between the substrate of the NMOS transistor and the drain of the NMOS transistor. The output voltage Vout may have a value between the driving voltage $V_{DD}$ and 0V.

The output voltage Vout may have 0V (a state of "0"), a voltage between the driving voltage $V_{DD}$ and 0V (a state of "1"), or a driving voltage $V_{DD}$ (a state of "2") according to the input voltage Vin. The disclosure may provide the ternary inverter having three states according to the input voltage Vin.

For example, in order to use the required driving voltage $V_{DD}$, a threshold voltage and/or an intensity of a constant current of each of the NMOS transistor and the PMOS transistor may be adjusted. In other words, the threshold voltage and/or the intensity of the constant current of each of the NMOS transistor and the PMOS transistor may be determined according to the driving voltage $V_{DD}$ to be used. For example, the threshold voltage may be adjusted by a doping concentration of the channel patterns (404 of FIGS. 25 through 27) and/or a work function of the gate electrode (310 of FIGS. 25 through 27). For example, the work function of the gate electrode (310 of FIGS. 25 through 27) may be adjusted by using a material of the gate electrode (310 of FIGS. 25 through 27) or an additional work function adjusting layer. For example, the additional work function adjusting layer may be arranged between the gate insulating layer (320 of FIGS. 25 through 27) and the channel patterns (404 of FIGS. 25 through 27). For example, the intensity of the constant current may be adjusted by using a doping concentration of the constant current formation layer (200 of FIGS. 25 through 27) and/or a heat processing condition.

Figure 48:
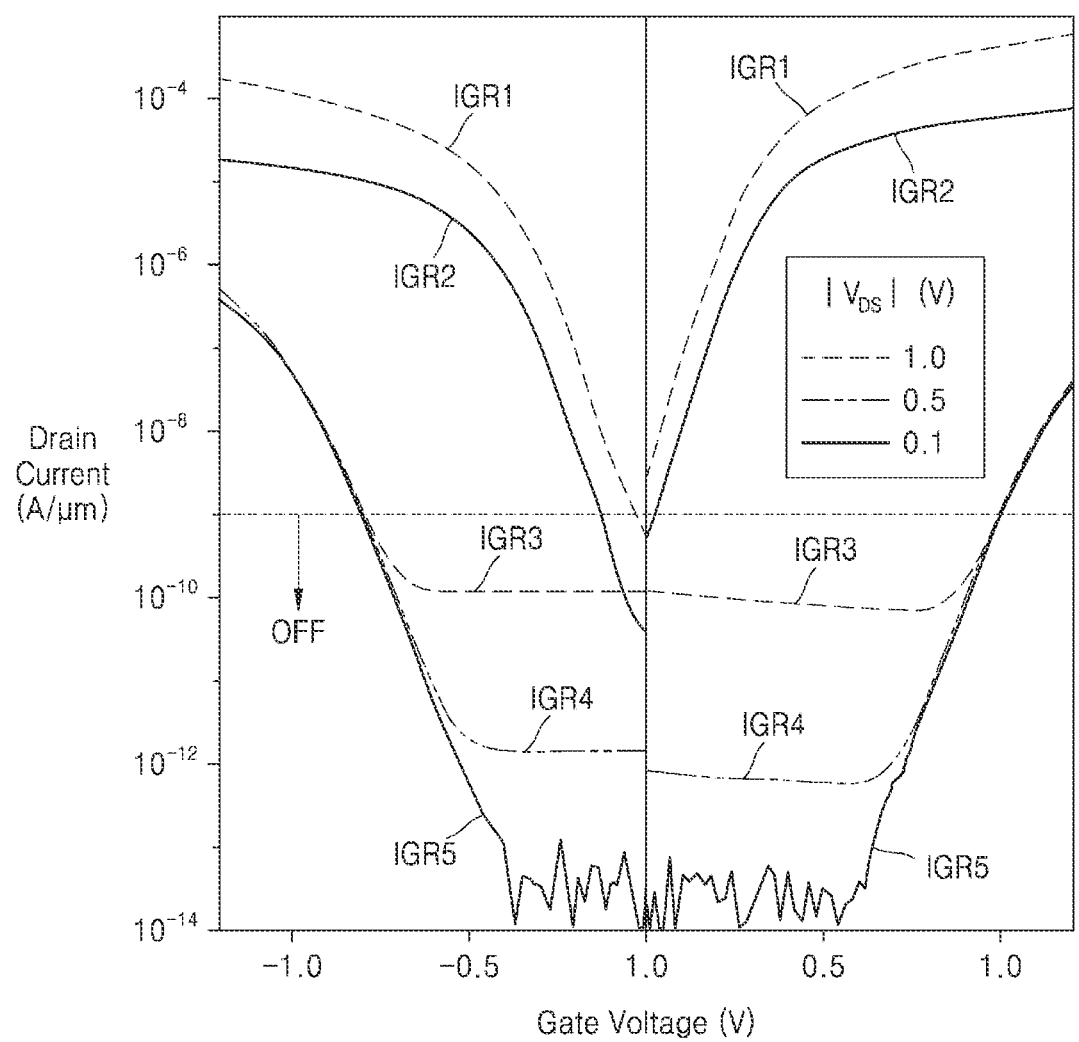
FIG. 48 shows gate voltage-drain current graphs of a ternary inverter and a binary inverter according to an example embodiment.

FIG. 48 shows gate voltage-drain current graphs of a ternary inverter and a binary inverter according to an example embodiment.

FIG. 48 illustrates gate voltage-drain current graphs IGR1 and IGR2 of the binary inverter and gate voltage-drain current graphs IGR3, IGR4, and IGR5 of the ternary inverter. For example, the ternary inverter may be substantially the same as the ternary inverter described with reference to FIG. 47.

Drain currents of the binary inverter art may not have a constant current component flowing regardless of a gate voltage.

Drain currents of the ternary inverter art may have a constant current component flowing regardless of a gate voltage. For example, even when the ternary inverter has an off state, a constant current may flow in ternary inverters.

Figure 49:
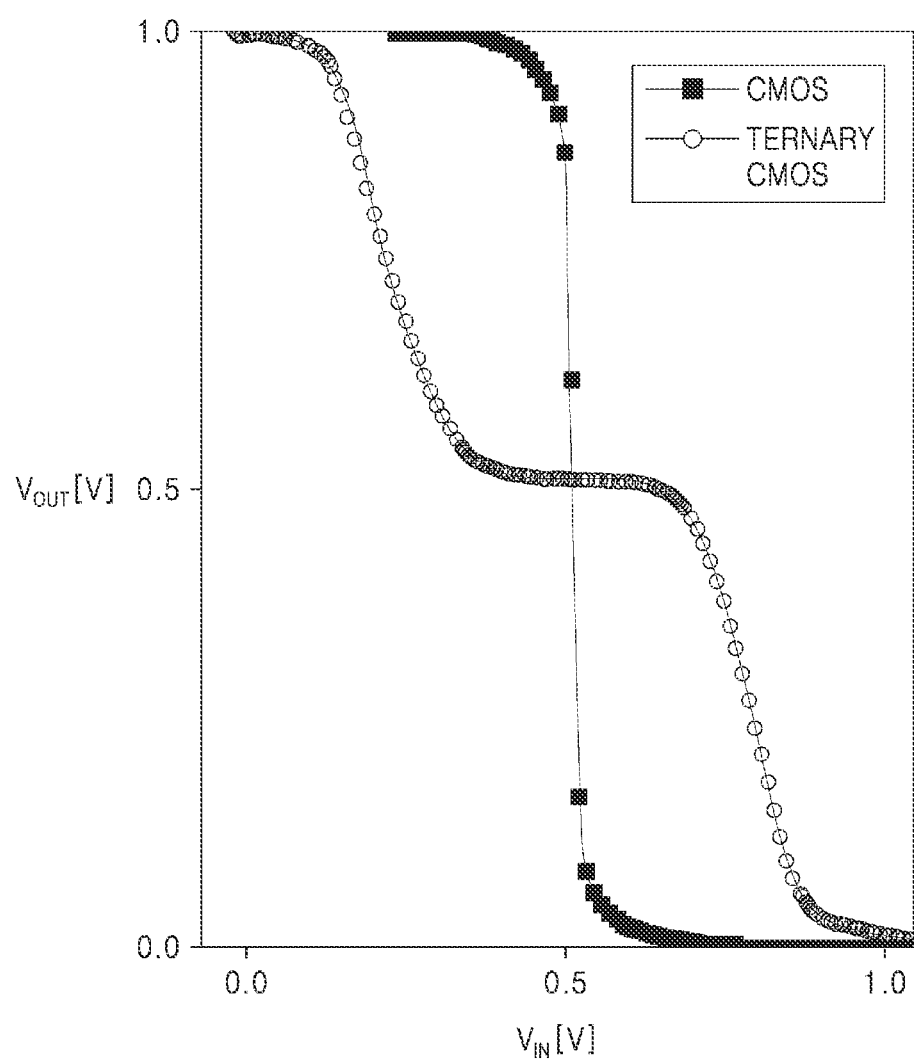
FIG. 49 shows input voltage (Vin)-output voltage (Vout) graphs of a ternary inverter and a binary inverter.

FIG. 49 shows input voltage (Vin)-output voltage (Vout) graphs of a ternary inverter and a binary inverter.

Referring to FIG. 49, the driving voltage $V_{DD}$ of the ternary inverter and the binary inverter may be 1.0V, and the ground voltage GND may be 0V. The input voltage Vin of the ternary inverter and the binary inverter may be 0V through 1.0V. For example, the ternary inverter may be substantially the same as the ternary inverter described with reference to FIG. 47.

In the case of the binary inverter, when the input voltage is changed from 0V to 1V, the output voltage Vout may be drastically decreased from 1V to 0V around the input voltage of about 0.5. That is, the binary inverter may have two states (for example, the state of "0" and the state of "1").

In the case of the ternary inverter according to an embodiment, when the input voltage is changed from 0V to 1V, the output voltage Vout may be drastically decreased from 1V to 0.5V, may be maintained as 0.5V, and may be once again drastically decreased from 0.5V to 0V. That is, the ternary inverter according to an embodiment may have three states (for example, the state of "0," the state of "1," and the state of "2").

Figure 50:
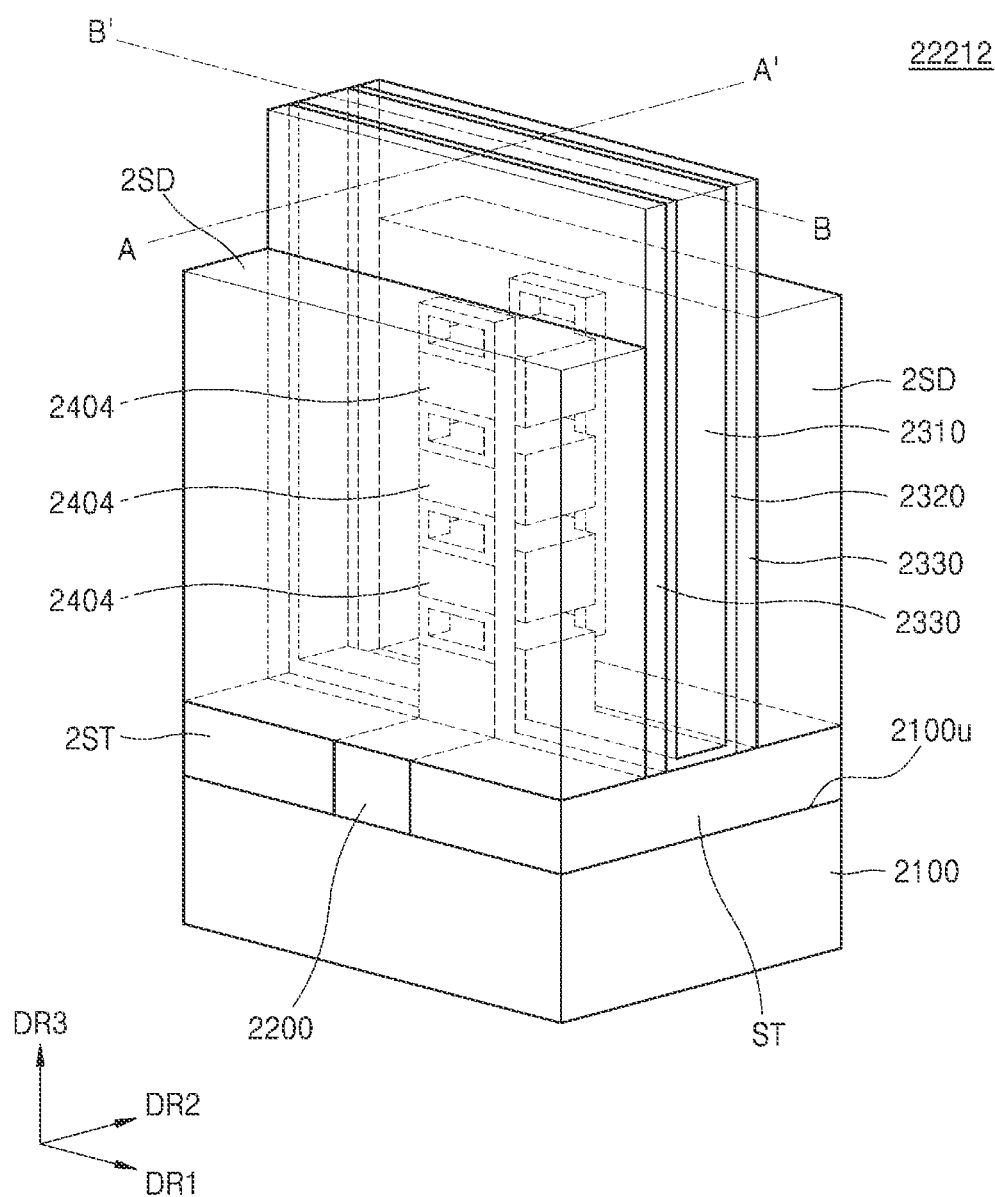
FIG. 50 is a perspective view of a transistor according to example embodiments.
Figure 51:
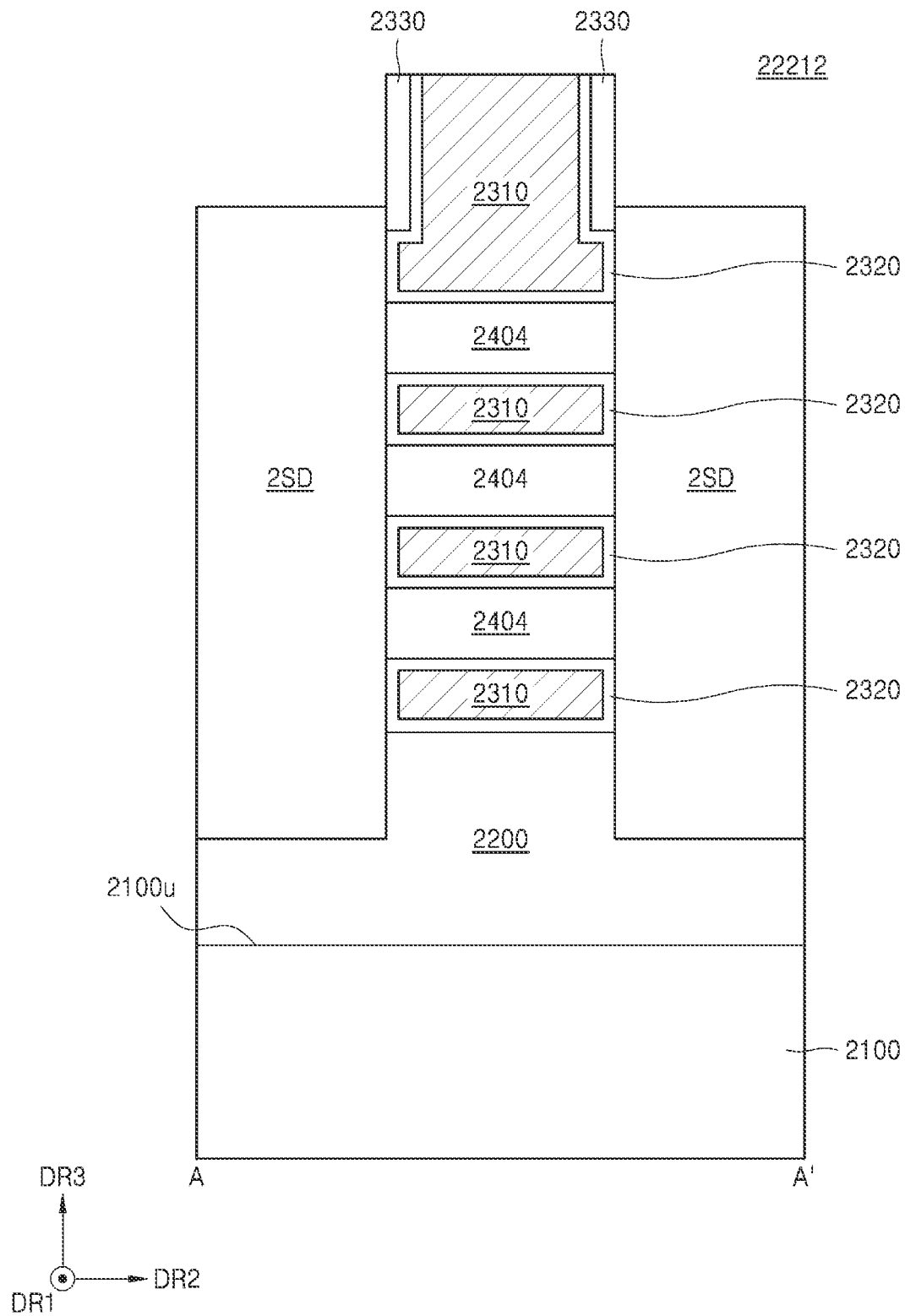
FIG. 51 is a cross-sectional view of the transistor of FIG. 50, taken along a line A-A'.

FIG. 50 is a perspective view of a transistor according to example embodiments. FIG. 51 is a cross-sectional view of the transistor of FIG. 50, taken along a line A-A'. For brevity of explanation, aspects that are substantially the same as the aspects described with reference to FIGS. 25 through 27 may not be described. Aspects that are different from the aspects described with reference to FIGS. 25 through 27 are described. The cross-sectional view of FIG. 50 taken along a line B-B' may be the same as FIG. 27.

Referring to FIGS. 50, 51, and 27, a transistor 22212 may be provided. The transistor 22212 may include the substrate 2100, the constant current formation pattern 2200, the pair of device isolation patterns 2ST, the pair of source/drain patterns 2SD, the gate electrode 2310, the gate insulating layer 2320, the pair of gate spacers 2330, and the channel patterns 2404.

Unlike the descriptions with reference to FIGS. 25 through 27, the constant current formation pattern 2200 may extend in the second direction DR2. The constant current formation pattern 2200 may extend to areas between the substrate 2100 and the pair of source/drain patterns 2SD. A thickness of the constant current formation pattern 2200 provided between the substrate 2100 and the pair of source/drain patterns 2SD may be less than a thickness of the constant current formation pattern 2200 provided between the pair of source/drain patterns 2SD. The thickness of the constant current formation pattern 2200 may be a size of the constant current formation pattern 2200 in the third direction DR3. The thickness of the constant current formation pattern 2200 provided between the pair of source/drain patterns 2SD may be a thickness of the constant current formation pattern 2200 overlapping the channel pattern 2404 in the third direction DR3. The constant current formation pattern 2200 according to an embodiment may directly contact a side surface and a bottom surface of the pair of source/drain patterns 2SD.

The pair of device isolation patterns 2ST may extend in the second direction DR2. The pair of device isolation patterns 2ST may extend to areas between the substrate 2100 and the pair of source/drain patterns 2SD. A thickness of the pair of device isolation patterns 2ST may be less than the thickness of the constant current formation pattern 2200 provided between the pair of source/drain patterns 2SD. For example, the thickness of the pair of device isolation patterns 2ST may be substantially the same as the thickness of the constant current formation pattern 2200 provided between the substrate 2100 and the pair of source/drain patterns 2SD.

The pair of source/drain areas 2SD may be spaced apart from the substrate 2100 by the constant current formation pattern 2200 and the pair of device isolation patterns 2ST.

The disclosure may provide the gate-all-around-type transistor 22212 having a constant current flowing between the constant current formation pattern 2200 and any one of the pair of source/drain patterns 2SD, which is a drain.

Figure 52:
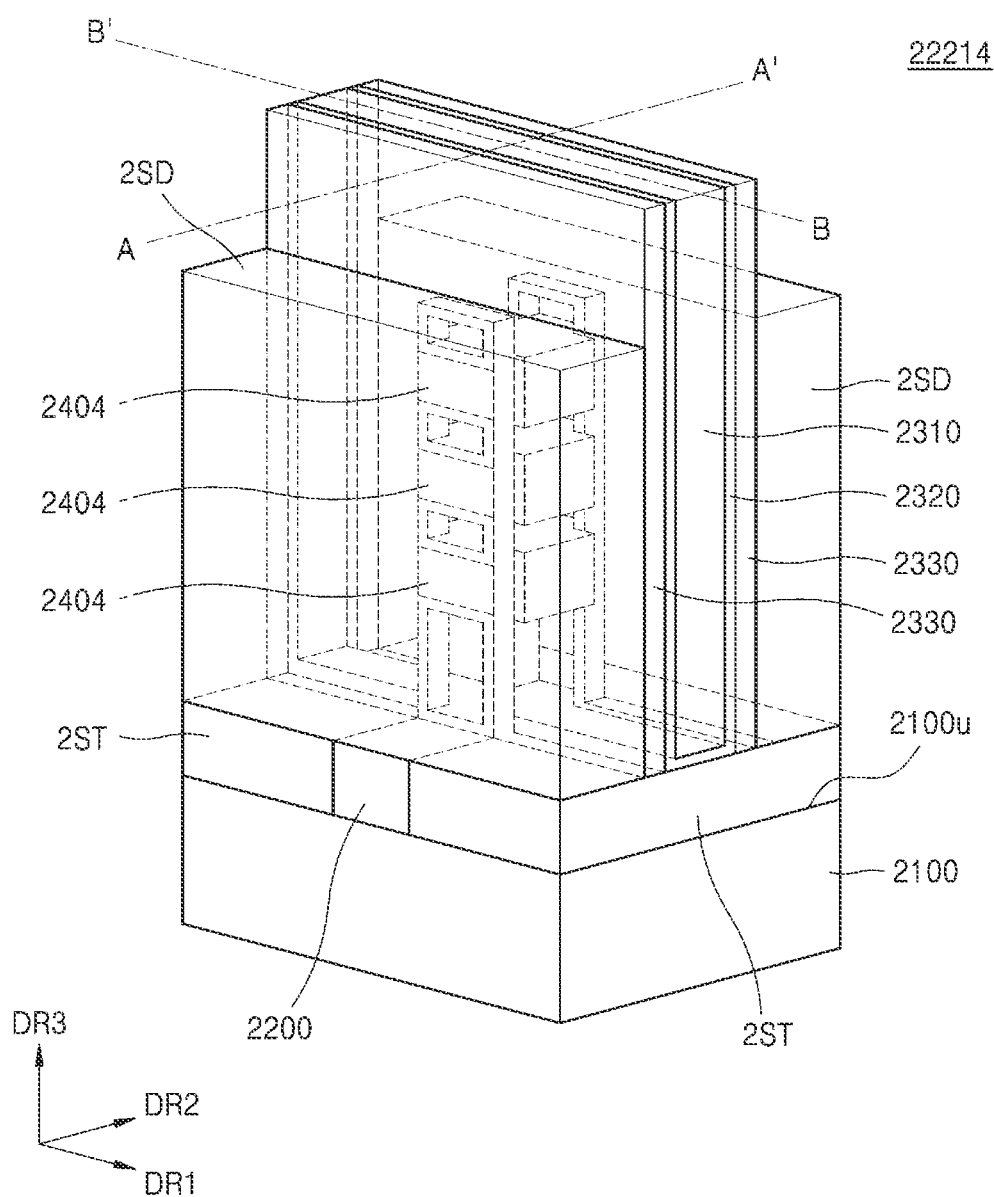
FIG. 52 is a perspective view of a transistor according to example embodiments.
Figure 53:
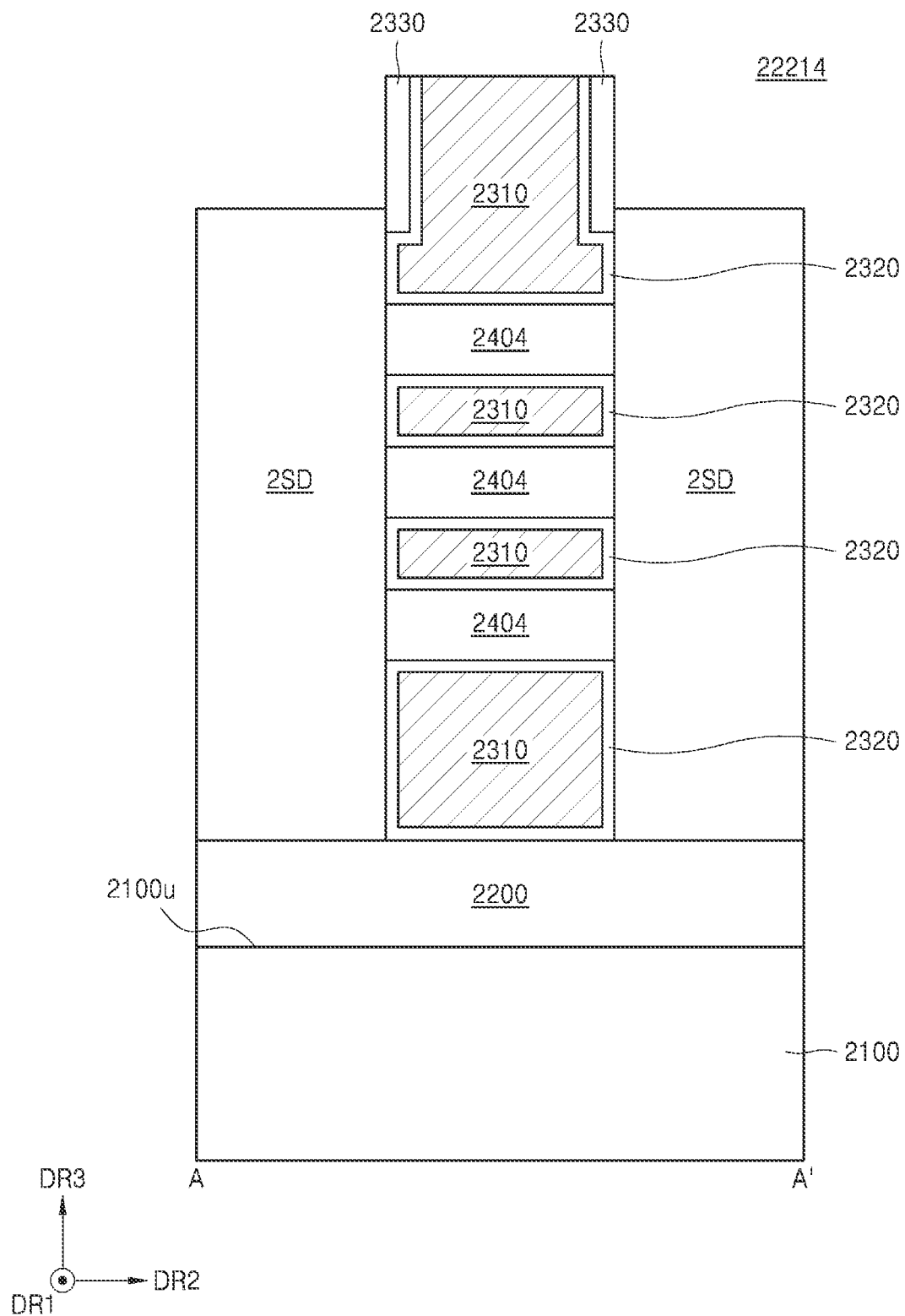
FIG. 53 is a cross-sectional view of the transistor of FIG. 52, taken along a line A-A'.
Figure 54:
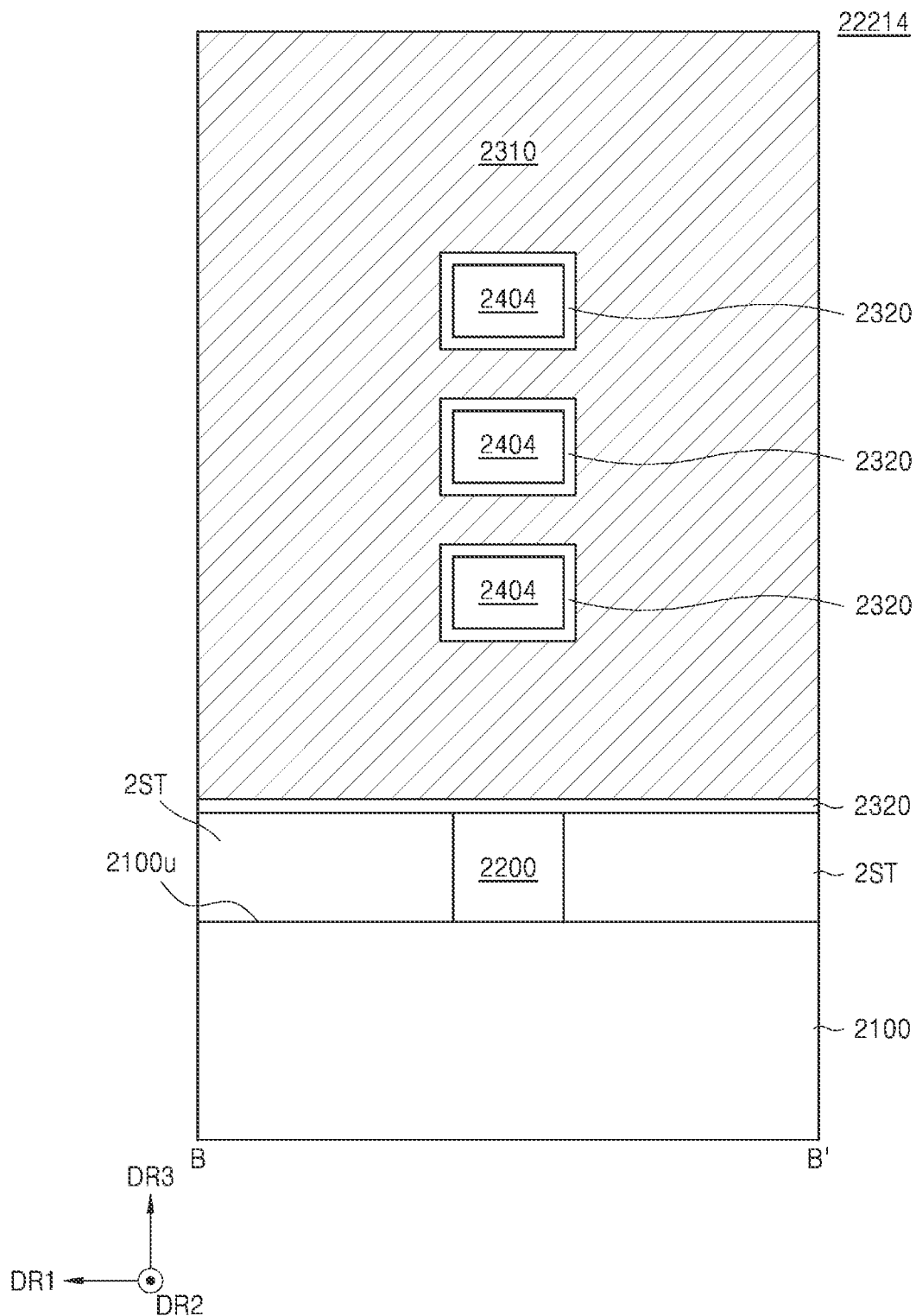
FIG. 54 is a cross-sectional view of the transistor of FIG. 52, taken along a line B-B'.

FIG. 52 is a perspective view of a transistor according to example embodiments. FIG. 53 is a cross-sectional view of the transistor of FIG. 52, taken along a line A-A'. FIG. 54 is a cross-sectional view of the transistor of FIG. 52, taken along a line B-B'. For brevity of explanation, aspects that are substantially the same as the aspects described with reference to FIGS. 25 through 27 may not be described.

Referring to FIGS. 52 through 54, a transistor 22214 may be provided. The transistor 22214 may include the substrate 2100, the constant current formation pattern 2200, the pair of device isolation patterns 2ST, the pair of source/drain patterns 2SD, the gate electrode 2310, the gate insulating layer 2320, the pair of gate spacers 2330, and the channel patterns 2404.

Unlike the descriptions with reference to FIGS. 25 through 27, the constant current formation pattern 2200 may extend in the second direction DR2. The constant current formation pattern 2200 may extend to areas between the substrate 2100 and the pair of source/drain patterns 2SD. The constant current formation pattern 2200 may have a constant thickness. The thickness of the constant current formation pattern 2200 may be a size of the constant current formation pattern 2200 in the third direction DR3. The constant current formation pattern 2200 according to an embodiment may directly contact a bottom surface of the pair of source/drain patterns 2SD.

The pair of device isolation patterns 2ST may extend in the second direction DR2. The pair of device isolation patterns 2ST may extend to areas between the substrate 2100 and the pair of source/drain patterns 2SD. A thickness of the pair of device isolation patterns 2ST may be substantially the same as the thickness of the constant current formation pattern 2200. For example, upper surfaces of the pair of device isolation patterns 2ST may be coplanar with an upper surface of the constant current formation pattern 2200.

The pair of source/drain areas 2SD may be spaced apart from substrate 2100 by the constant current formation pattern 2200 and the pair of device isolation patterns 2ST.

The disclosure may provide the gate-all-around-type transistor 22214 having a constant current flowing between the constant current formation pattern 2200 and any one of the pair of source/drain patterns 2SD, which is a drain.

The disclosure has been particularly shown and described with reference to example embodiments thereof. Thus, the disclosure is not limited to the embodiments described herein, and it will be understood by one of ordinary skill in the art that various modifications and equivalent other embodiments can be made by combining the embodiments described above.

The disclosure has been particularly shown and described with reference to example embodiments thereof. Thus, the disclosure is not limited to the embodiments described herein, and it will be understood by one of ordinary skill in the art that various modifications and equivalent other embodiments can be made by combining the embodiments described above.

What is claimed is:

1. A transistor comprising:
    a substrate;
    a constant current formation layer disposed on the substrate in direct contact with the substrate;
    a pair of source/drain patterns disposed on the constant current formation layer in direct contact with the constant current formation layer;
    a gate electrode provided between the pair of source/drain patterns;
    a channel pattern extending in a direction between the pair of source/drain patterns; and
    a gate insulating layer surrounding the channel pattern,
    wherein the channel pattern penetrates the gate insulating layer and the gate electrode and is electrically connected to the source pattern and the drain pattern,
    the gate insulating layer separates the channel pattern and the gate electrode from each other,
    the constant current formation layer generates a constant current between the drain pattern and the substrate, the constant current being a band to band tunneling current that flows from the substrate through the constant formation layer to the drain, or from the drain through the constant current formation layer to the substrate,
    the constant current is independent from a gate voltage applied to the gate electrode,
    wherein an electric field is formed between the constant current formation layer and the pair of source/drain patterns, and
    an intensity of the electric field is greater than or equal to about $10^6$ V/cm.

2. The transistor of claim 1, wherein the constant current formation layer has a first conductive type,
    the pair of source/drain patterns have a second conductive type that is different from the first conductive type, and a doping concentration of the constant current formation layer is greater than or equal to about $3\times10^{18}$ cm$^{-3}$.

3. The transistor of claim 1, wherein the gate insulating layer extends between the gate electrode and the pair of source/drain patterns and separates the gate electrode from the pair of source/drain patterns.

4. The transistor of claim 1, further comprising a pair of gate spacers provided on both side surfaces of the gate electrode,
   wherein the pair of gate spacers are provided between the pair of source/drain patterns and the gate electrode and electrically disconnect the pair of source/drain patterns from the gate electrode.

5. The transistor of claim 4, further comprising the gate insulating layer extends between the gate electrode and the pair of gate spacers and separating the gate electrode from the pair of gate spacers.

6. The transistor of claim 1, wherein the channel pattern is provided in a multiple number, and
   the plurality of channel patterns are apart from each other in a direction perpendicular to an upper surface of the constant current formation layer.

7. The transistor of claim 6, wherein the gate insulating layer is provided between the plurality of channel patterns and the gate electrode and separates the plurality of channel patterns from the gate electrode.

* * * * *